United States Patent
Huang et al.

(10) Patent No.: US 9,818,613 B1
(45) Date of Patent: Nov. 14, 2017

(54) SELF-ALIGNED DOUBLE SPACER PATTERNING PROCESS

(71) Applicant: Taiwan Semiconductor Manufacturing Company, Ltd., Hsin-Chu (TW)

(72) Inventors: Yan-Jhi Huang, Luodong Township (CN); Yu-Yu Chen, Hsin-Chu (CN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/296,620

(22) Filed: Oct. 18, 2016

(51) Int. Cl.
  *H01L 21/311* (2006.01)
  *H01L 21/033* (2006.01)
  *H01L 21/768* (2006.01)

(52) U.S. Cl.
  CPC ...... *H01L 21/0338* (2013.01); *H01L 21/0332* (2013.01); *H01L 21/0335* (2013.01); *H01L 21/0337* (2013.01); *H01L 21/76816* (2013.01)

(58) Field of Classification Search
  CPC ....... H01L 21/28141; H01L 21/823468; H01L 21/3086; H01L 21/3081; H01L 21/76816
  USPC .......... 438/695, 696, 700, 717, 736
  See application file for complete search history.

(56) References Cited

U.S. PATENT DOCUMENTS

| | | | | |
|---|---|---|---|---|
| 2008/0008969 A1* | 1/2008 | Zhou | ................... | H01L 21/0337 430/313 |
| 2011/0316165 A1* | 12/2011 | You | ..................... | H01L 21/0337 257/773 |
| 2014/0329388 A1* | 11/2014 | Jang | .................. | H01L 21/28141 438/702 |
| 2015/0056724 A1* | 2/2015 | Shieh | ...................... | H01L 22/12 438/14 |
| 2015/0162205 A1* | 6/2015 | Wu | ..................... | H01L 21/3086 438/618 |

* cited by examiner

Primary Examiner — Binh X Tran
(74) Attorney, Agent, or Firm — Slater Matsil, LLP

(57) ABSTRACT

A method includes forming a mask layer over a target layer. A merge cut feature is formed in the mask layer. A first mandrel layer is formed over the mask layer and the merge cut feature. The first mandrel layer is patterned to form first openings therein. First spacers are formed on sidewalls of the first openings. The first openings are filled with a dielectric material to form plugs. The first mandrel layer is patterned to remove portions of the first mandrel layer interposed between adjacent first spacers. The merge cut feature is patterned using the first spacers and the plugs as a combined mask. The plugs are removed. The mask layer is patterned using the first spacers as a mask. The target layer is patterned, using the mask layer and the merge cut feature as a combined mask, to form second openings therein.

20 Claims, 49 Drawing Sheets

SELF-ALIGNED DOUBLE SPACER PATTERNING PROCESS

BACKGROUND

With the increasing down-scaling of semiconductor devices, various processing techniques, such as photolithography are adapted to allow for the manufacture of devices with increasingly smaller dimensions. However, as semiconductor processes require smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
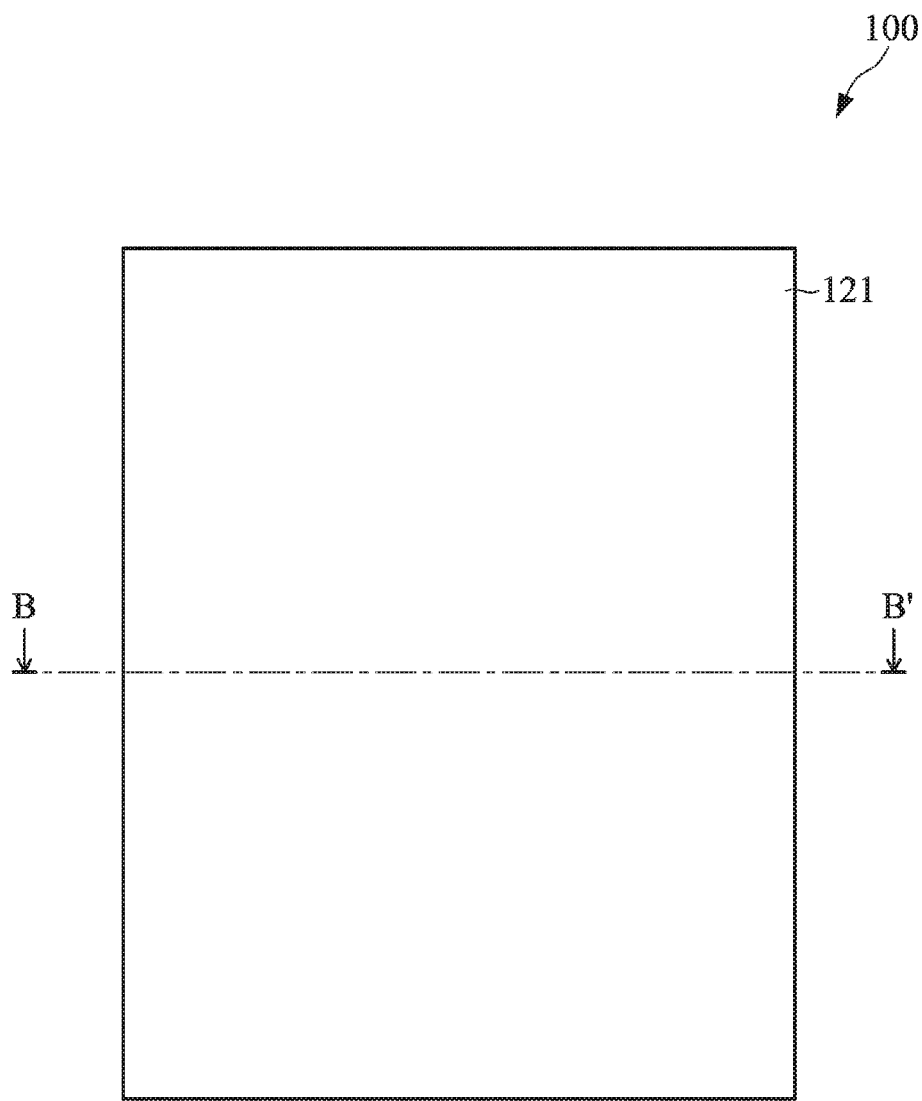
FIGS. 1A-24B illustrate top and cross-sectional views of various intermediate stages of fabrication of a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a method for patterning a target layer of a semiconductor structure by transferring multiple patterns to multiple mask layers over the target layer. In various embodiments described below, patterned mask layers are subsequently used to pattern the target layer. In some embodiments where the target layer is a dielectric layer (such as, for example, an inter-metal dielectric layer), the dielectric layer may be patterned to form interconnects therein. It should be noted that various embodiments described herein are not limited to forming interconnects in a semiconductor structure, but may be also used to form other structures having a reduced size and pitch. Various embodiments discussed herein allow for improving a mask patterning process window by overcoming film deposition topography issues due to dense/iso line-pattern environment.

Figure 1B:
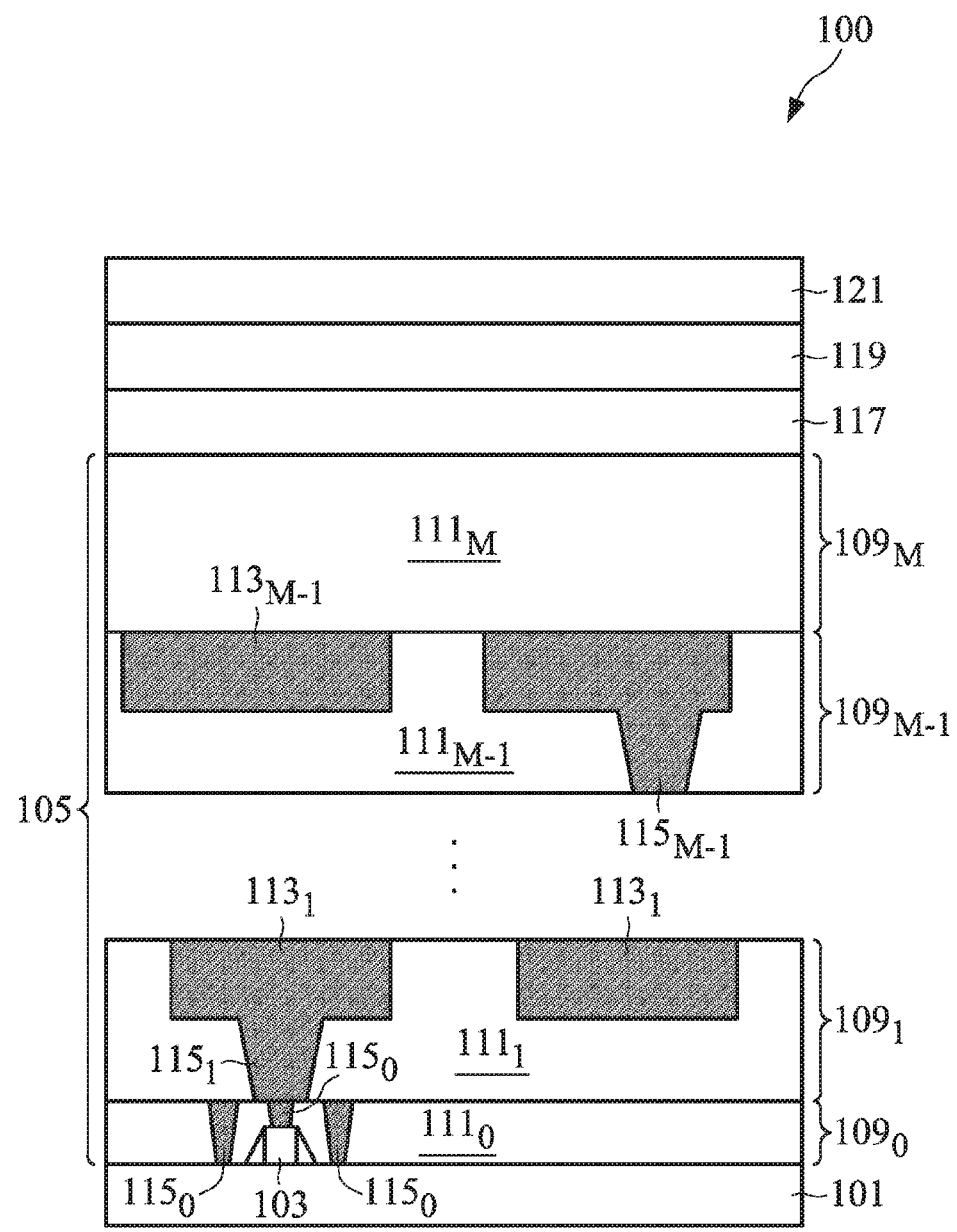

FIGS. 1A-24B illustrate various intermediate stages of fabrication of a semiconductor structure 100 in accordance with some embodiments. FIGS. 1A-24B illustrate top and cross-sectional views, where an "A" figure represents a top view and a "B" figure represents a cross-sectional view along a B-B' line of the respective "A" figure. Referring to FIGS. 1A and 1B, a portion the semiconductor structure 100 is illustrated. The semiconductor structure 100 may be an intermediate structure of an integrated circuit manufacturing process. In some embodiments, the semiconductor structure 100 may comprise a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 103 (illustrated in FIG. 1B as a single transistor) are formed on the substrate 101. The one or more active and/or passive devices 103 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In some embodiments, an interconnect structure 105 is formed over the one or more active and/or passive devices 103 and the substrate 101. The interconnect structure 105 electrically interconnects the one or more active and/or passive devices 103 to form functional electrical circuits within the semiconductor structure 100. The interconnect structure 105 may comprise one or more metallization layers $109_0$ to $109_M$, wherein M+1 is the number of the one or more metallization layers $109_0$ to $109_M$. In some embodiments, the value of M may vary according to design specifications of the semiconductor structure 100. In what follows, the one or more metallization layers $109_0$ to $109_M$ may also be collectively referred to as the one or more metallization layers 109. The one or more metallization layers $109_0$ to $109_M$ comprise one or more dielectric layers $111_0$ to $111_M$, respectively.

In some embodiments, the dielectric layer $111_0$ is an inter-layer dielectric (ILD) layer, and the dielectric layers $111_1$ to $111_M$ are inter-metal dielectric (IMD) layers. The ILD layer and the IMD layers may include low-k dielectric materials having k values, for example, lower than about 4.0 or even 2.0 disposed between such conductive features. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), or the like.

In some embodiments, the dielectric layers $111_0$ comprises conductive plugs $115_0$, and the dielectric layers $111_1$ to $111_{M-1}$ comprise one or more conductive interconnects, such as conductive lines $113_1$ to $113_{M-1}$ and conductive vias $115_1$ to $115_{M-1}$, respectively. The conductive plugs $115_0$ electrically couple the one or more active and/or passive devices 103 to the conductive lines $113_1$ to $113_{M-1}$ and the conductive vias $115_1$ to $115_{M-1}$. As described below in greater detail, multiple mask layers are formed and patterned over the dielectric layer $111_M$. Subsequently, patterned masks are used to pattern the dielectric layer $111_M$ to form openings for conductive lines $113_M$ (not illustrated in FIGS. 1A and 1B, see FIGS. 24A and 24B) in the dielectric layer $111_M$. The dielectric layer $111_M$ may also be referred to as a target layer.

In some embodiments, the conductive plugs $115_0$, the conductive lines $113_1$ to $113_{M-1}$ and the conductive vias $115_1$ to $115_{M-1}$ may be formed using any suitable method, such as damascene, dual damascene, or the like. The conductive plugs $115_0$, the conductive lines $113_1$ to $113_{M-1}$ and the conductive vias $115_1$ to $115_{M-1}$ may comprise conductive materials such as copper, aluminum, tungsten, combinations thereof, or the like. The conductive plugs $115_0$, the conductive lines $113_1$ to $113_{M-1}$ and the conductive vias $115_1$ to $115_{M-1}$ may further comprise one or more barrier/adhesion layers (not shown) to protect the respective dielectric layers $111_0$ to $111_{M-1}$ from diffusion and metallic poisoning. The one or more barrier/adhesion layers may comprise titanium, titanium nitride, tantalum, tantalum nitride, or the like, and may be formed using physical vapor deposition (PVD), CVD, ALD, or the like. In an embodiment, the steps for forming the conductive plugs $115_0$, the conductive lines $113_1$ to $113_{M-1}$ and the conductive vias $115_1$ to $115_{M-1}$ may include forming openings in the respective dielectric layers $111_0$ to $111_{M-1}$, depositing barrier/adhesion layers in the openings, depositing seed layers of a suitable conductive material over barrier/adhesion layers, and filling the openings with a suitable conductive material, for example, by plating, or other suitable methods. A chemical mechanical polishing (CMP) is then performed to remove excess materials overfilling the openings.

Referring further to FIGS. 1A and 1B, an anti-reflective coating (ARC) 117 is formed over the dielectric layer $111_M$, a first mask layer 119 is formed over the ARC 117, and a second mask layer 121 is formed over the first mask layer 119. A stack of layers comprising the ARC 117, the first mask layer 119, and the second mask layer 121 may also be referred to as a mask stack. As described below in greater detail, the mask stack is patterned to form a desired pattern in the mask stack. Subsequently, the pattern of the mask stack is transferred to the dielectric layer $111_M$ to form openings in the dielectric layer $111_M$ for conductive interconnects, such as conductive lines $113_M$ (see FIGS. 24A and 24B).

The ARC 117 prevents radiation in subsequent photolithographic processes from reflecting off layers below and interfering with the exposure process. In some embodiments, the ARC 117 is a nitrogen-free ARC (NFARC) and is made of a silicon-rich oxide (SRO), silicon oxycarbide, the like, or a combination thereof, and is formed using CVD, PECVD, the like, or a combination thereof. The ARC 117 may be also used as an etch stop layer (ESL) to aid in patterning the first mask layer 119 and the second mask layer 121, and the ARC 117 layer may also be referred to an ESL 117. Alternatively, an ESL may be formed between the dielectric layer $111_M$ and the ARC 117. In some embodiments, the ARC 117 may have a thickness between about 100 Å and about 500 Å.

In some embodiments, the first mask layer 119 may be a metal hard mask layer and the second mask layer 121 may be a dielectric hard mask layer. The first mask layer 119 may comprise titanium nitride, titanium oxide, the like, or a combination thereof, and may be formed using CVD, PVD, ALD, the like, or a combination thereof. In some embodiments, the first mask layer 119 may have a thickness between about 100 Å and about 500 Å. The second mask layer 121 may comprise tetraethyl orthosilicate (TEOS), carbon-doped silicon oxide (SiCOH), $SiO_xC_y$, the like, or a combination thereof, and may be formed using spin-on coating, CVD, ALD, the like, or a combination thereof. In some embodiments, the second mask layer 121 may have a thickness between about 100 Å and about 500 Å. In some embodiments, materials for the ARC 117, the first mask layer 119, and the second mask layer 121 are chosen such that the ARC 117, the first mask layer 119, and the second mask layer 121 have desired etch rates for subsequent patterning processes. As described below in greater detail, the second mask layer 121 is patterned by transferring multiple patterns to the second mask layer 121. The multiple patterns in the second mask layer 121 are subsequently transferred to the first mask layer 119.

Figure 2A:
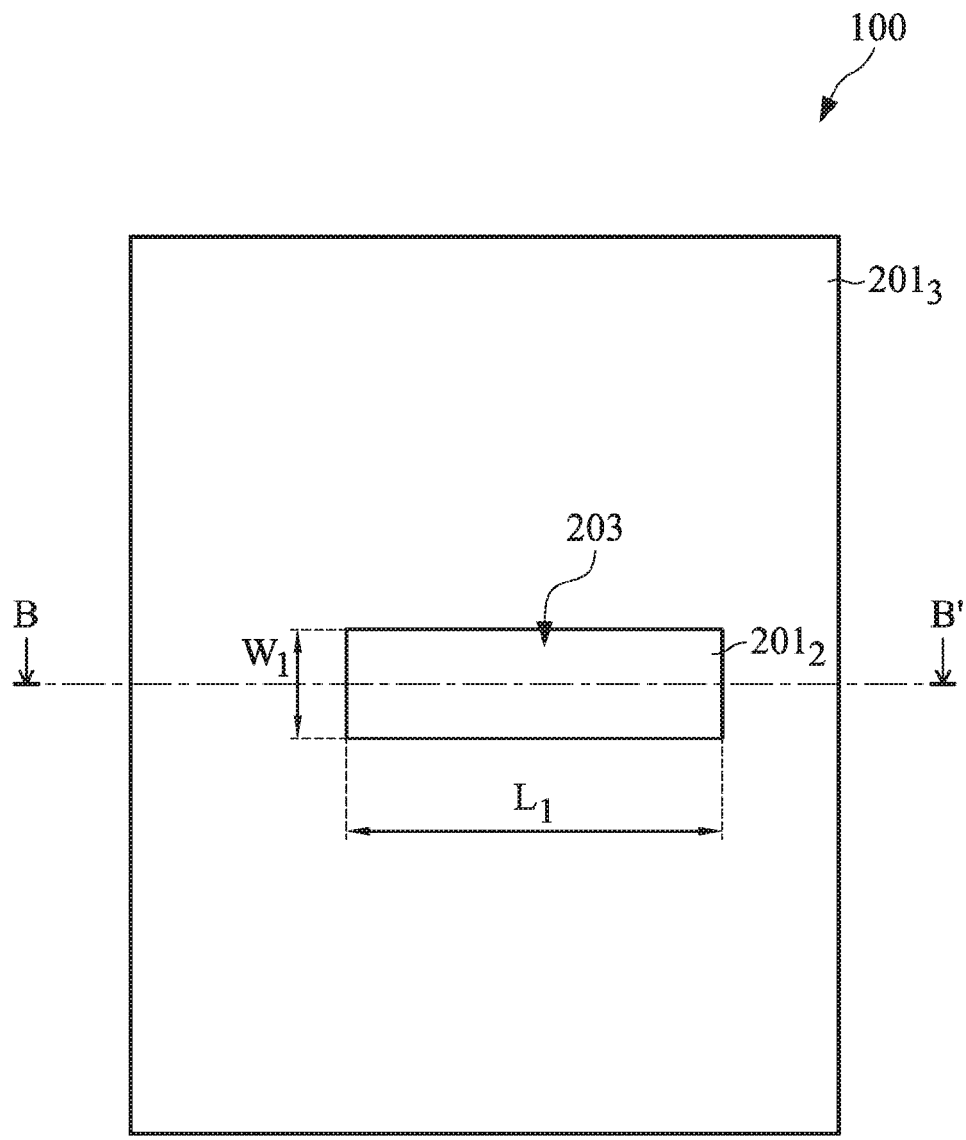
Figure 2B:
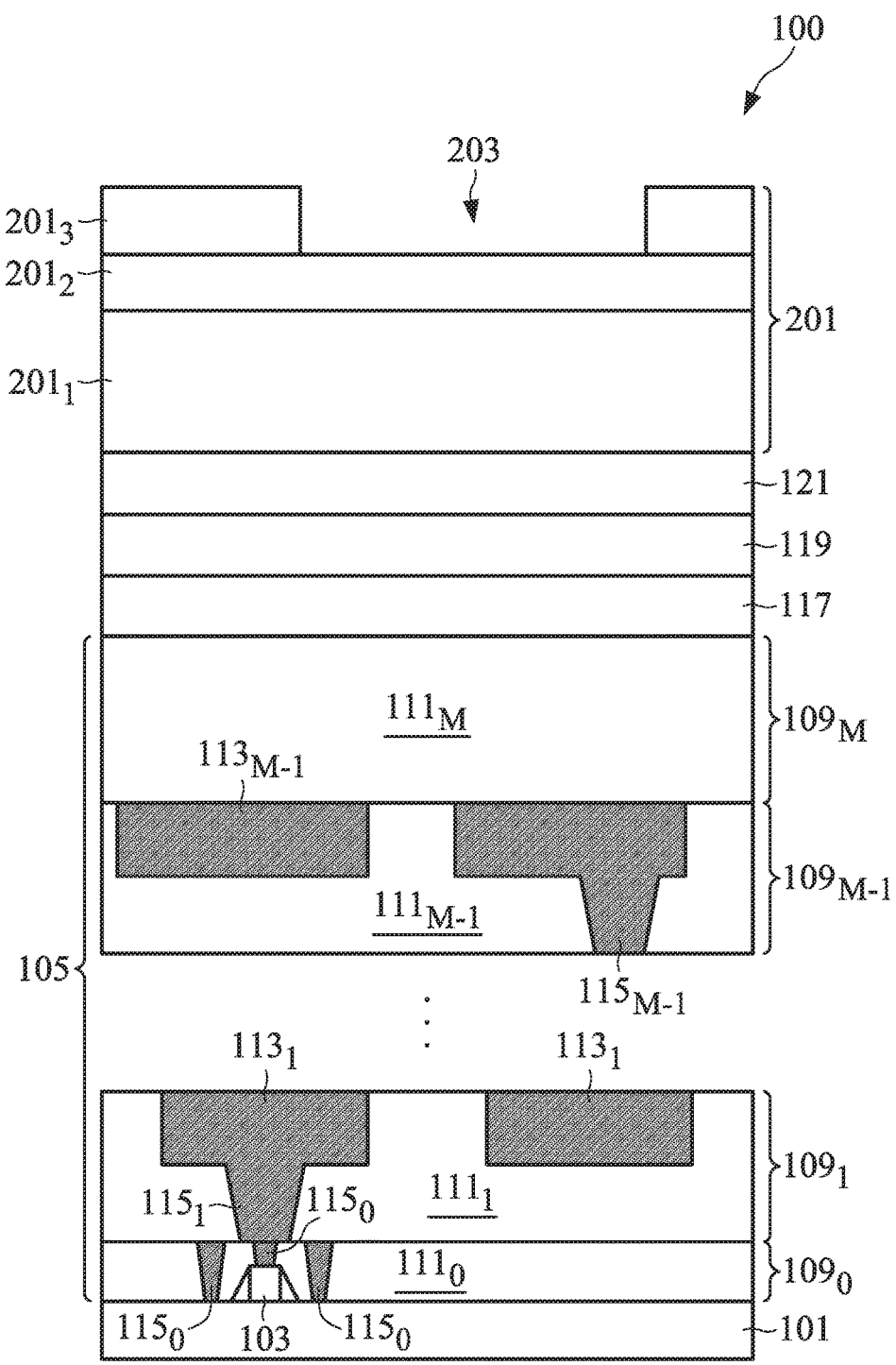

Referring to FIGS. 2A and 2B, a first tri-layer mask 201 is formed over the second mask layer 121. In some embodiments, the first tri-layer mask 201 comprises a bottom layer $201_1$, a middle layer $201_2$ over the bottom layer $201_1$, and a top layer $201_3$ over the middle layer $201_2$. In some embodiments, the bottom layer $201_1$ may comprise an organic material, such as a spin-on carbon (SOC) material, or the like, and may be formed using spin-on coating, CVD, ALD, or the like. In some embodiment, a thickness of the bottom layer $201_1$ may be between about 500 Å and about 2000 Å. The middle layer $201_2$ may comprise an inorganic material, which may be a nitride (such as SiN, TiN, TaN, or the like), an oxynitride (such as SiON), an oxide (such as silicon oxide), or the like, and may be formed using CVD, ALD, or the like. In some embodiments, a thickness of the middle layer $201_2$ may be between about 100 Å and about 400 Å. The top layer $201_3$ may comprise an organic material, such as a photoresist material, and may be formed using a spin-on coating, or the like. In some embodiment, a thickness of the top layer $201_3$ may be between about 500 Å and about 1500 Å. In some embodiments, the middle layer $201_2$ has a higher etch rate than the top layer $201_3$, and the top layer $201_3$ is used as an etch mask for patterning of the middle layer $201_2$. The bottom layer $201_1$ has a higher etch rate than the middle layer $201_2$, and the middle layer $201_2$ is used as an etch mask for patterning of the bottom layer $201_1$.

In some embodiments, the top layer $201_3$ of the first tri-layer mask 201 is patterned to form an opening 203 in the top layer $201_3$. The top layer $201_3$ is patterned using suitable photolithography techniques. In some embodiments where the top layer $201_3$ comprises a photoresist material, the photoresist material is irradiated (exposed) and developed to remove portions of the photoresist material. In some embodiments, the opening 203 has a width $W_1$ between about 30 nm and about 50 nm, and a length $L_1$ between about 60 nm and about 6000 nm.

Figure 3A:
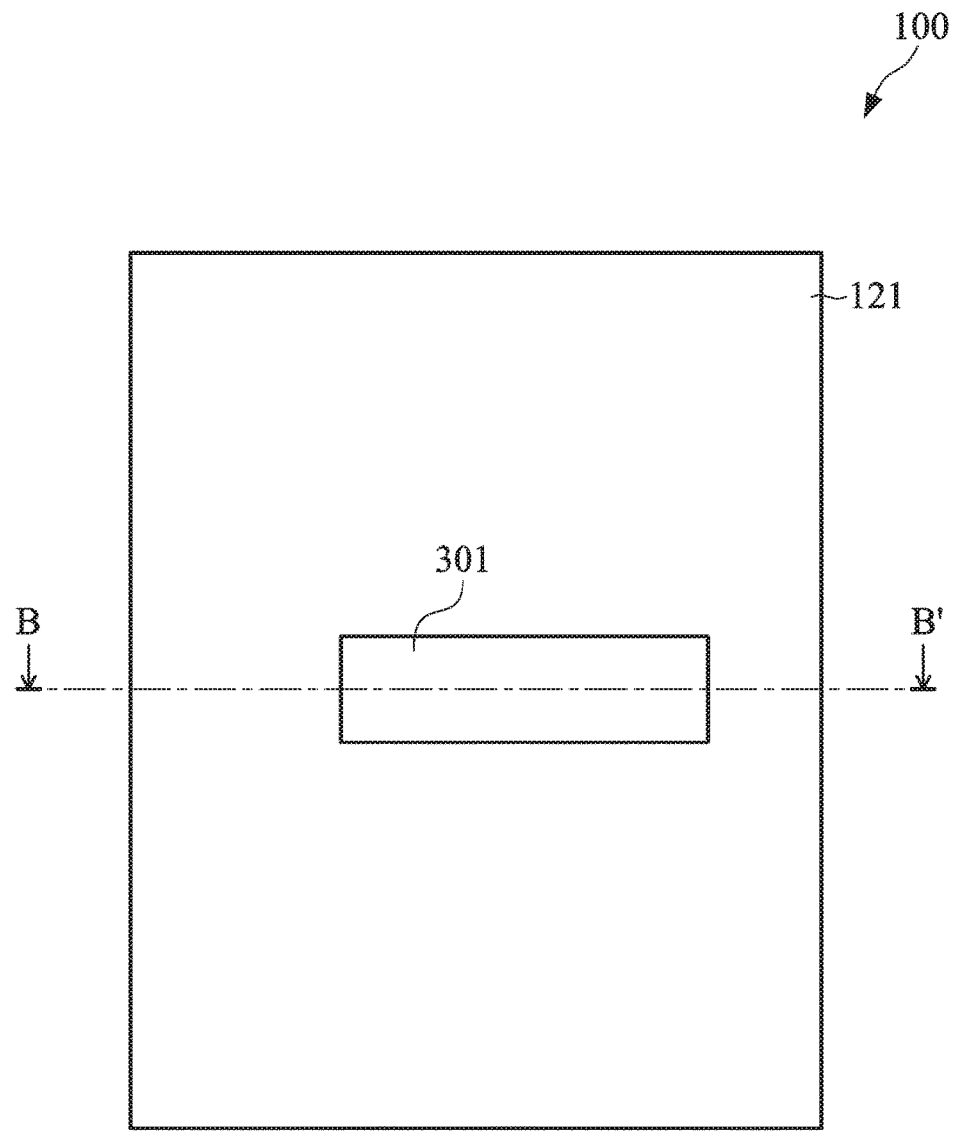
Figure 3B:
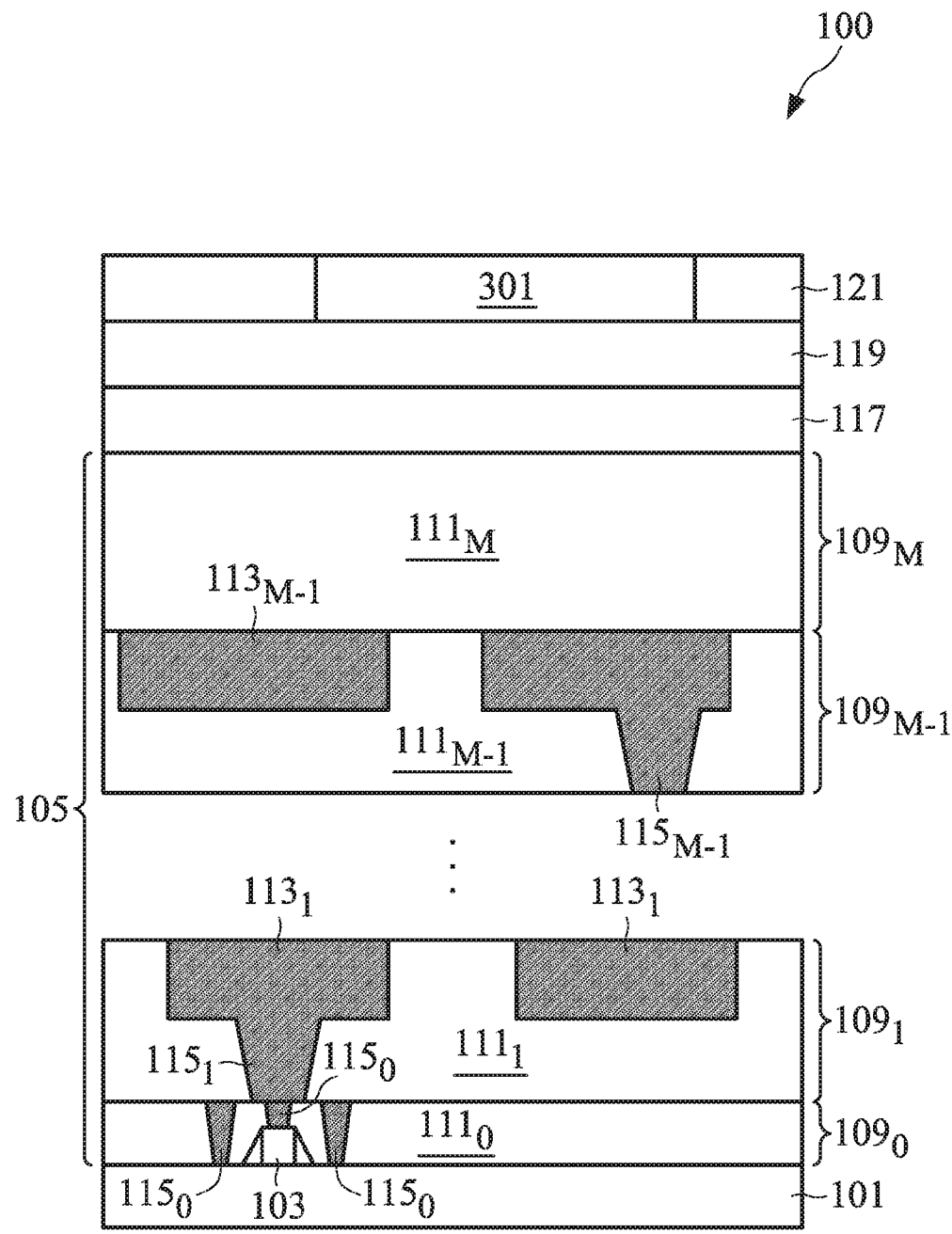

Referring to FIGS. 3A and 3B, a patterning process is performed on the second mask layer 121 to transfer the opening 203 (see FIGS. 2A and 2B) in the first tri-layer mask 201 to the second mask layer 121. In some embodiments, the patterning process comprises one or more etching processes, where the first tri-layer mask 201 is used as an etch mask. The one or more etching processes may include anisotropic wet etching processes, anisotropic dry etching processes, or combinations thereof. In some embodiments where the second mask layer 121 is a dielectric hard mask layer, the second mask layer 121 is patterned by a dry etch process with etch process gases including $O_2$, $CO_2$, $C_xH_yF_z$, Ar, $N_2$, $H_2$, HBr, $Cl_2$, He, the like, or a combination thereof. During the patterning process, the top layer $201_3$, the middle layer $201_2$, and the bottom layer $201_1$ of the first tri-layer mask 201 may be consumed. If any residue of the top layer $201_3$, the middle layer $201_2$, and the bottom layer $201_1$ of the first tri-layer mask 201 is left over the second mask layer 121 after the patterning processes, the residue may also be removed.

Subsequently, the opening in the second mask layer 121 is filled with a suitable insulating material to form a merge cut feature 301. Suitable insulating materials may include oxides (such as silicon oxide, aluminum oxide, SiCOH, $SiO_xC_y$, TEOS, or the like), nitrides (such as SiN, or the like), oxynitrides (such as SiON, or the like), combinations thereof, or the like, and may be formed using spin-on coating, CVD, PECVD, ALD, the like, or a combination thereof. Portions of the insulating material overfilling the opening in the second mask layer 121 are removed to expose an upper surface of the second mask layer 121. In an embodiment, the portions of the insulating material are removed using a suitable etch process. Alternatively, the portions of the insulating material may be removed using a CMP process, a grinding process, the like, or a combination thereof. In the illustrated embodiment, the merge cut layer 301 has approximately same length as the opening 203 in the first tri-layer mask 201, and smaller width then the opening 203 in the first tri-layer mask 201 (see FIGS. 2A and 2B). The merge cut feature 301 may have a width between about 15 nm and about 30 nm, and a length between about 60 nm and about 6000 nm. As described below in greater detail, multiple mandrel layers (see FIGS. 4A and 4B) are formed over the second mask layer 121 and the merge cut feature 301. Multiple patterns are transferred to the mandrel layers. The merge cut feature 301 is then used to cut patterns formed in the mandrel layers, such that portions of patterns in the mandrel layers are not transferred to the second mask layer 121 and the first mask layer 119. In some embodiments, a material for the merge cut feature 301 is chosen such that the merge cut feature 301 has a desired etch selectivity with respect to adjacent layers, such as the first mask layer 119, the second mask layer 121, and a mandrel layer subsequently formed over the merge cut feature 301. In the illustrated embodiment, one merge cut feature 301 is formed in the second mask layer 121. In alternative embodiments, more than one merge cut features 301 may be formed in the second mask layer 121. In such embodiments, the process steps described with reference to FIGS. 2A-3B may be performed one or more times until desired number of merge cut features 301 are formed in the second mask layer 121.

Figure 4A:
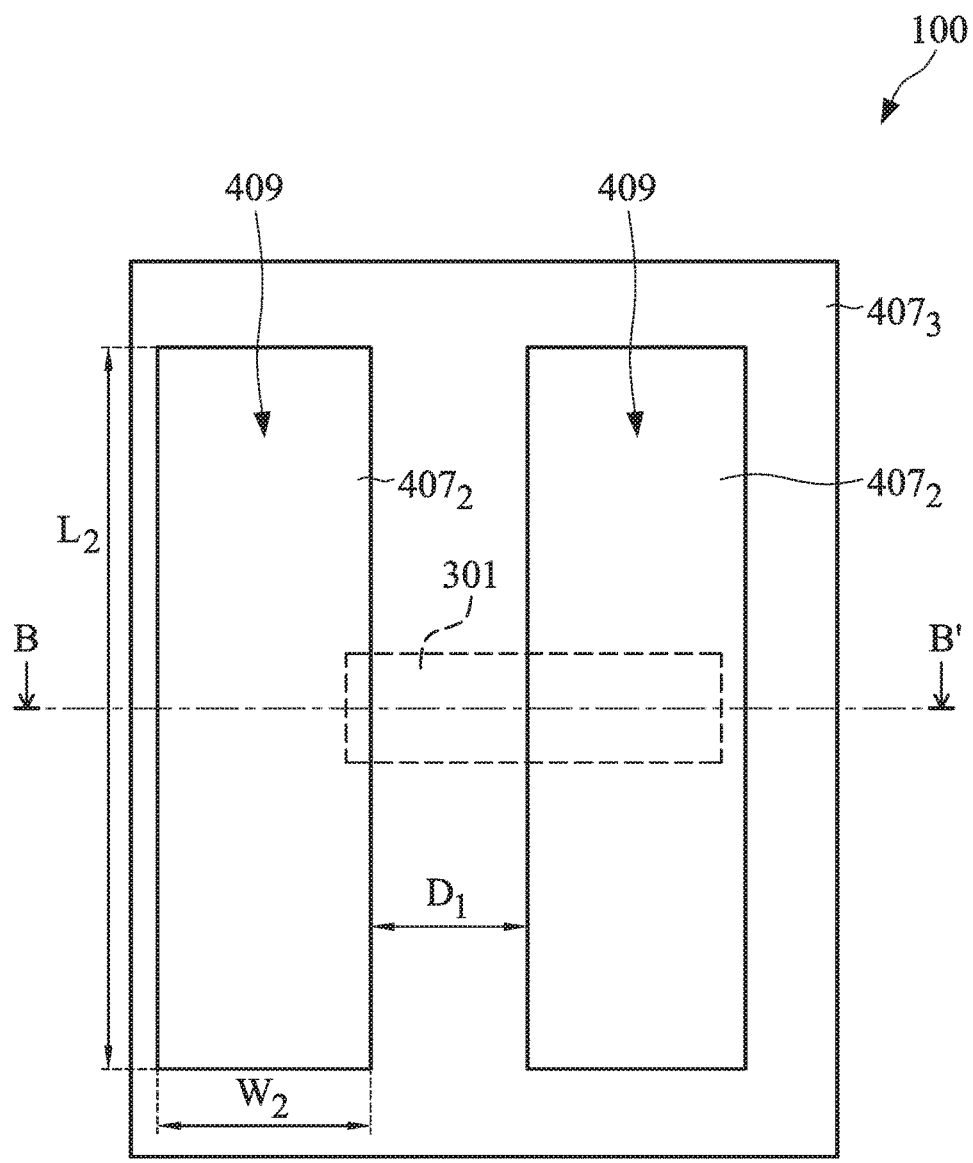
Figure 4B:
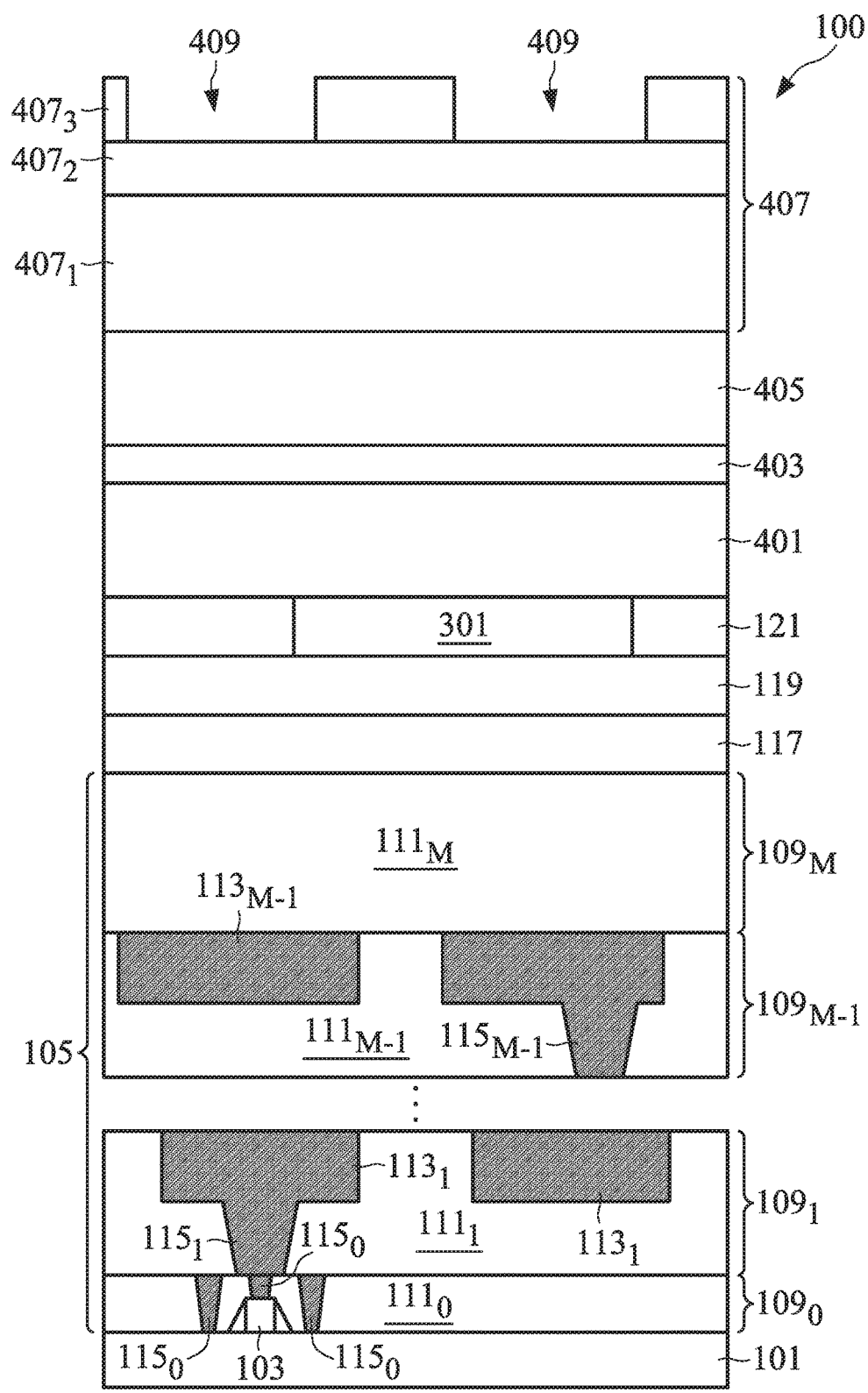

Referring to FIGS. 4A and 4B, a first mandrel layer 401 is formed over the second mask layer 121 and the merge cut feature 301, a mandrel cap layer 403 is formed over the first mandrel layer 401, and a second mandrel layer 405 is formed over the mandrel cap layer 403. A stack of layers comprising the first mandrel layer 401, the mandrel cap layer 403, and the second mandrel layer 405 may also be referred to as a mandrel stack. The first mandrel layer 401 and the second mandrel layer 405 may comprise amorphous silicon, amorphous carbon, $AlO_xN_y$, the like, or a combination thereof, and may be formed using CVD, ALD, the like, or a combination thereof. The mandrel cap layer 403 may comprise silicon oxide, aluminum oxide, SiCOH, $SiO_xC_y$, TEOS, the like, or the combination thereof, and may be formed using spin-on coating, CVD, ALD, the like, or a combination thereof. In some embodiments, materials for the first mandrel layer 401, the mandrel cap layer 403, and the second mandrel layer 405 are chosen such that the first mandrel layer 401, the mandrel cap layer 403, and the second mandrel layer 405 have desired etch rates for subsequent patterning processes. In some embodiments, the first mandrel layer 401 may have a thickness between about 300 Å and about 550 Å, the second mandrel layer 405 may have a thickness between about 200 Å and about 500 Å, and the mandrel cap layer 403 may have a thickness between about 100 Å and about 300 Å.

Referring further to FIGS. 4A and 4B, a second tri-layer mask 407 is formed over the second mandrel layer 405. In some embodiments, the second tri-layer mask 407 comprises a bottom layer $407_1$, a middle layer $407_2$ over the bottom layer $407_1$, and a top layer $407_3$ over the middle layer $407_2$. In some embodiments, the bottom layer $407_1$, the middle layer $407_2$, and the top layer $407_3$ of the second tri-layer mask 407 may be formed using similar materials and methods as the bottom layer $201_1$, the middle layer $201_2$, and the top layer $201_3$ of the first tri-layer mask 201, respectively, described above with reference to FIGS. 2A and 2B, and the description is not repeated herein for the sake of brevity. In some embodiments, a thickness of the bottom layer $407_1$ may be between about 500 Å and about 2000 Å, a thickness of the middle layer $407_2$ may be between about 100 Å and about 400 Å, and a thickness of the top layer $407_3$ may be between about 500 Å and about 1500 Å.

The top layer $407_3$ of the second tri-layer mask 407 is patterned to form openings 409 in the top layer $407_3$ of the second tri-layer mask 407. In some embodiments, the top layer $407_3$ of the second tri-layer mask 407 may be patterned using similar methods as the top layer $201_3$ of the first tri-layer mask 201, described above with reference to FIGS. 2A and 2B, and the description is not repeated herein for the sake of brevity. In some embodiments, a width $W_2$ of the openings 409 is between about 30 nm and about 5000 nm, a length $L_2$ of the openings 409 is between about 60 nm and about 80000 nm, and a distance $D_1$ between adjacent openings 409 is between about 35 nm and about 20000 nm. In the illustrated embodiment, two openings 409 are formed in the top layer $407_3$ of the second tri-layer mask 407. In other embodiments, less than or more than two openings 409 may be formed in the top layer $407_3$ of the second tri-layer mask 407.

Figure 5A:
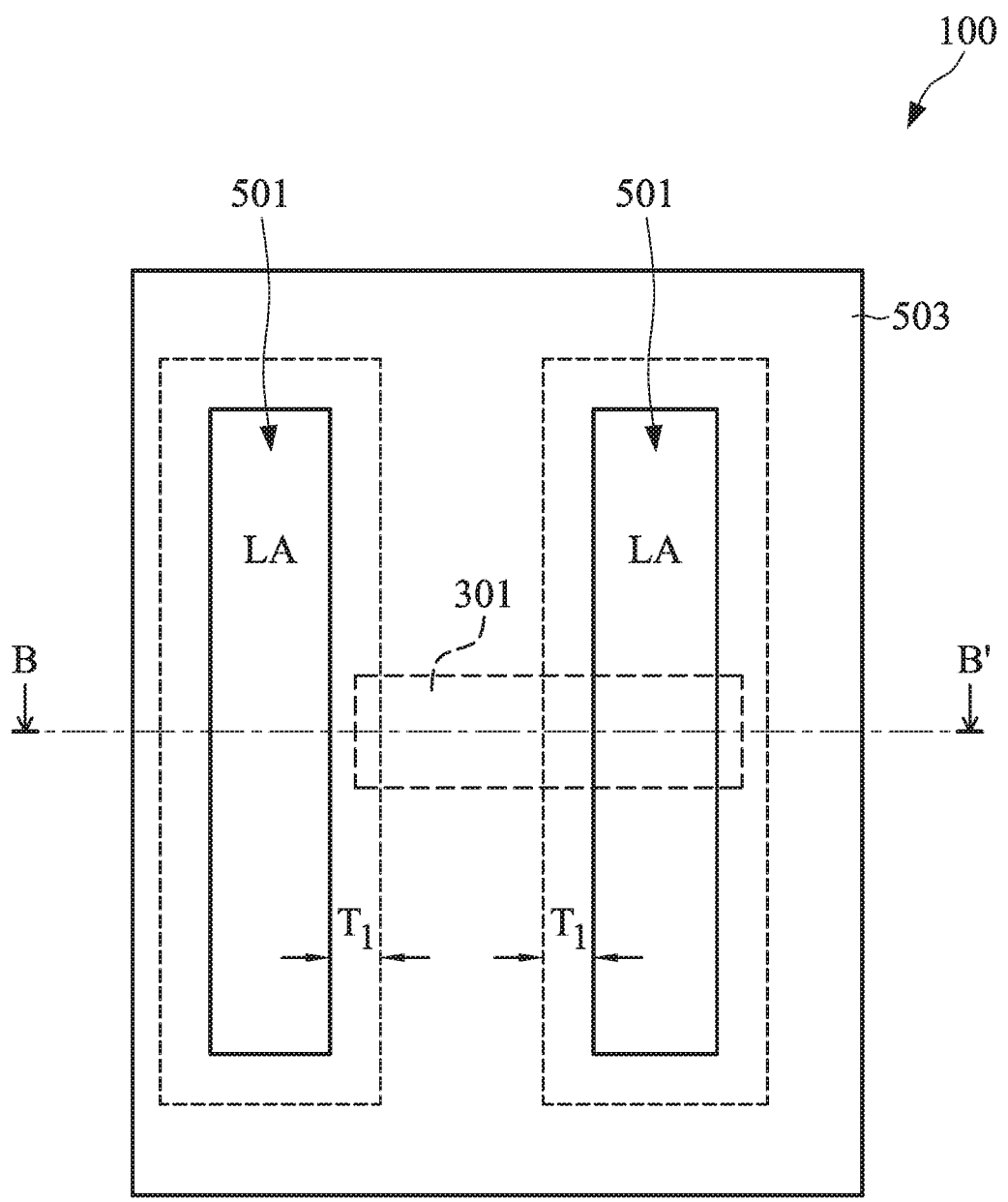
Figure 5B:
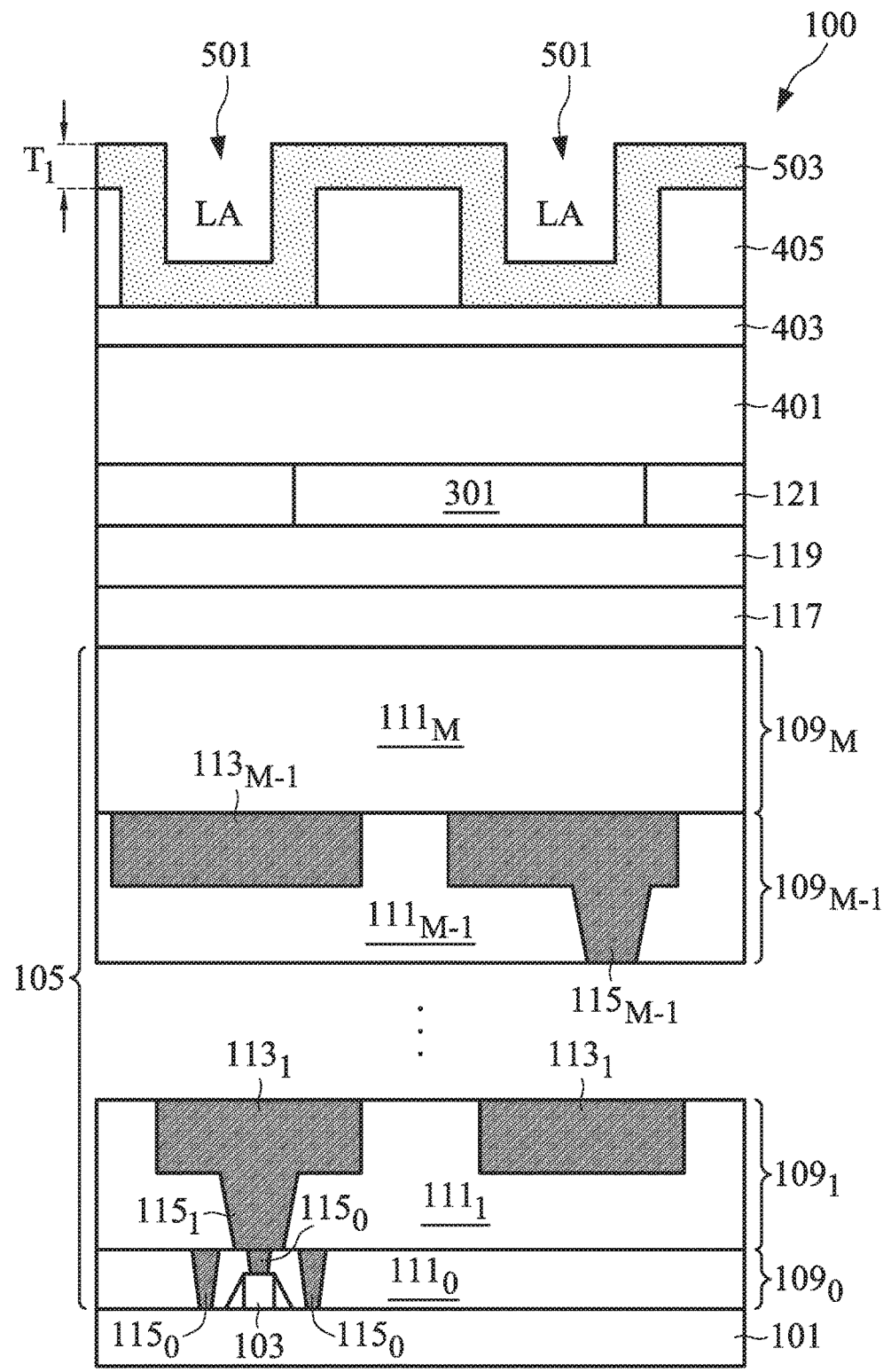

Referring to FIGS. 5A and 5B, a first patterning process is performed on the second mandrel layer 405 to transfer the openings 409 in the second tri-layer mask 407 (see FIGS. 4A and 4B) to the second mandrel layer 405. The first patterning process forms openings 501 in the second mandrel layer 405. In some embodiments, the first patterning process comprises one or more etching processes, where the second tri-layer mask 407 is used as an etch mask. The one or more etching processes may include anisotropic wet etching processes, anisotropic dry etching processes, or combinations thereof. In some embodiments, the second mandrel layer 405 is patterned by a dry etch process with etch process gases including $O_2$, $CO_2$, $C_xH_yF_z$, Ar, $N_2$, $H_2$, the like, or a combination thereof. Accordingly, the openings 501 in the second mandrel layer 405 have approximately same sizes and pitch as respective openings 409 in the top layer $407_3$ of the second tri-layer mask 407 (see FIGS. 4A and 4B). During the first patterning process, the top layer $407_3$, the middle layer $407_2$, and the bottom layer $407_1$ of the second tri-layer mask 407 may be consumed. If any residue of the top layer $407_3$, the middle layer $407_2$, and the bottom layer $407_1$ of the second tri-layer mask 407 is left over the second mandrel layer 405 after the first patterning processes, the residue may also be removed. A pattern of the openings 501 may also be referred to as a line-A (LA) pattern. Accordingly, the photolithography process described with reference to FIGS. 4A and 4B may also be referred to as LA photolithography, and the etch processes described with reference to FIGS. 5A and 5B may also be referred to as LA etch.

Referring further to FIGS. 5A and 5B, a first spacer layer 503 is conformally formed over the second mandrel layer 405 and in the openings 501. Accordingly, a width and a length of the openings 501 are reduced by about two times a thickness $T_1$ of the first spacer layer 503. The first spacer layer 503 may comprise an oxide (such a silicon oxide, aluminum oxide, titanium oxide, or the like), a nitride (such as SiN, titanium nitride, or the like), an oxynitride (such as SiON, or the like), an oxycarbide (such as SiOC, or the like), a carbonitride (such as SiCN, or the like), the like, or a combination thereof, and may be formed using, CVD, PECVD, ALD, the like, or a combination thereof. In some embodiments, the thickness $T_1$ of the first spacer layer 503 may be between about 100 Å and about 200 Å.

Figure 6A:
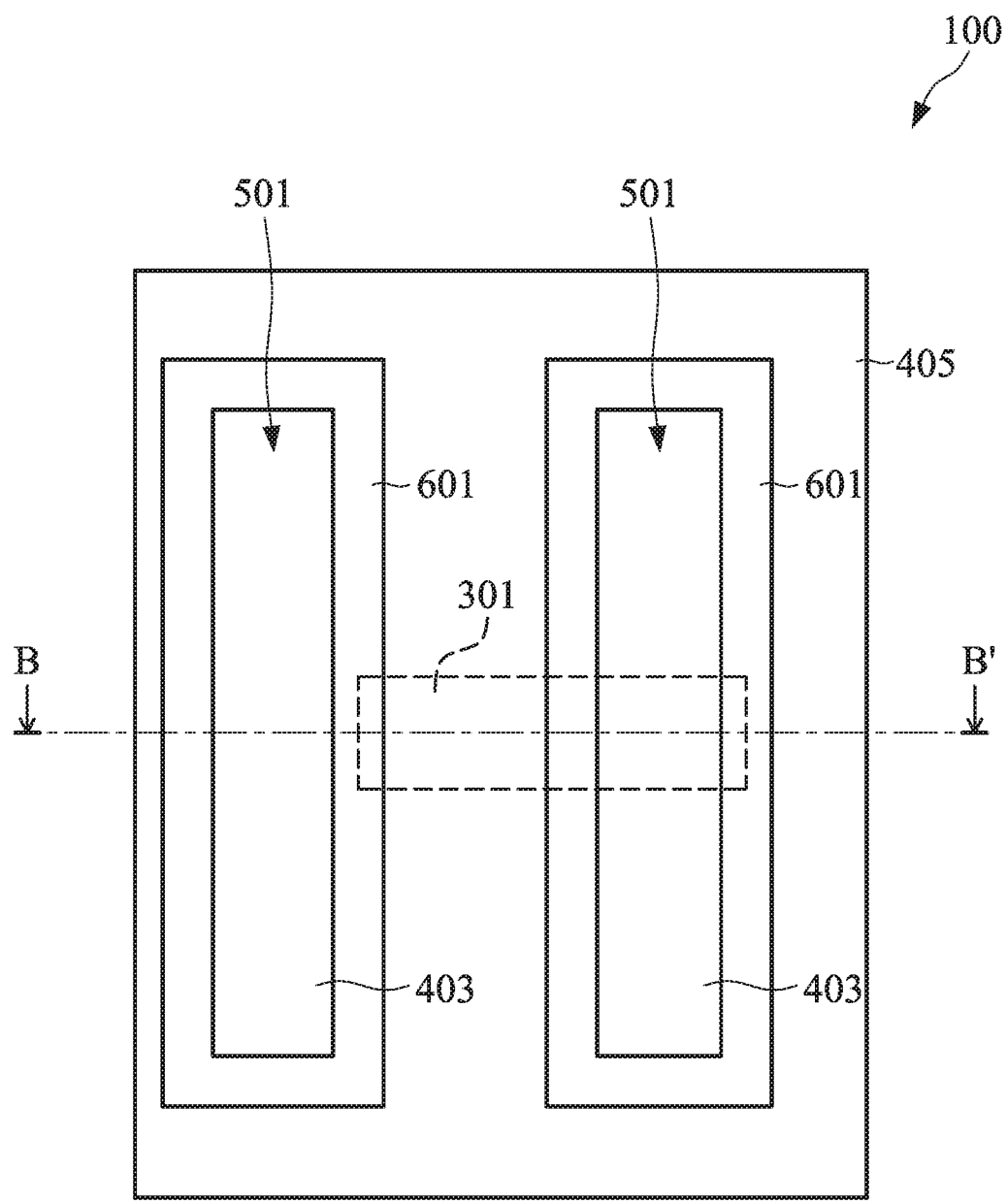
Figure 6B:
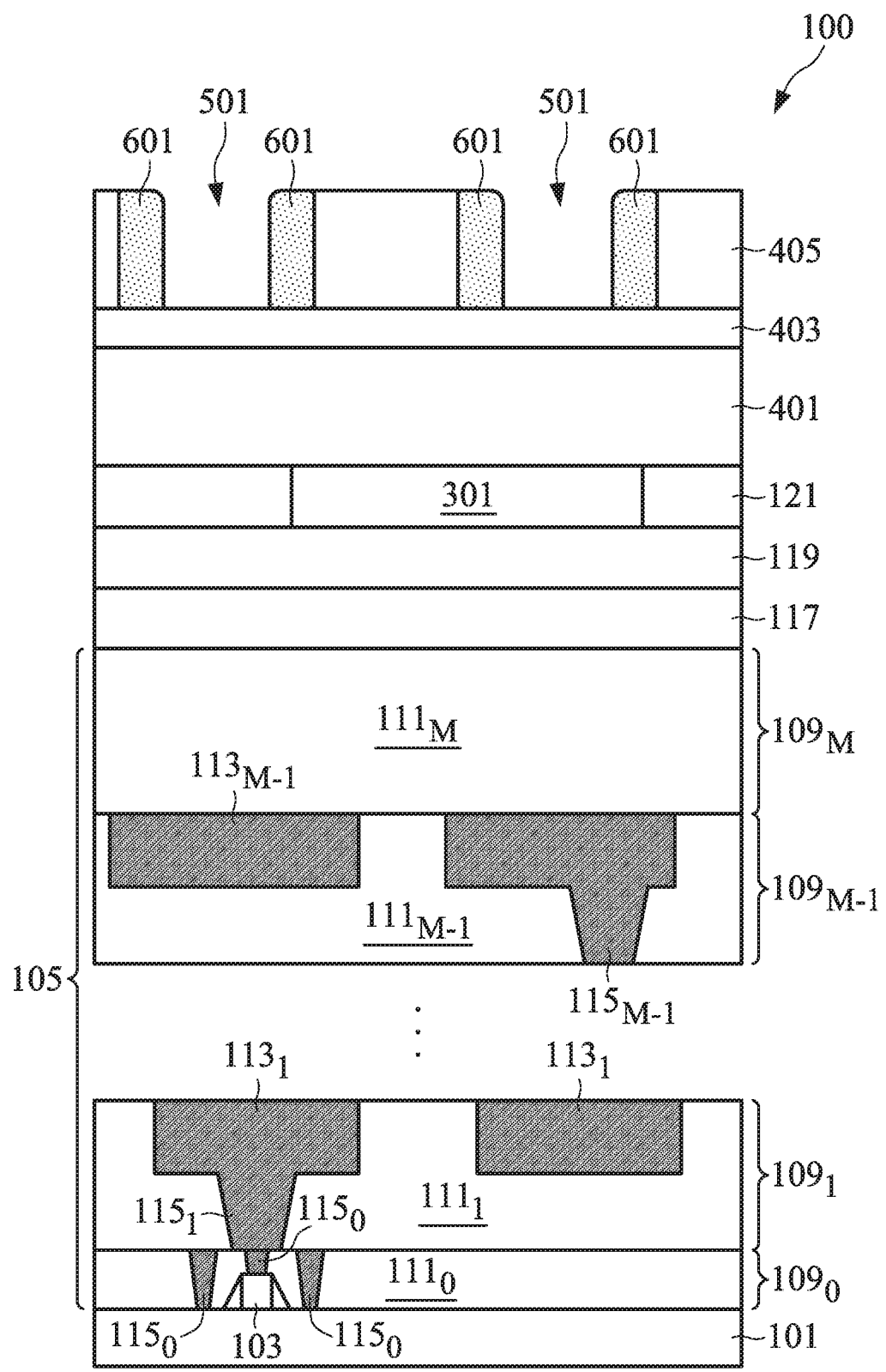

Referring to FIGS. 6A and 6B, the first spacer layer 503 is patterned to form first spacers 601 on sidewalls of the openings 501. In some embodiments, the first spacer layer 503 is patterned using an anisotropic dry etch process to remove horizontal portions of the first spacer layer 503 from an upper surface of the second mandrel layer 405 and bottoms of the openings 501. Portions of the first spacer layer 503 remaining on the sidewalls of the openings 501 form the first spacers 601. In some embodiments, the first spacer layer 503 is patterned by a dry etch process with etch process gases including $Cl_2$, $O_2$, $C_xH_yF_z$, $N_2$, $H_2$, HBr, $Cl_2$, He, the like, or a combination thereof.

Figure 7A:
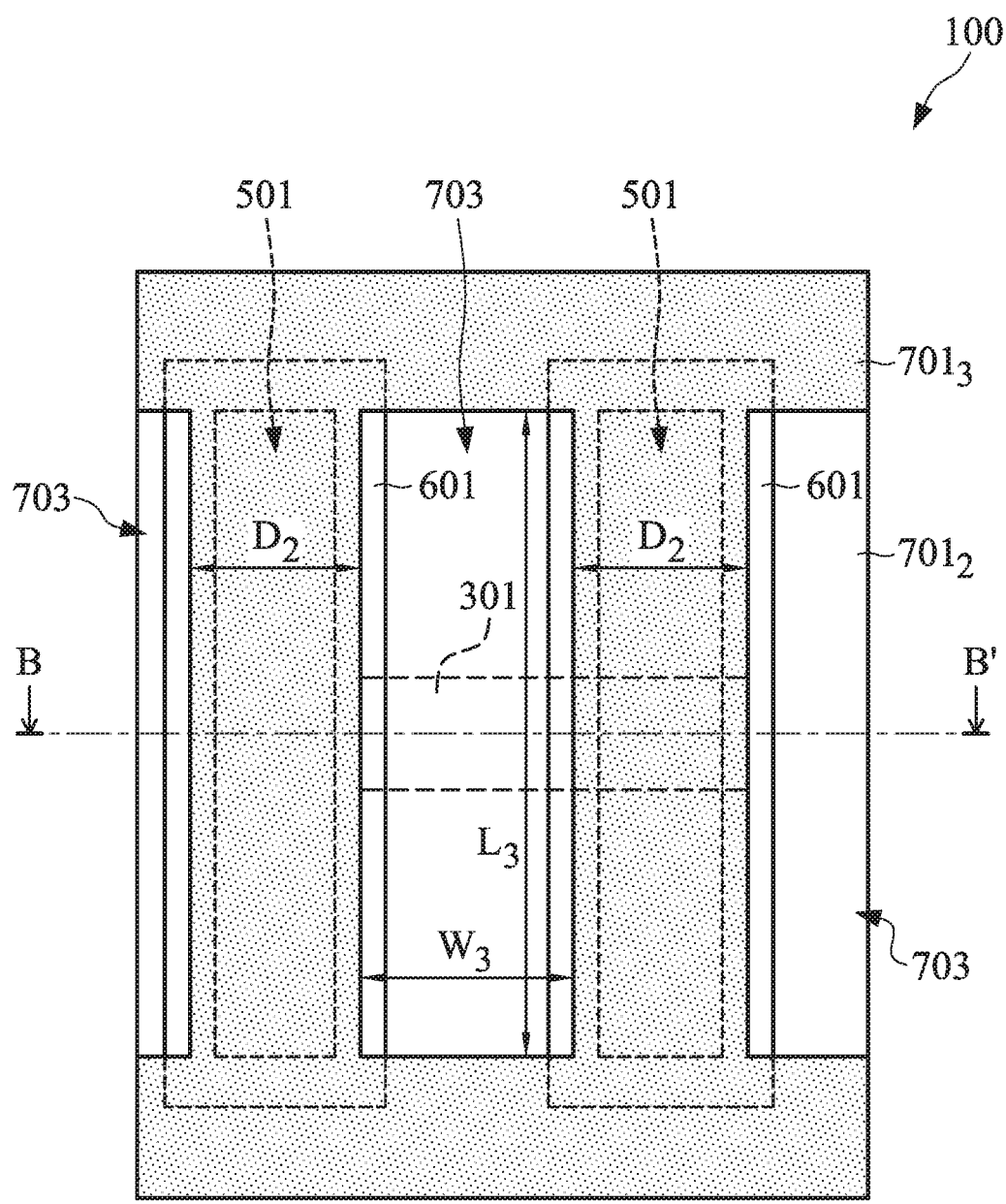
Figure 7B:
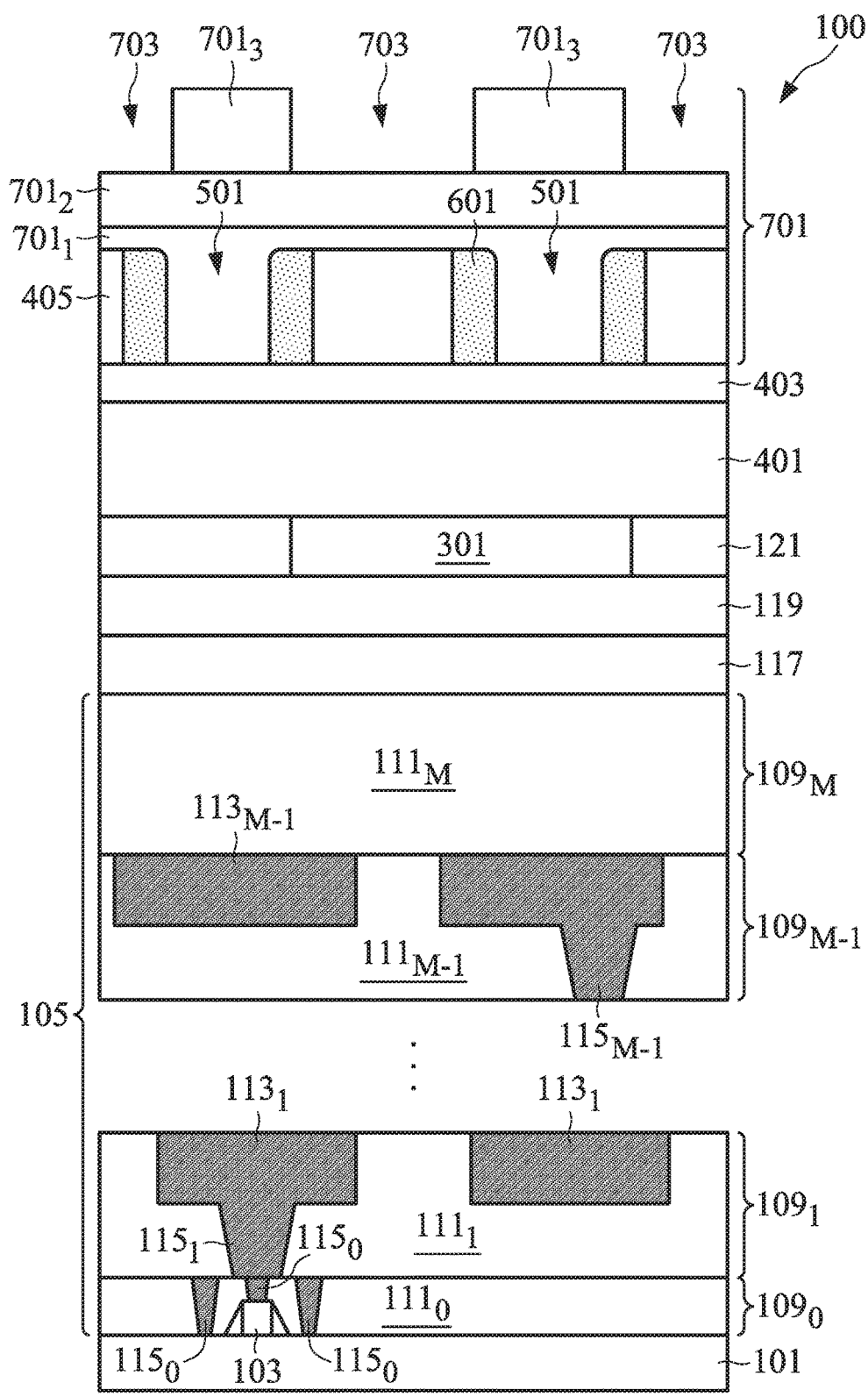

Referring to FIGS. 7A and 7B, a third tri-layer mask 701 is formed over the second mandrel layer 405 and the first spacers 601. The third tri-layer mask 701 comprises a bottom layer $701_1$, a middle layer $701_2$ over the bottom layer $701_1$, and a top layer $701_3$ over the middle layer $701_2$. In some embodiments, the bottom layer $701_1$, the middle layer $701_2$, and the top layer $701_3$ of the third tri-layer mask 701 may be formed using similar materials and methods as the bottom layer $201_1$, the middle layer $201_2$, and the top layer $201_3$ of the first tri-layer mask 201, respectively, described above with reference to FIGS. 2A and 2B, and the description is not repeated herein for the sake of brevity. In some embodiments, a thickness of the bottom layer $701_1$ may be between about 500 Å and about 2000 Å, a thickness of the middle layer $701_2$ may be between about 100 Å and about 400 Å, and a thickness of the top layer $701_3$ may be between about 500 Å and about 1500 Å.

The top layer $701_3$ of the third tri-layer mask 701 is patterned to form openings 703 in the top layer $701_3$ of the third tri-layer mask 701, such that the openings 501 in the second mandrel layer 405 are protected by the third tri-layer mask 701. In some embodiments, the top layer $701_3$ of the third tri-layer mask 701 may be patterned using similar methods as the top layer $201_3$ of the first tri-layer mask 201 described above with reference to FIGS. 2A and 2B, and the description is not repeated herein for the sake of brevity. In some embodiments, a width $W_3$ of the openings 703 is between about 30 nm and about 5000 nm, a length $L_3$ of the openings 703 is between about 60 nm and about 80000 nm, and a distance $D_2$ between adjacent openings 703 is between about 35 nm and about 20000 nm. In some embodiments, a width of the narrowed openings 501 is less than or equal to the distance $D_2$ between adjacent openings 703, such that the narrowed openings 501 are protected by the patterned third tri-layer mask 701. In the illustrated embodiment, three openings 703 are formed in top layer $701_3$ of the third tri-layer mask 701. In other embodiments, less than or more than three openings 703 may be formed in top layer $701_3$ of the third tri-layer mask 701.

Figure 8A:
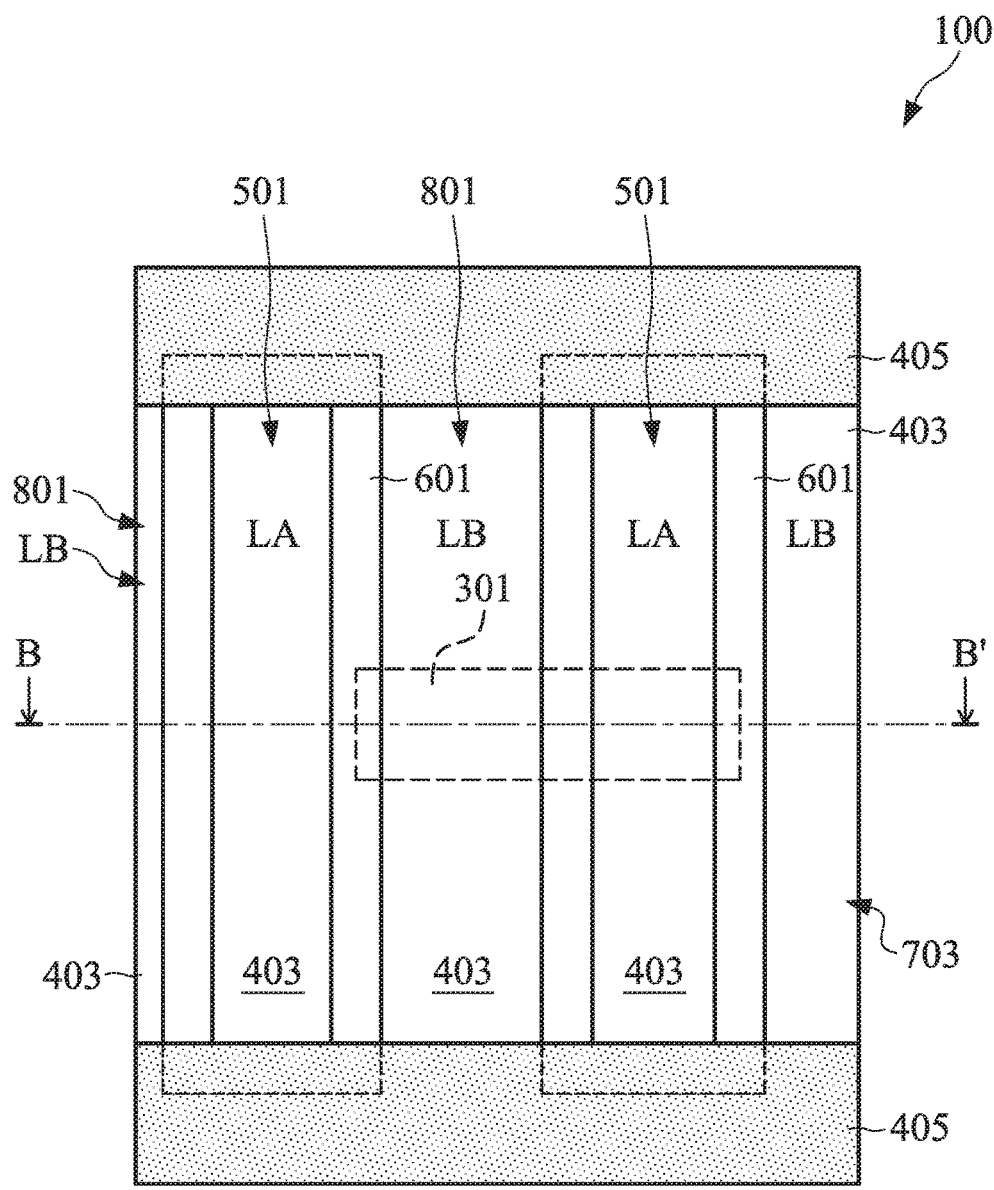
Figure 8B:
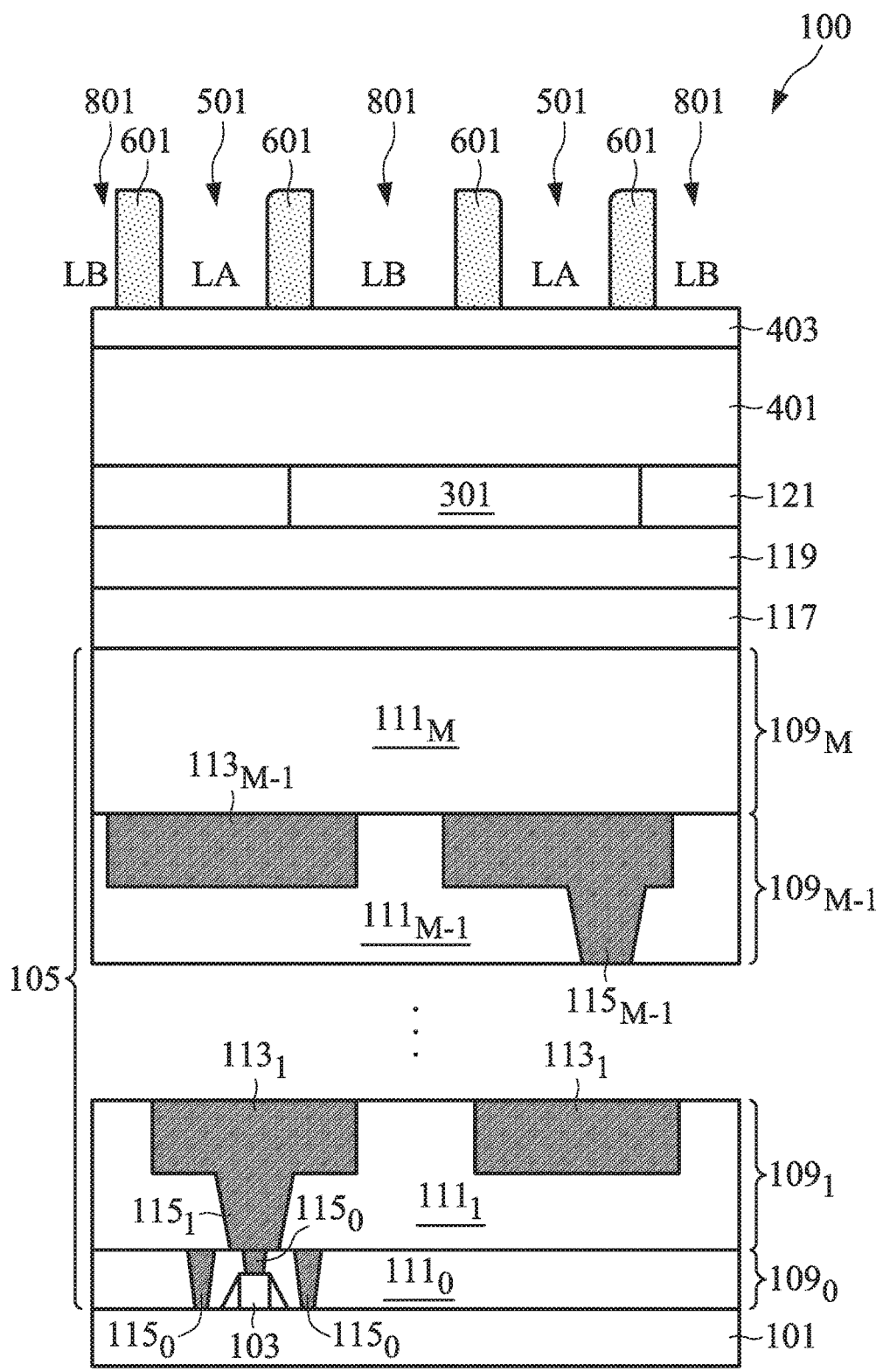

Referring to FIGS. 8A and 8B, a second patterning process is performed on the second mandrel layer 405 to form openings 801 in the second mandrel layer 405. In some embodiments, the second patterning process comprises one or more etching processes, where the third tri-layer mask 701 and the first spacers 601 are used as a combined etch mask. The one or more etching processes may include anisotropic wet etching processes, anisotropic dry etching processes, or combinations thereof. Accordingly, a width of the openings 801 in the second mandrel layer 405 approximately equals to the distance $D_1$ between the openings 409 or the openings 501 (see FIGS. 4A-5B). During the second patterning process, the top layer $701_3$, the middle layer $701_2$, and the bottom layer $701_1$ of the third tri-layer mask 701 may be consumed. If any residue of the top layer $701_3$, the middle layer $701_2$, and the bottom layer $701_1$ of the third tri-layer mask 701 is left over the second mandrel layer 405 after the second patterning processes, the residue may also be removed. A pattern of the openings 801 may also be referred to as a line-B (LB) pattern. Accordingly, the photolithography process described with reference to FIGS. 7A and 7B may also be referred to as LB photolithography, and the etch processes described with reference to FIGS. 8A and 8B may also be referred to as LB etch.

Figure 9A:
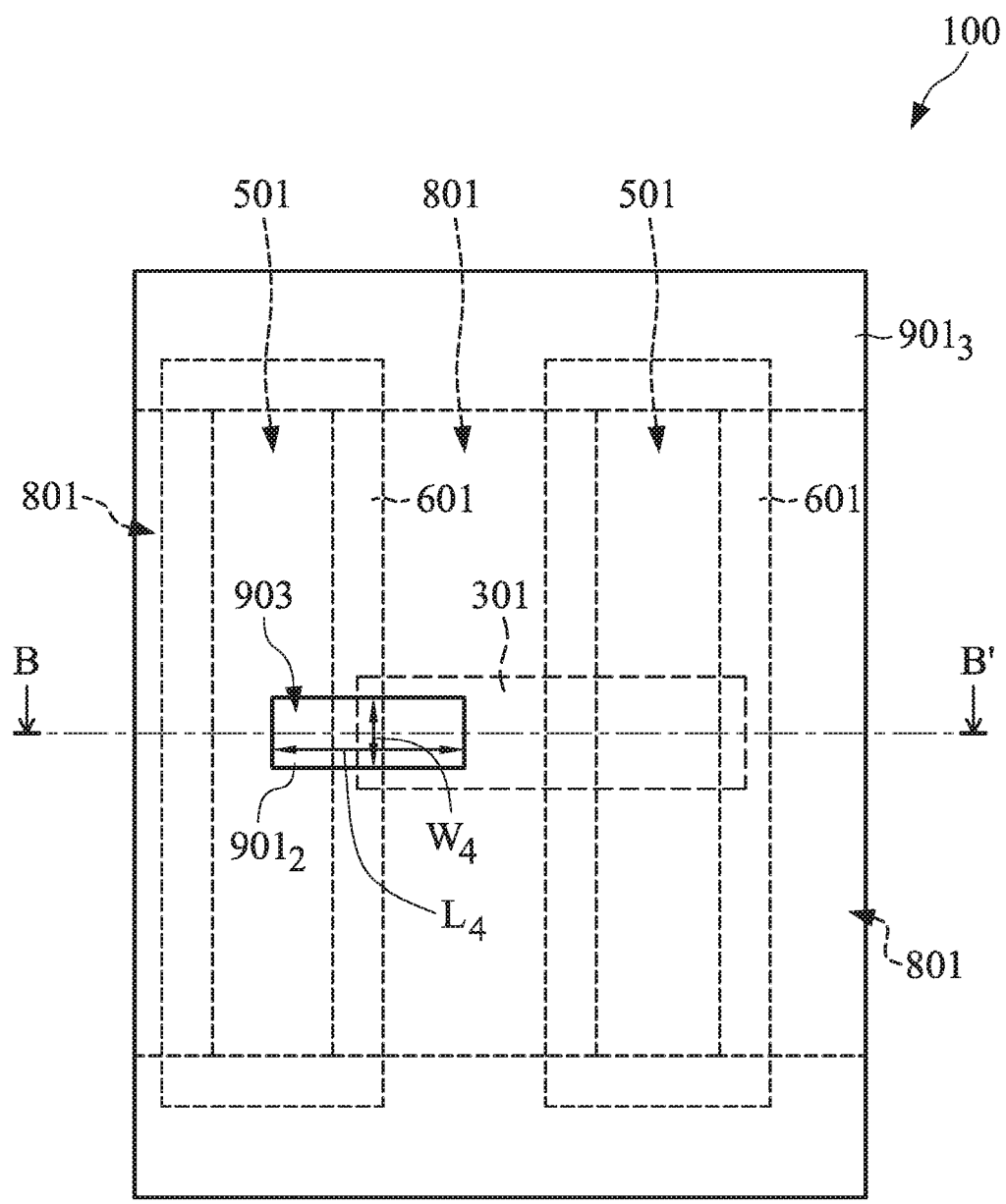
Figure 9B:
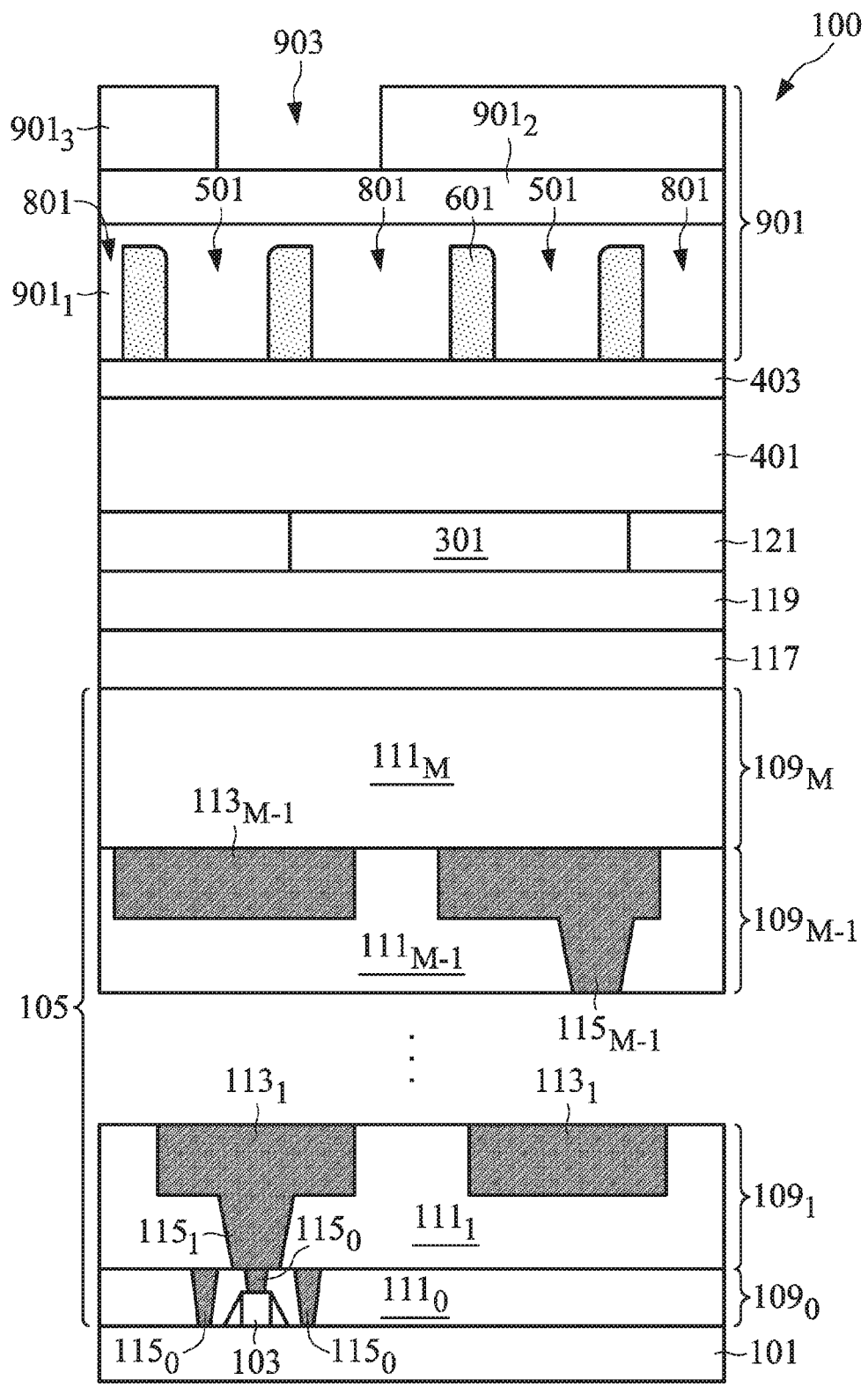

Referring to FIGS. 9A and 9B, a fourth tri-layer mask 901 is formed over the second mandrel layer 405 and the first spacers 601. The fourth tri-layer mask 901 comprises a bottom layer $901_1$, a middle layer $901_2$ over the bottom layer $901_1$, and a top layer $901_3$ over the middle layer $901_2$. In some embodiments, the bottom layer $901_1$, the middle layer $901_2$, and the top layer $901_3$ of the fourth tri-layer mask 901 may be formed using similar materials and methods as the bottom layer $201_1$, the middle layer $201_2$, and the top layer $201_3$ of the first tri-layer mask 201, respectively, described above with reference to FIGS. 2A and 2B, and the description is not repeated herein for the sake of brevity. In some embodiments, a thickness of the bottom layer $901_1$ may be between about 500 Å and about 2000 Å, a thickness of the middle layer $901_2$ may be between about 100 Å and about 400 Å, and a thickness of the top layer $901_3$ may be between about 500 Å and about 1500 Å.

The top layer $901_3$ of the fourth tri-layer mask 901 is patterned to form an opening 903 in the top layer $901_3$ of the fourth tri-layer mask 901. In some embodiments, the top layer $901_3$ of the fourth tri-layer mask 901 may be patterned using similar methods as the top layer $201_3$ of the first tri-layer mask 201 described above with reference to FIGS. 2A and 2B, and the description is not repeated herein for the sake of brevity. In some embodiments, a width $W_4$ of the opening 903 is between about 30 nm and about 50 nm, and a length $L_4$ of the opening 903 is between about 60 nm and about 6000 nm. In the illustrated embodiment, the opening 903 overlaps with at least one of the first spacers 601 as viewed from top. As described below in greater detail, a portion of the first spacers 601 not protected by the fourth tri-layer mask 901 is removed to form a gap in the first spacers 601 (see FIGS. 10A and 10B), such that a width of the gap approximately equals to the width $W_4$ of the opening 903.

Figure 10A:
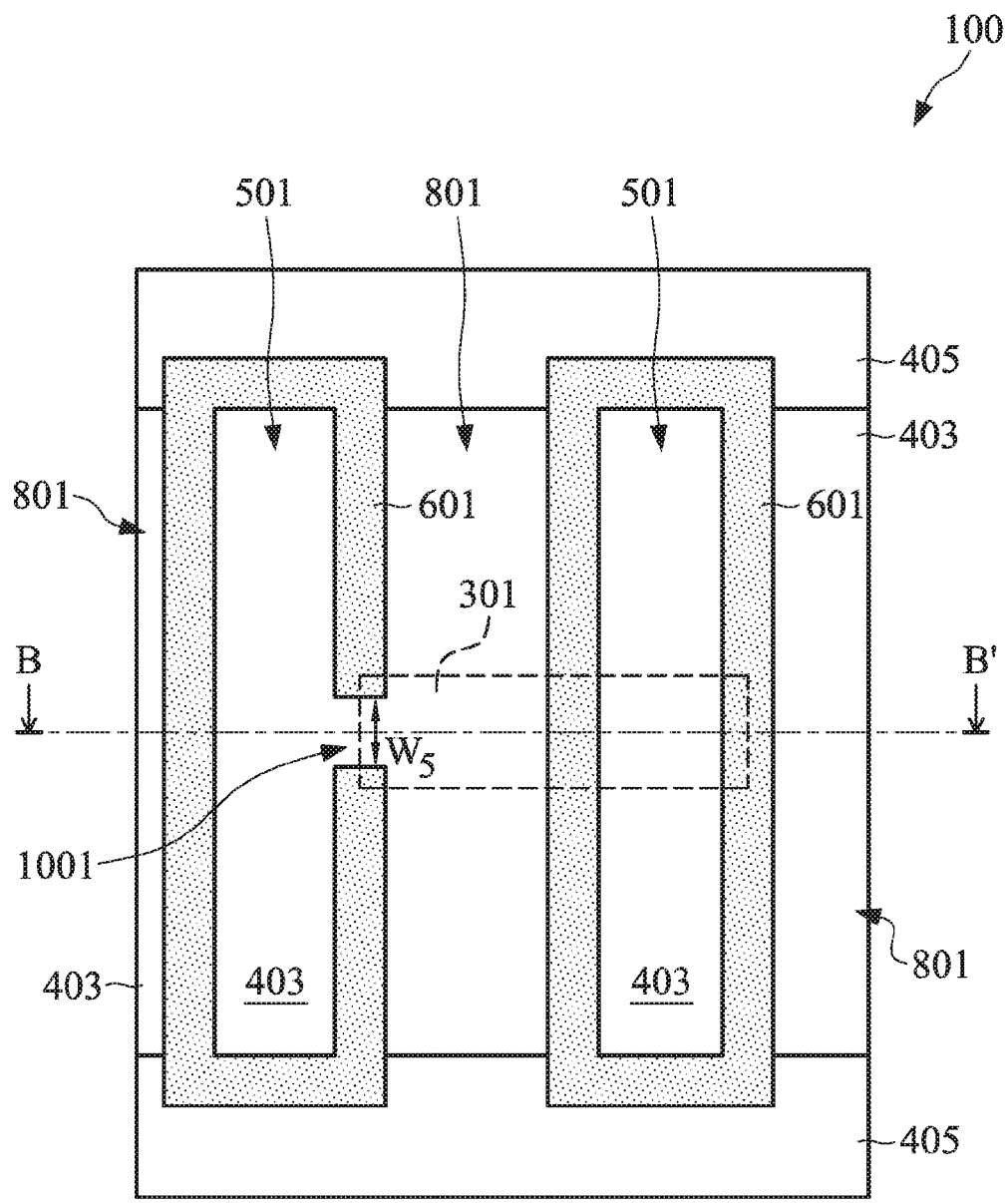
Figure 10B:
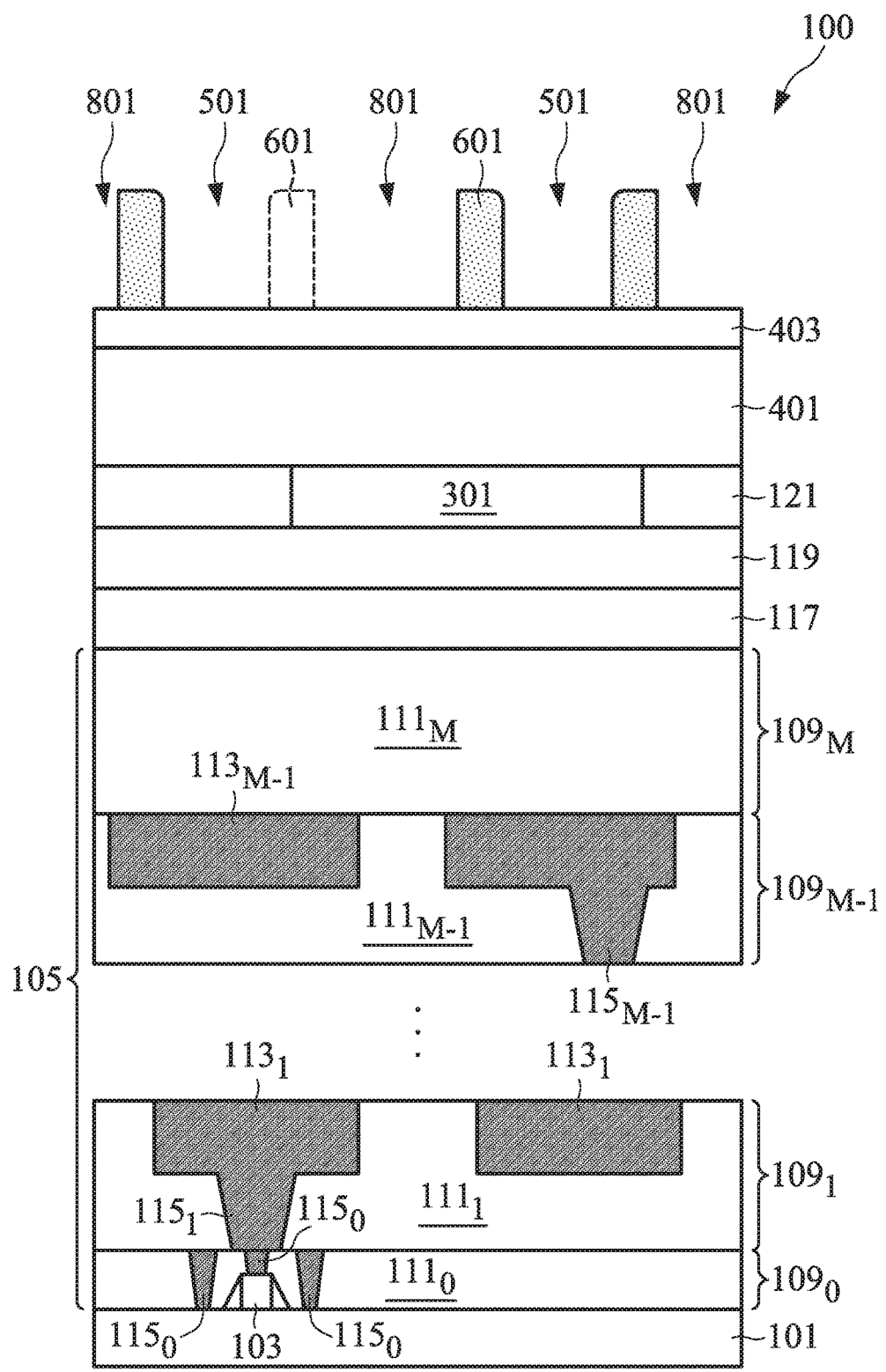

Referring to FIGS. 10A and 10B, a patterning process is performed on the first spacers 601 to remove the portion of the first spacers 601 not protected by the fourth tri-layer mask 901. The pattering process forms a gap 1001 in the first spacers 601. In some embodiments, the patterning process comprises one or more etching processes, where the fourth tri-layer mask 901 is used as an etch mask. The one or more etching processes may include anisotropic wet etching processes, anisotropic dry etching processes, or combinations thereof. In some embodiments, the first spacers 601 are patterned by a dry etch process with etch process gases including $Cl_2$, $O_2$, $C_xH_yF_z$, $N_2$, $H_2$, HBr, $Cl_2$, He, the like, or a combination thereof. Accordingly, a width $W_5$ of the gap 1001 approximately equals to the width $W_4$ of the opening 903 in the fourth tri-layer mask 901 (see FIGS. 9A and 9B). During the patterning process, the top layer $901_3$, the middle layer $901_2$, and the bottom layer $901_1$ of the fourth tri-layer mask 901 may be consumed. If any residue of the top layer $901_3$, the middle layer $901_2$, and the bottom layer $901_1$ of the fourth tri-layer mask 901 is left over the second mandrel layer 405 after the patterning processes, the residue may also be removed. In the illustrated embodiment, one gap 1001 is formed in the first spacers 601. In alternative embodiments, a plurality of gaps 1001 may be formed in the first spacers 601. In such embodiments, the process steps described with reference to FIGS. 9A-10B may be performed one or more times until desired number of gaps 1001 are formed in the first spacers 601. As described below in greater detail, the first spacers 601 are used to form line-C (LC) patterns in the first mandrel layer 401. Accordingly, the photolithography process described with reference to FIGS. 9A and 9B may also be referred to as LC-cut photolithography, the etch processes described with reference to FIGS. 10A and 10B may also be referred to as LC-cut etch, and a pattern of the gap 1001 may also be referred to LC-cut pattern.

Figure 11A:
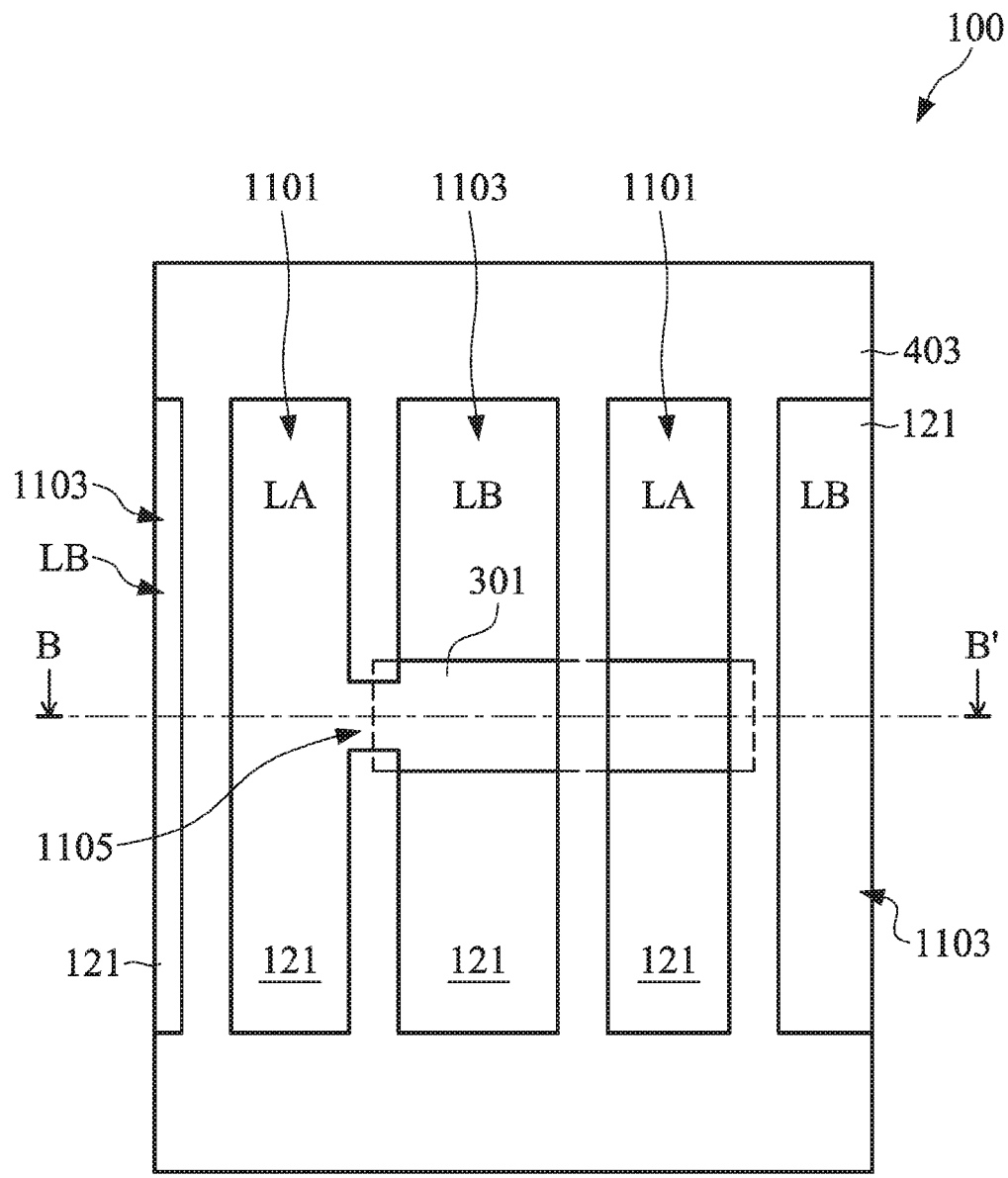
Figure 11B:
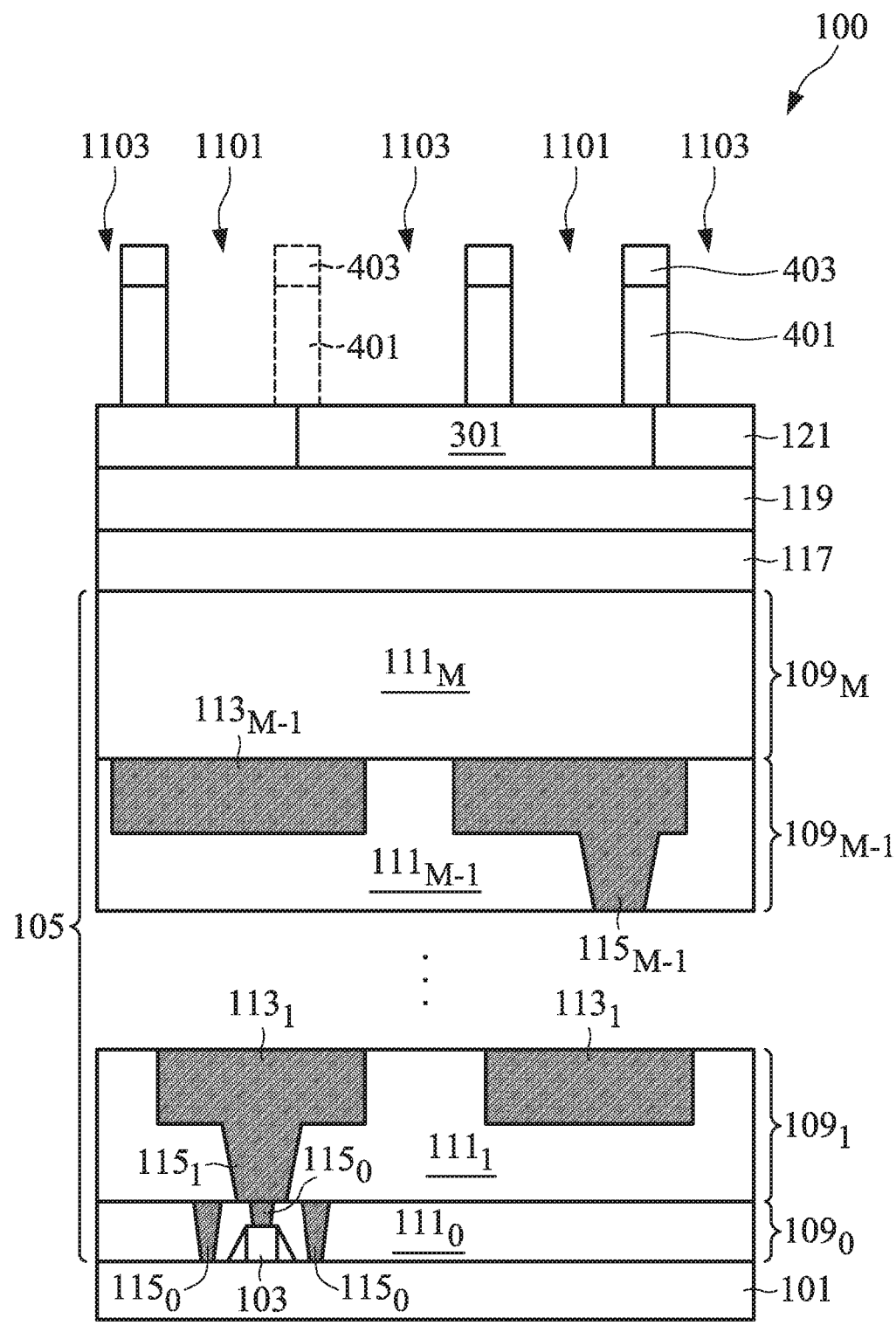

Referring to FIGS. 11A and 11B, a first patterning process is performed on the mandrel cap layer 403 and the first mandrel layer 401 to transfer the openings 501 and 801 in the second mandrel layer 405 and the gap 1001 in the first spacers 601 (see FIGS. 10A and 10B) to the mandrel cap layer 403 and the first mandrel layer 401. The first patterning process forms openings 1101 and 1103, which correspond to the openings 501 and 801, respectively, and forms a gap 1105, which corresponds to the gap 1005. Accordingly, the first patterning process transfers LA, LB, LC-cut patterns to the mandrel cap layer 403 and the first mandrel layer 401. In some embodiments, the first patterning process comprises one or more etching processes, where the second mandrel layer 405 and the first spacers 601 are used as a combined etch mask. The one or more etching processes may include anisotropic wet etching processes, anisotropic dry etching processes, or combinations thereof. In some embodiments, the mandrel cap layer 403 and the first mandrel layer 401 may be patterned using one or more dry etch processes with etch process gases including $O_2$, $CO_2$, $C_xH_yF_z$, Ar, $N_2$, $H_2$, HBr, $Cl_2$, He, the like, or a combination thereof. Accordingly, the openings 1101 in the first mandrel layer 401 and the mandrel cap layer 403 have approximately same sizes and the same pitch as respective openings 501 in the second mandrel layer 405 (see FIGS. 10A and 10B). The openings 1103 in the first mandrel layer 401 and the mandrel cap layer 403 have approximately same sizes and the same pitch as respective openings 801 in the second mandrel layer 405 (see FIGS. 10A and 10B). The gap 1105 has approximately a same width as the gap 1005 (see FIGS. 10A and 10B). Each of the openings 1101 and 1103 exposes at least a portion of the second mask layer 121, while at least one of the openings 1101 and at least one of the openings 1103 expose respective portions of the merge cut features 301.

Figure 12A:
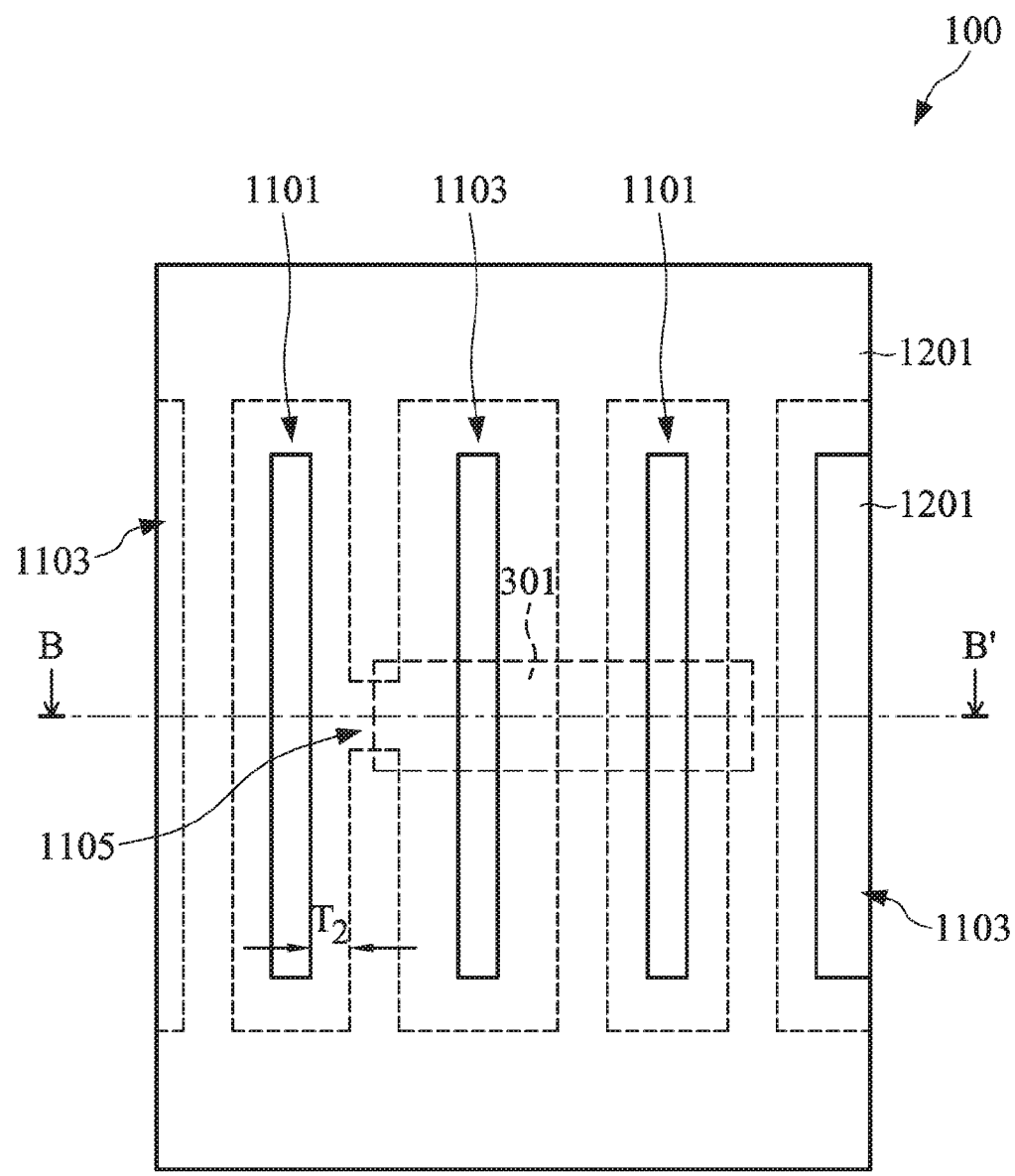
Figure 12B:
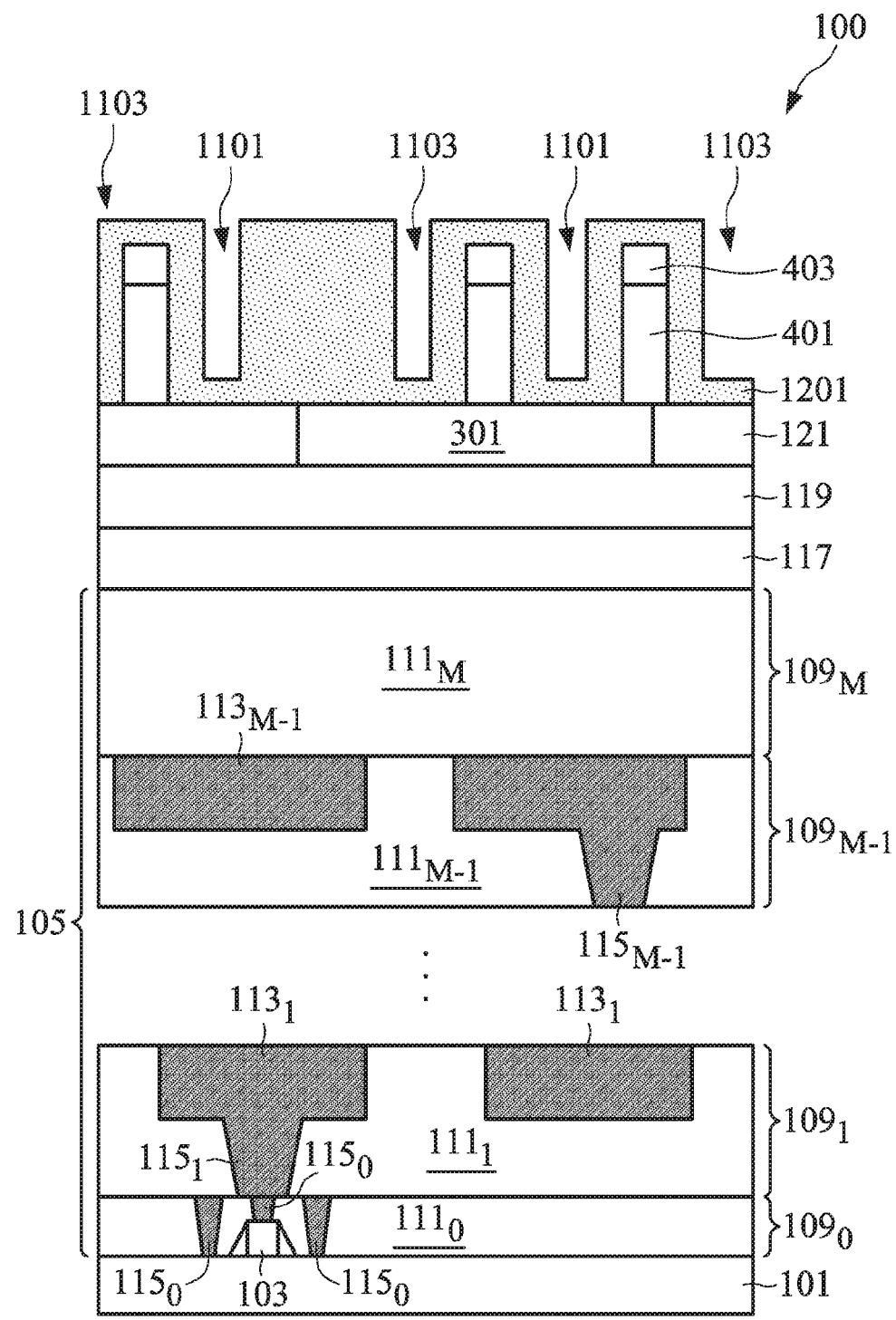

Referring to FIGS. 12A and 12B, after patterning the mandrel cap layer 403 and the first mandrel layer 401 to form the openings 1101 and 1103, the second mandrel layer 405 and the first spacers 601 are removed. In some embodiments, the second mandrel layer 405 and the first spacers 601 may be removed using one or more suitable etch processes, or the like. Subsequently, a second spacer layer 1201 is conformally formed over the mandrel cap layer 403 and in the openings 1101 and 1103. Accordingly, widths and lengths of the openings 1101 and 1103 are reduced by about two times a thickness $T_2$ of the second spacer layer 1201. In some embodiments, the second spacer layer 1201 fills the gap 1105. In such embodiments, the width of the gap 1105 is less than or equal to two times the thickness $T_2$ of the second spacer layer 1201. The second spacer layer 1201 may be formed using similar materials and methods as the first spacer layer 503, described above with reference to FIGS. 5A and 5B, and the description is not repeated herein for the sake of brevity. In some embodiments, the first spacer layer 503 and the second spacer layer 1201 are formed of a same material. In other embodiments, the first spacer layer 503 and the second spacer layer 1201 are formed of different materials. In some embodiments, the second spacer layer 1201 may have the thickness $T_2$ between about 100 Å and about 200 Å. In some embodiments, the thickness $T_2$ of the second spacer layer 1201 may equal to the thickness $T_1$ of the first spacer layer 503. In other embodiments, the thickness $T_2$ of the second spacer layer 1201 may be different from the thickness $T_1$ of the first spacer layer 503.

Figure 13A:
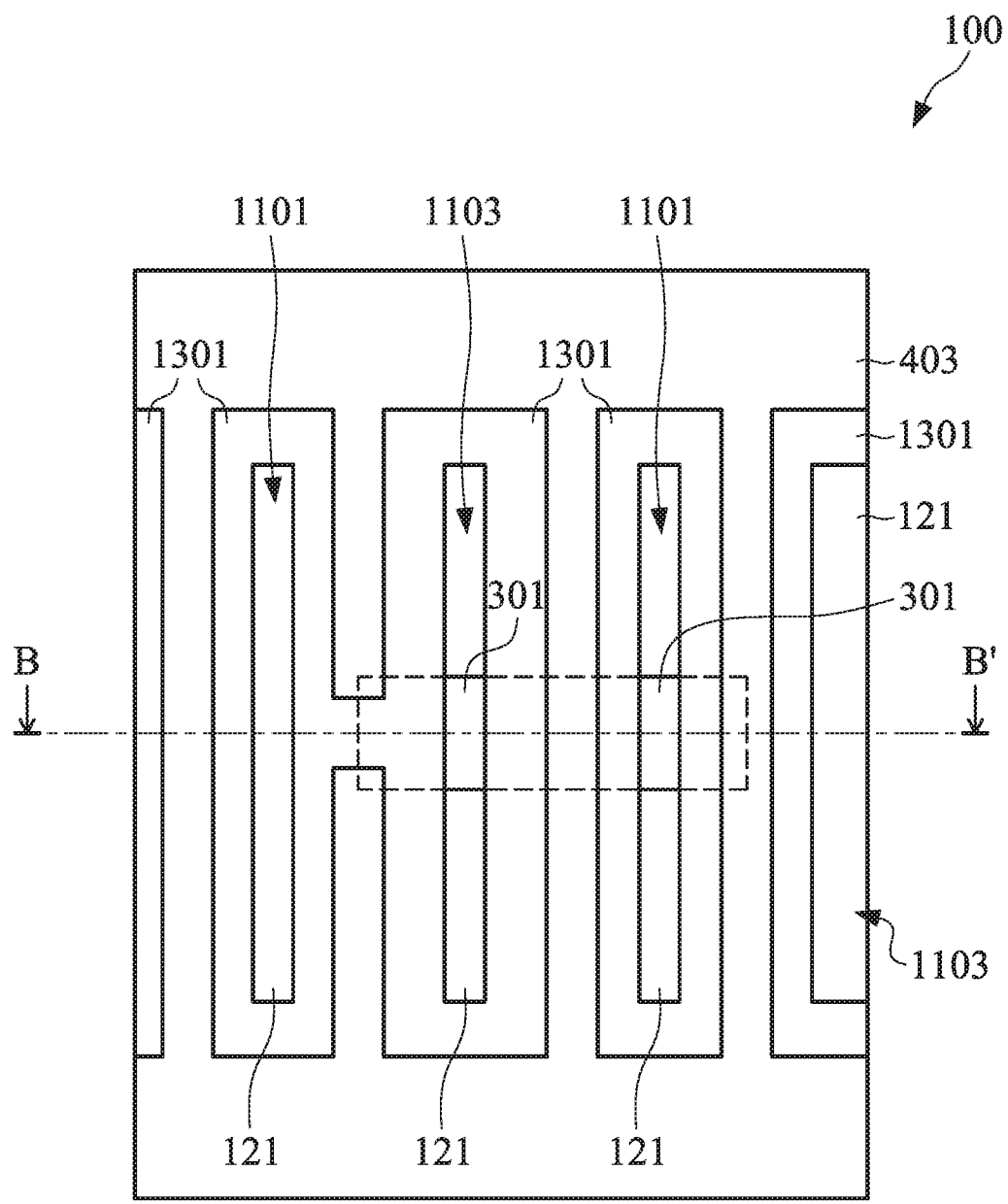
Figure 13B:
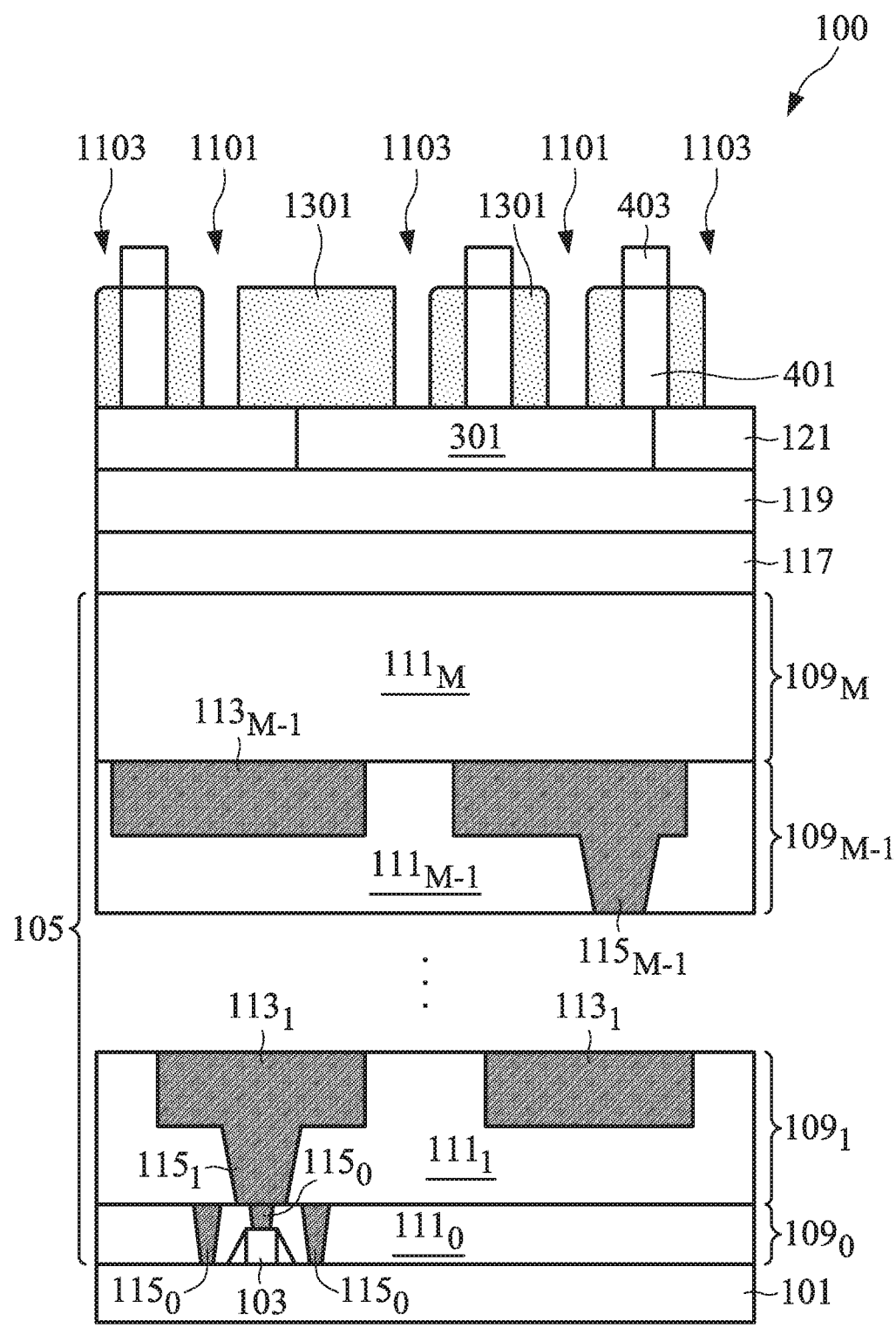

Referring to FIGS. 13A and 13B, the second spacer layer 1201 is patterned to form second spacers 1301 on sidewalls of the openings 1101 and 1103. In some embodiments, the second spacer layer 1201 may be patterned using similar methods as the first spacer layer 503 (see FIGS. 5A and 5B), described above with reference to FIGS. 6A and 6B, and the description is not repeated herein for the sake of brevity. The patterning process removes horizontal portions of the second spacer layer 1201 from an upper surface of the mandrel cap layer 403 and bottoms of the openings 1101 and 1103. Portions of the second spacer layer 1201 remaining on the sidewalls of the openings 1101 and 1103 form the second spacers 1301. Each of the openings 1101 and 1103 exposes at least a portion of the second mask layer 121, while at least one of the openings 1101 and at least one of the openings 1103 expose respective portions of the merge cut feature 301. In some embodiments, the patterning process of the second spacer layer 1201 exposes sidewalls of the mandrel cap layer 403.

Figure 14A:
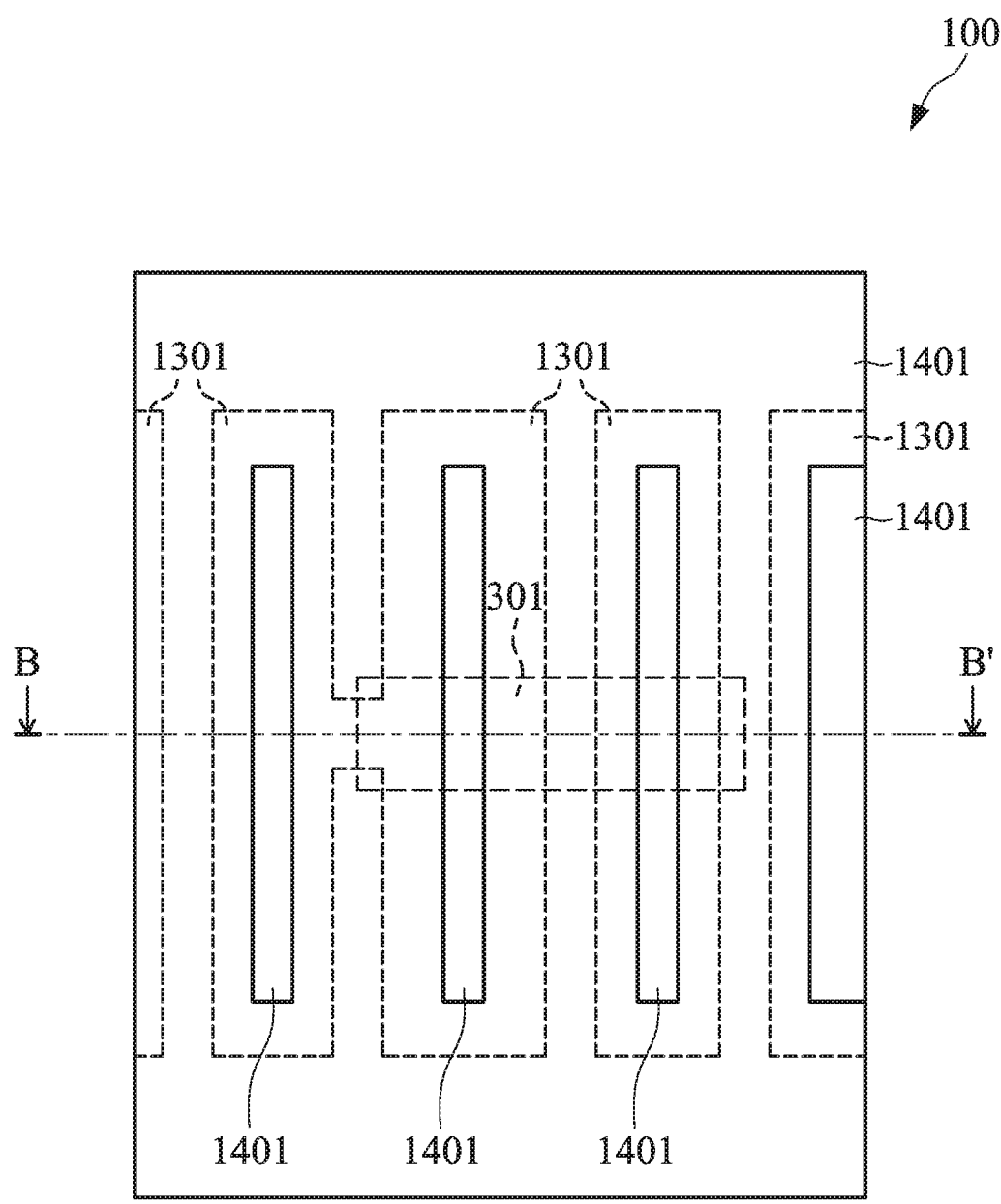
Figure 14B:
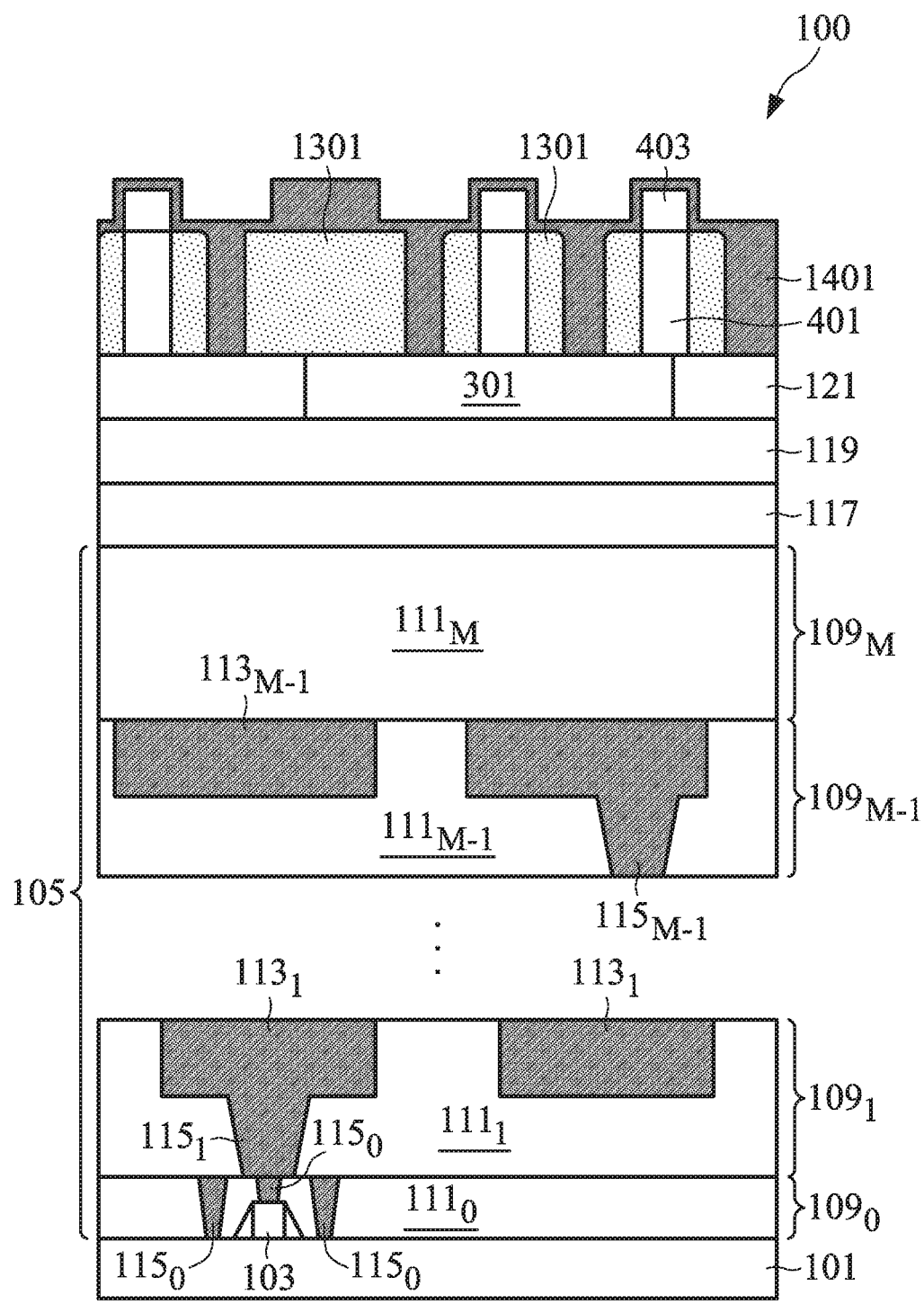

Referring to FIGS. 14A and 14B, a plug layer 1401 is formed over the mandrel cap layer 403 and fills the openings 1101 and 1103 (see FIGS. 13A and 13B). The plug layer 1401 may comprise silicon oxide, aluminum oxide, SiCOH, $SiO_xC_y$, TEOS, the like, or a combination thereof, and may be formed using spin-on coating, CVD, PECVD, ALD, the like, or a combination thereof. As described below in greater detail, the plug layer 1401 protects portions of the second mask layer 121 and portions of the merge cut feature 301 from further patterning steps.

Figure 15A:
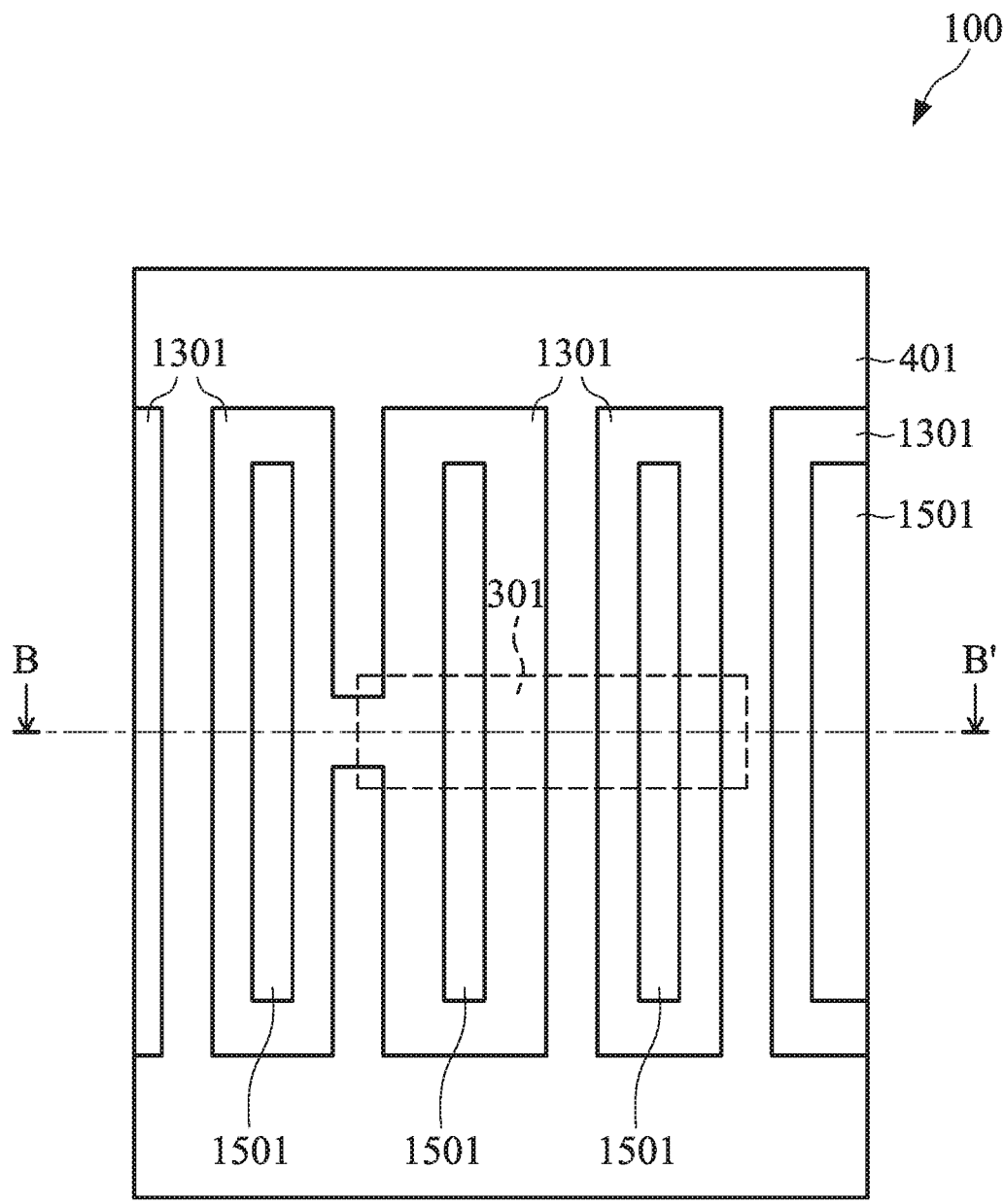
Figure 15B:
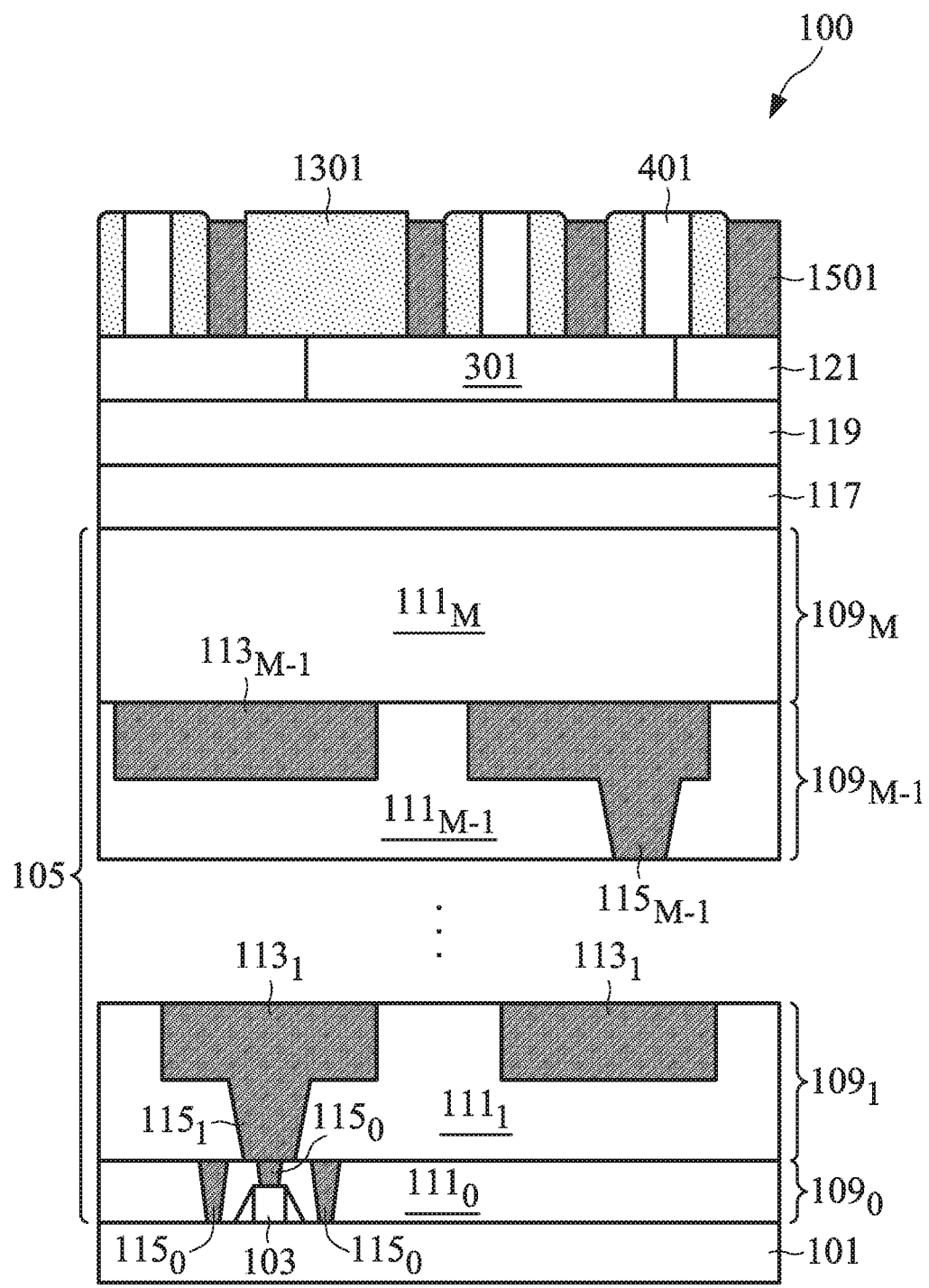

Referring to FIGS. 15A and 15B, portions of the plug layer 1401 extending above upper surfaces of the second spacers 1301 are removed to expose the upper surfaces of the second spacers 1301. Portions of the plug layer 1401 remaining in the openings 1101 and 1103 form plugs 1501. Furthermore, the mandrel cap layer 403 is removed to expose an upper surface of the first mandrel layer 401. In some embodiments, the portions of the plug layer 1401 and the mandrel cap layer 403 are removed using one or more suitable etch processes. For example, the portions of the plug layer 1401 and the mandrel cap layer 403 may be removed using one or more dry etch processes with etch process gases including $O_2$, $CO_2$, $C_xH_yF_z$, Ar, $N_2$, $H_2$, HBr, $Cl_2$, He, the like, or a combination thereof. In such embodiments, upper surfaces of the plugs 1501 are substantially level with or lower than the upper surfaces of the second spacers 1301. Alternatively, the portions of the plug layer 1401 and the mandrel cap layer 403 may be removed using a CMP process, a grinding process, the like, or a combination thereof.

Figure 16A:
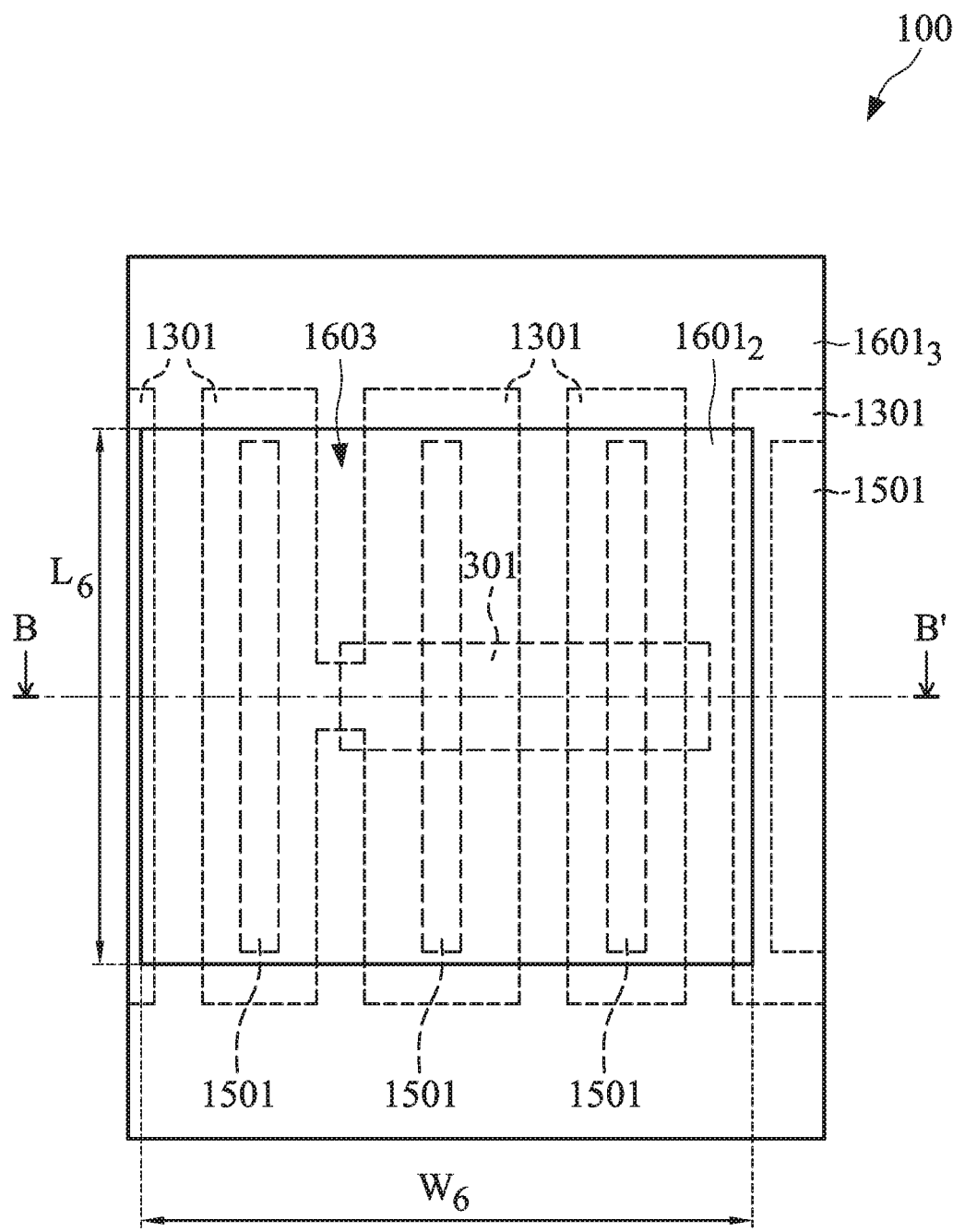
Figure 16B:
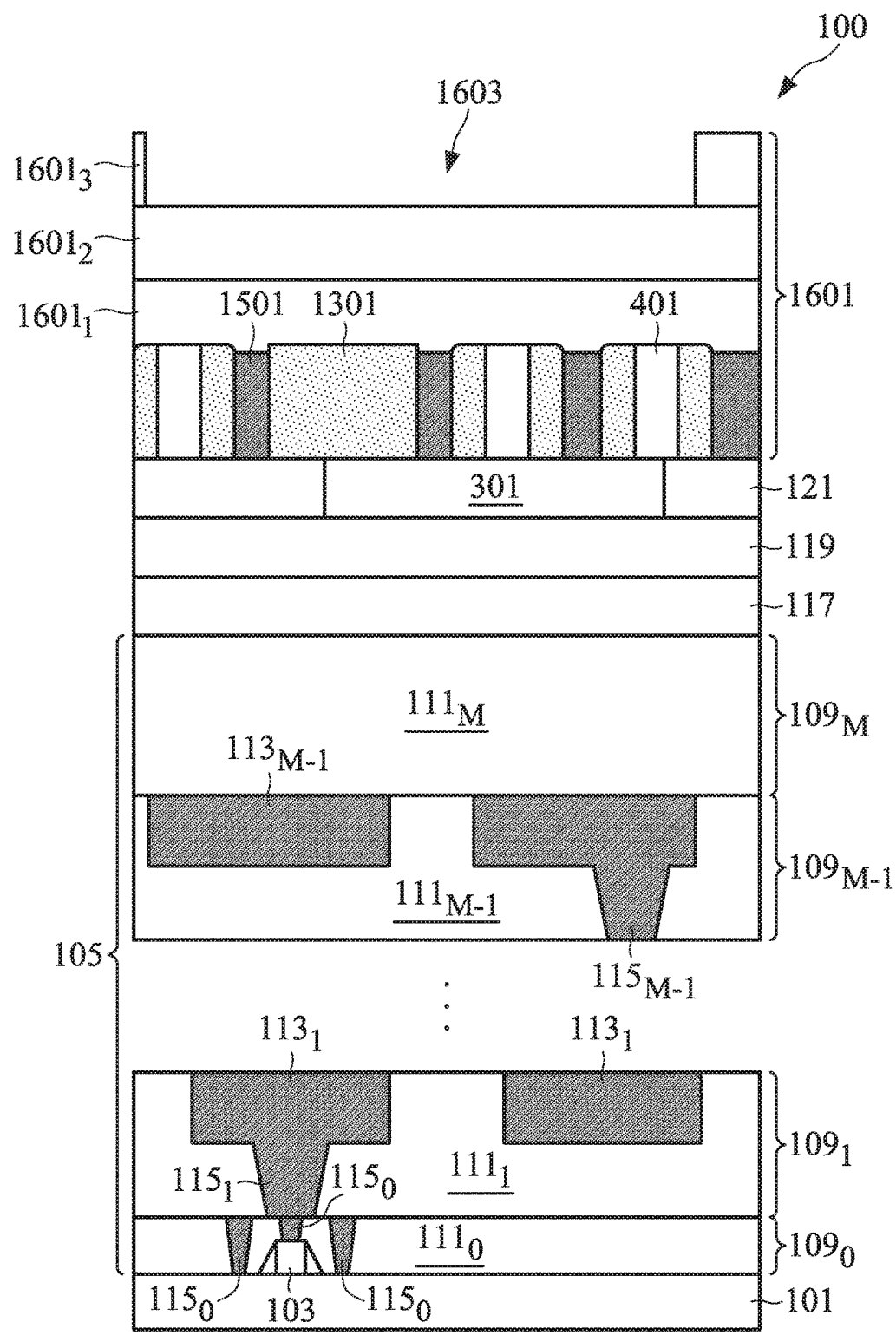

Referring to FIGS. 16A and 16B, a fifth tri-layer mask 1601 is formed over the first mandrel layer 401, the second spacers 1301 and the plugs 1501. The fifth tri-layer mask 1601 comprises a bottom layer $1601_1$, a middle layer $1601_2$ over the bottom layer $1601_1$, and a top layer $1601_3$ over the middle layer $1601_2$. In some embodiments, the bottom layer $1601_1$, the middle layer $1601_2$, and the top layer $1601_3$ of the fifth tri-layer mask 1601 may be formed using similar materials and methods as the bottom layer $201_1$, the middle layer $201_2$, and the top layer $201_3$ of the first tri-layer mask 201, respectively, described above with reference to FIGS. 2A and 2B, and the description is not repeated herein for the sake of brevity. In some embodiments, a thickness of the bottom layer $1601_1$ may be between about 500 Å and about 2000 Å, a thickness of the middle layer $1601_2$ may be between about 100 Å and about 400 Å, and a thickness of the top layer $1601_3$ may be between about 500 Å and about 1500 Å.

The top layer $1601_3$ of the fifth tri-layer mask 1601 is patterned to form an opening 1603 in the top layer $1601_3$ of the fifth tri-layer mask 1601. In some embodiments, the top layer $1601_3$ of the fifth tri-layer mask 1601 may be patterned using similar methods as the top layer $201_3$ of the first tri-layer mask 201 described above with reference to FIGS. 2A and 2B, and the description is not repeated herein for the sake of brevity. In some embodiments, a width $W_6$ of the opening 1603 is between about 30 nm and about 5000 nm, and a length $L_6$ of the opening 1603 is between about 60 nm and about 80000 nm.

Figure 17A:
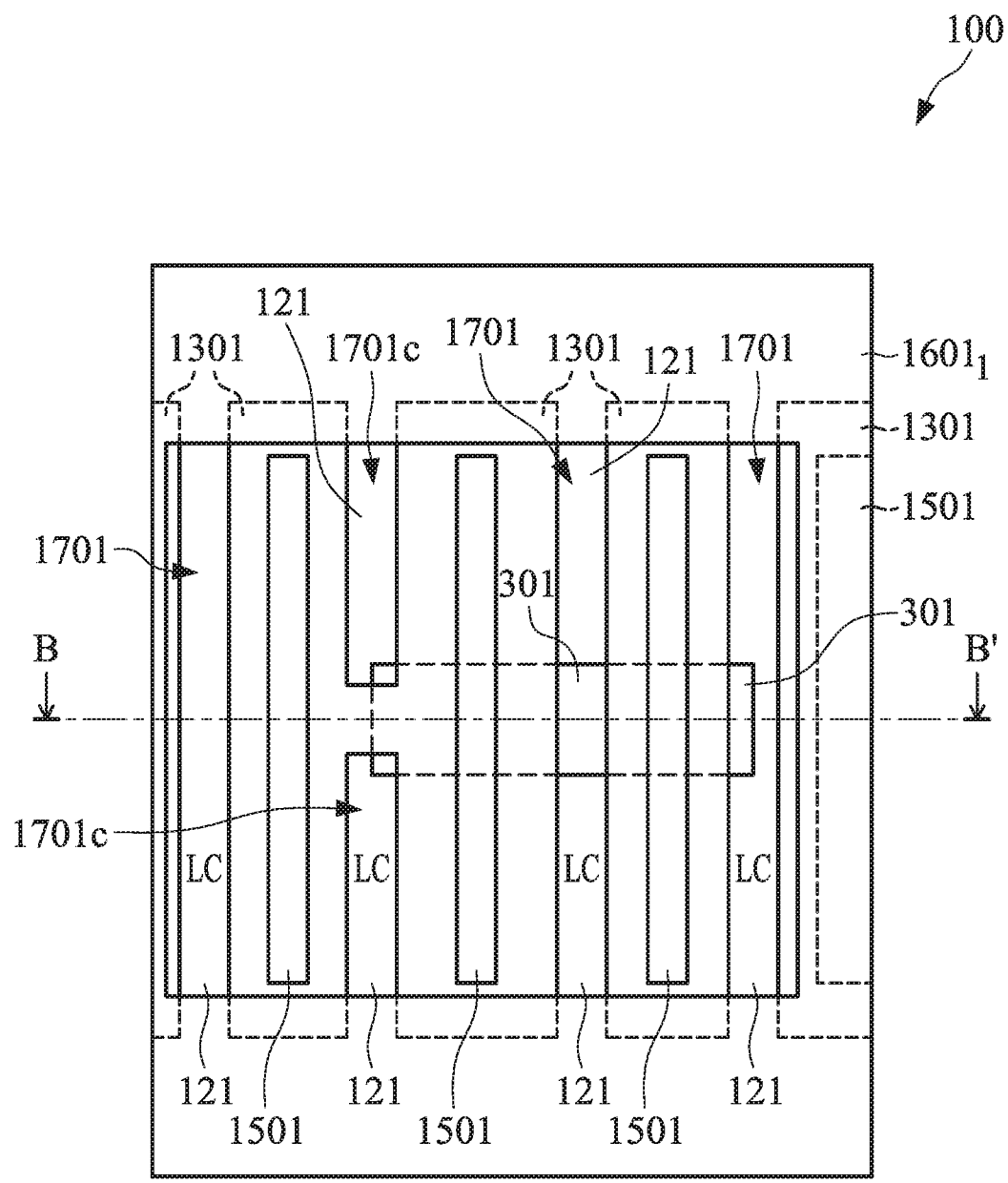
Figure 17B:
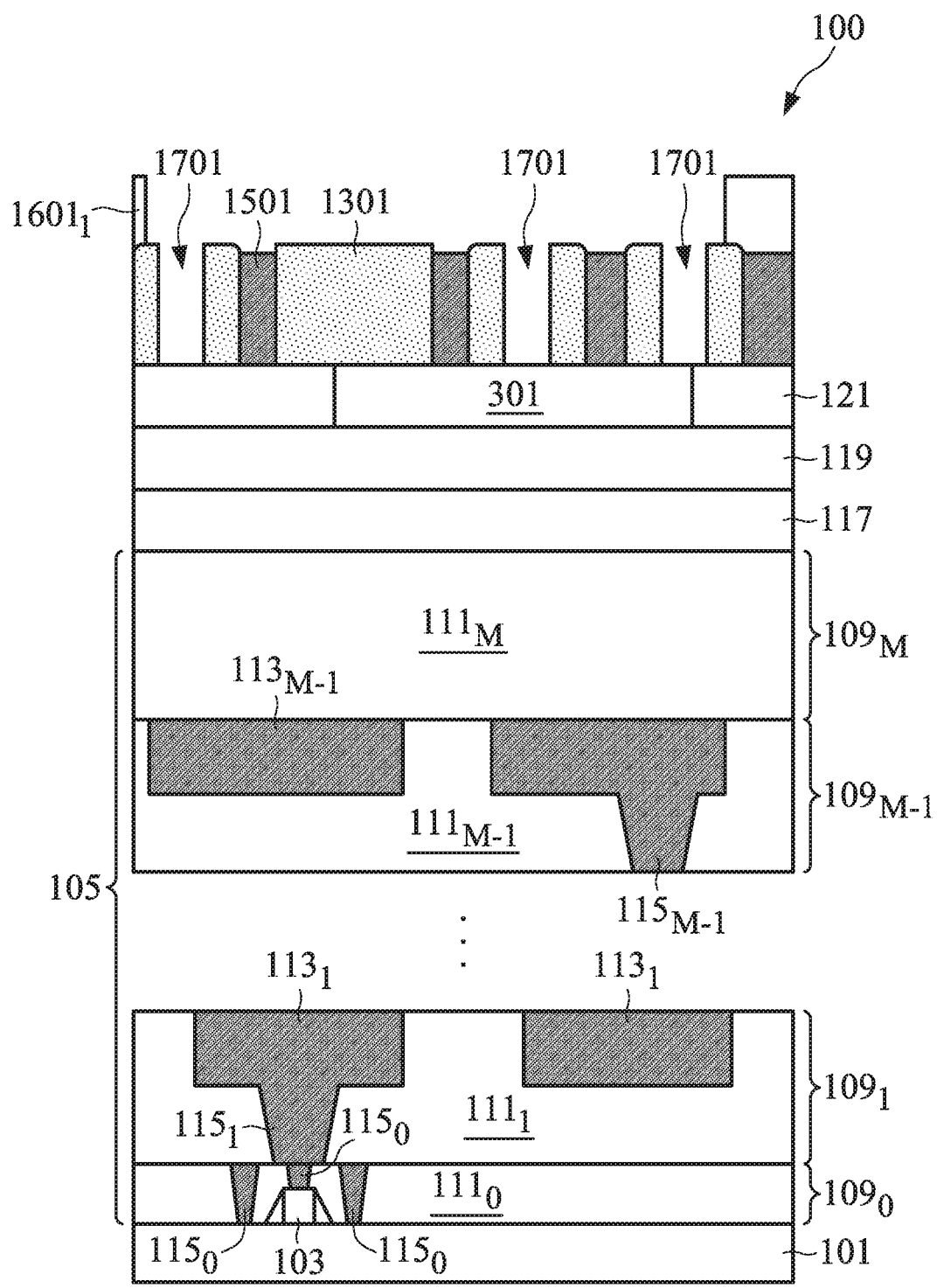

Referring to FIGS. 17A and 17B, a second patterning process is performed on the first mandrel layer 401 to selectively remove portions of the first mandrel layer 401 not protected by fifth tri-layer mask 1601 and form openings 1701 and 1701c in the first mandrel layer 401. The openings 1701 and 1701c expose portions of the second mask layer 121 and portions of the merge cut feature 301. In some embodiments, the patterning process comprises one or more etching processes, where the fifth tri-layer mask 1601 is used as an etch mask. The one or more etching processes may include wet etching processes, dry etching processes, or combinations thereof. For example, the first mandrel layer 401 may be patterned using a dry etch processes with etch process gases including $O_2$, $CO_2$, $C_xH_yF_z$, Ar, $N_2$, $H_2$, HBr, $Cl_2$, He, the like, or a combination thereof. Accordingly, a length of the openings 1701 approximately equals to the length $L_6$ of the opening 1603 (see FIGS. 16A and 16B), and a width of the openings 1701 and 1701c approximately equals to the thickness $T_1$ of the first spacer layer 503 (see FIGS. 5A and 5B). In an embodiment, the second patterning process may also remove top portions of the plugs 1501. During the second patterning process, the top layer $1601_3$ and the middle layer $1601_2$ of the fifth tri-layer mask 1601 may be consumed, such that the bottom layer $1601_1$ of the fifth tri-layer mask 1601 remains over the first mandrel layer 401, the second spacers 1301 and the plugs 1501 after the second patterning processes. If any residue of the top layer $1601_3$ and the middle layer $1601_2$ of the fifth tri-layer mask 1601 is left over the bottom layer $1601_1$ of the fifth tri-layer mask 1601, the residue may also be removed. A pattern of the openings 1701 may also be referred to as a line-C (LC) pattern. A pattern of the openings 1701c may also be referred to as the LC pattern with a cut. Accordingly, the photolithography process described with reference to FIGS. 16A and 16B may also be referred to as LC photolithography, and the etch processes described with reference to FIGS. 17A and 17B may also be referred to as LC etch.

Figure 18A:
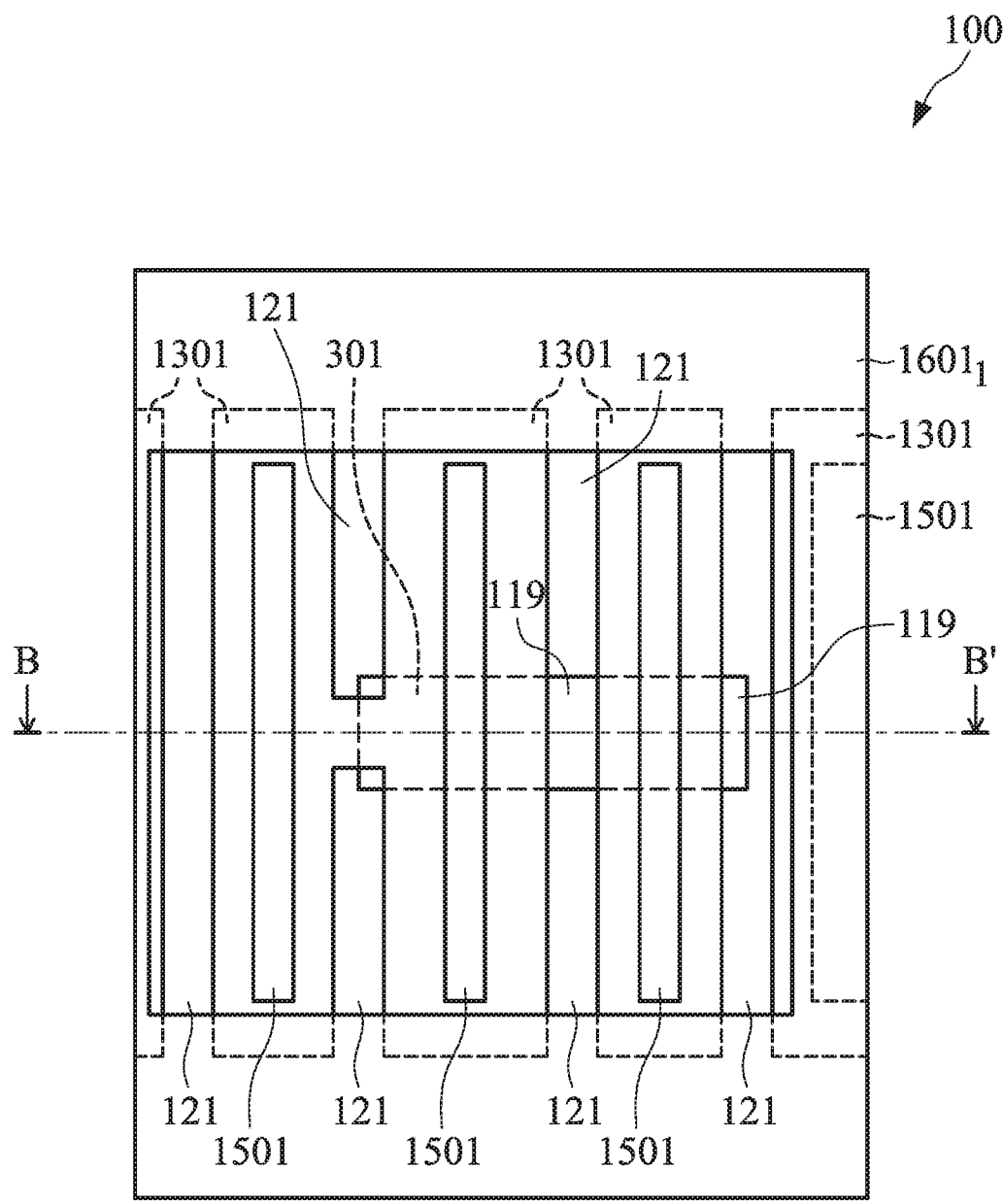
Figure 18B:
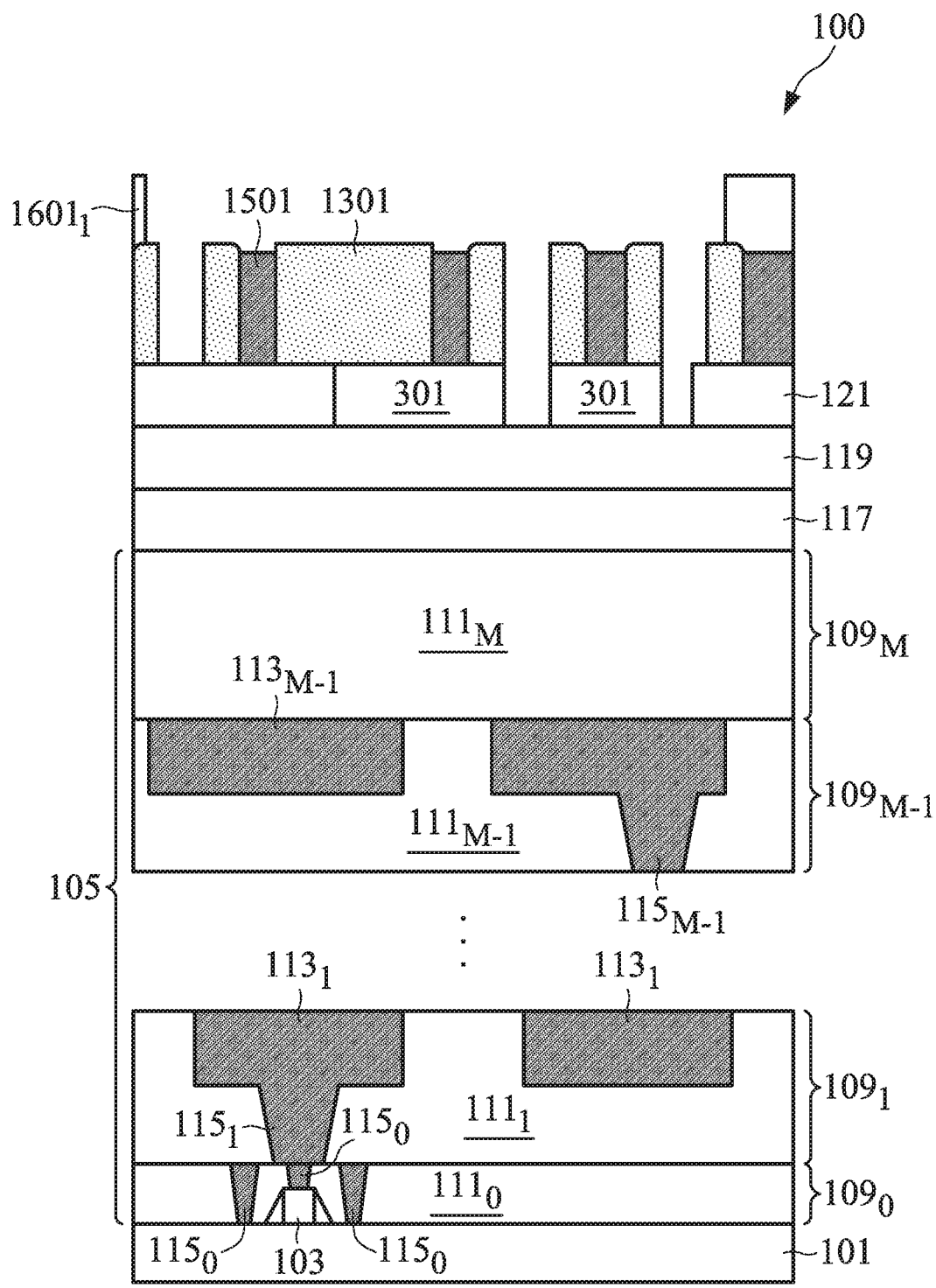

Referring to FIGS. 18A and 18B, a patterning process is performed on the merge cut feature 301 to selectively remove exposed portions of the merge cut feature 301. The patterning process exposes portions of the first mask layer 119. In some embodiments, the patterning process comprises one or more etching processes, where the bottom layer $1601_1$ of the fifth tri-layer mask 1601, the plugs 1501 and the second spacers 1301 are used as a combined etch mask. In some embodiments, the exposed portions of the merge cut feature 301 are removed using, for example, a dry etch processes with etch process gases including $O_2$, $CO_2$, $C_xH_yF_z$, Ar, $N_2$, $H_2$, HBr, $Cl_2$, He, the like, or a combination thereof, or any other suitable etchant that can remove the exposed portions of the merge cut feature 301 without damaging the second mask layer 121.

Figure 19A:
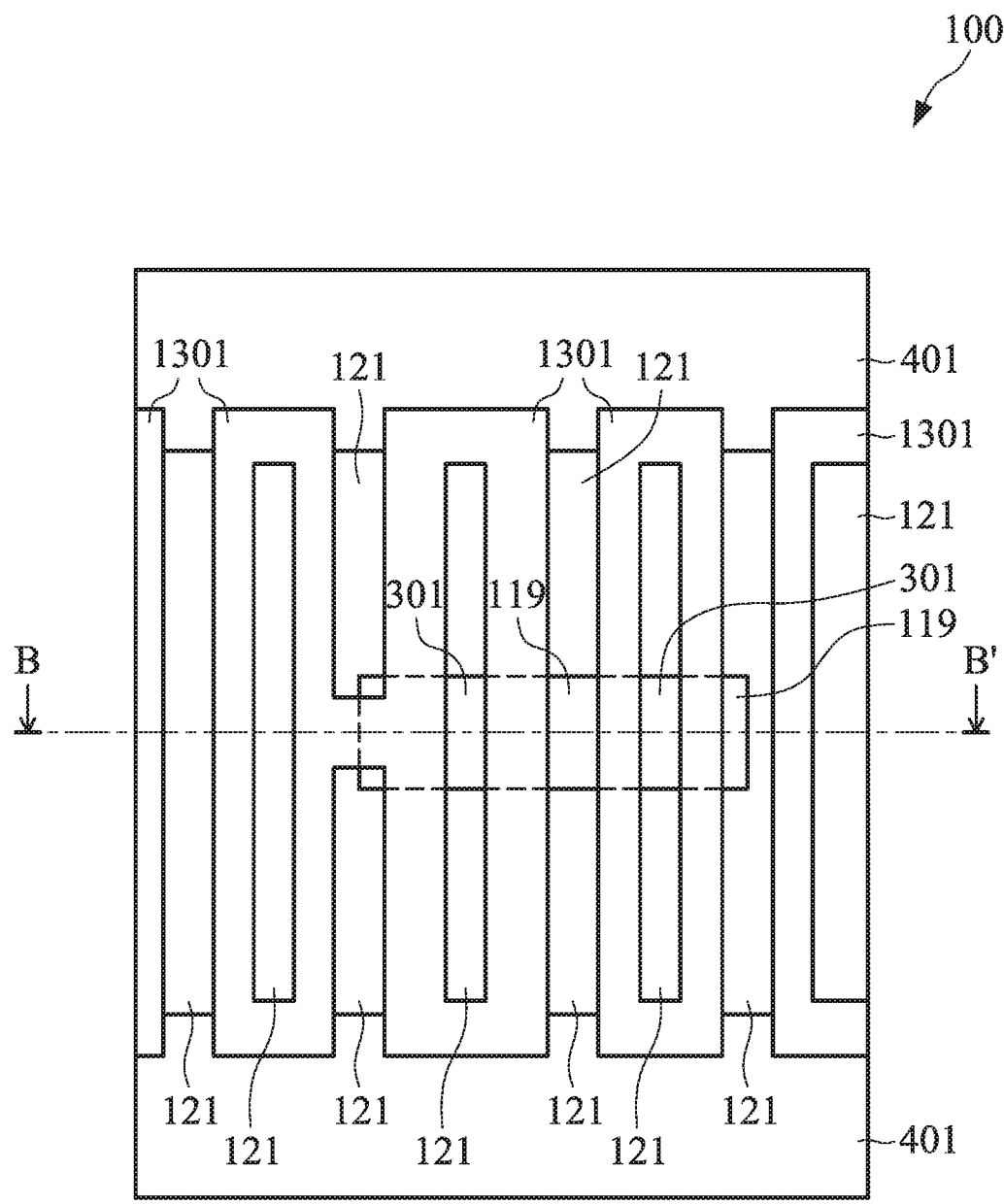
Figure 19B:
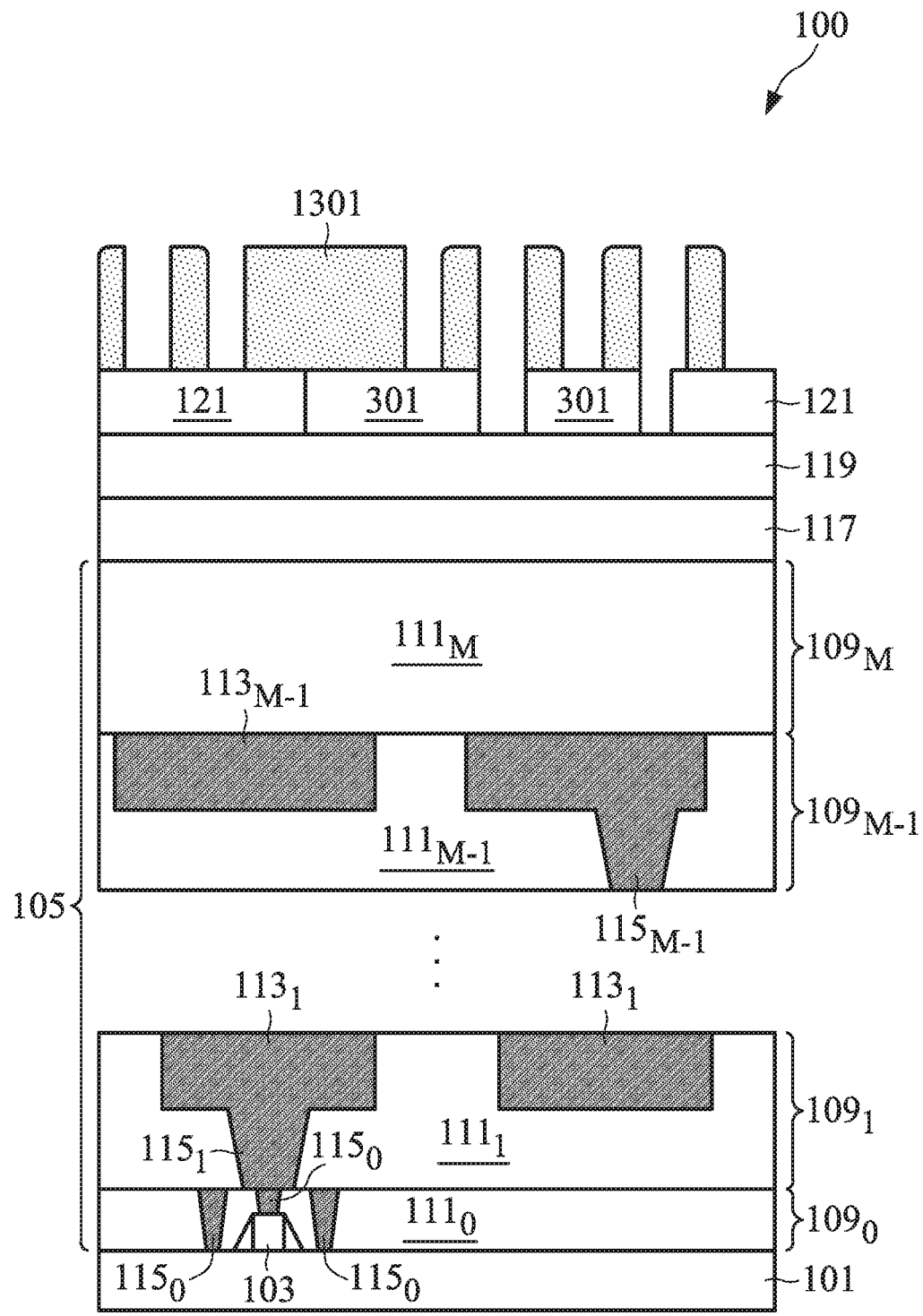

Referring to FIGS. 19A and 19B, the bottom layer $1601_1$ of the fifth tri-layer mask 1601 is removed over the first mandrel layer 401, the second spacers 1301 and the plugs 1501. In some embodiments, the bottom layer $1601_1$ of the fifth tri-layer mask 1601 is removed using an ashing process followed by a wet clean process. In other embodiments, other suitable process such as, for example, an etch process may be used to remove the bottom layer $1601_1$ of the fifth tri-layer mask 1601. Subsequently, the plugs 1501 are selectively removed to expose portions of the second mask layer 121 and portions of the merge cut feature 301. In some embodiments, the plugs 1501 are removed using, for example, a dry etch processes with etch process gases including $O_2$, $CO_2$, $C_xH_yF_z$, Ar, $N_2$, $H_2$, HBr, $Cl_2$, He, the like, or a combination thereof, or any other suitable etchant that can remove the plugs 1501 without damaging the second spacers 1301, the second mask layer 121, and the merge cut feature 301.

Figure 20A:
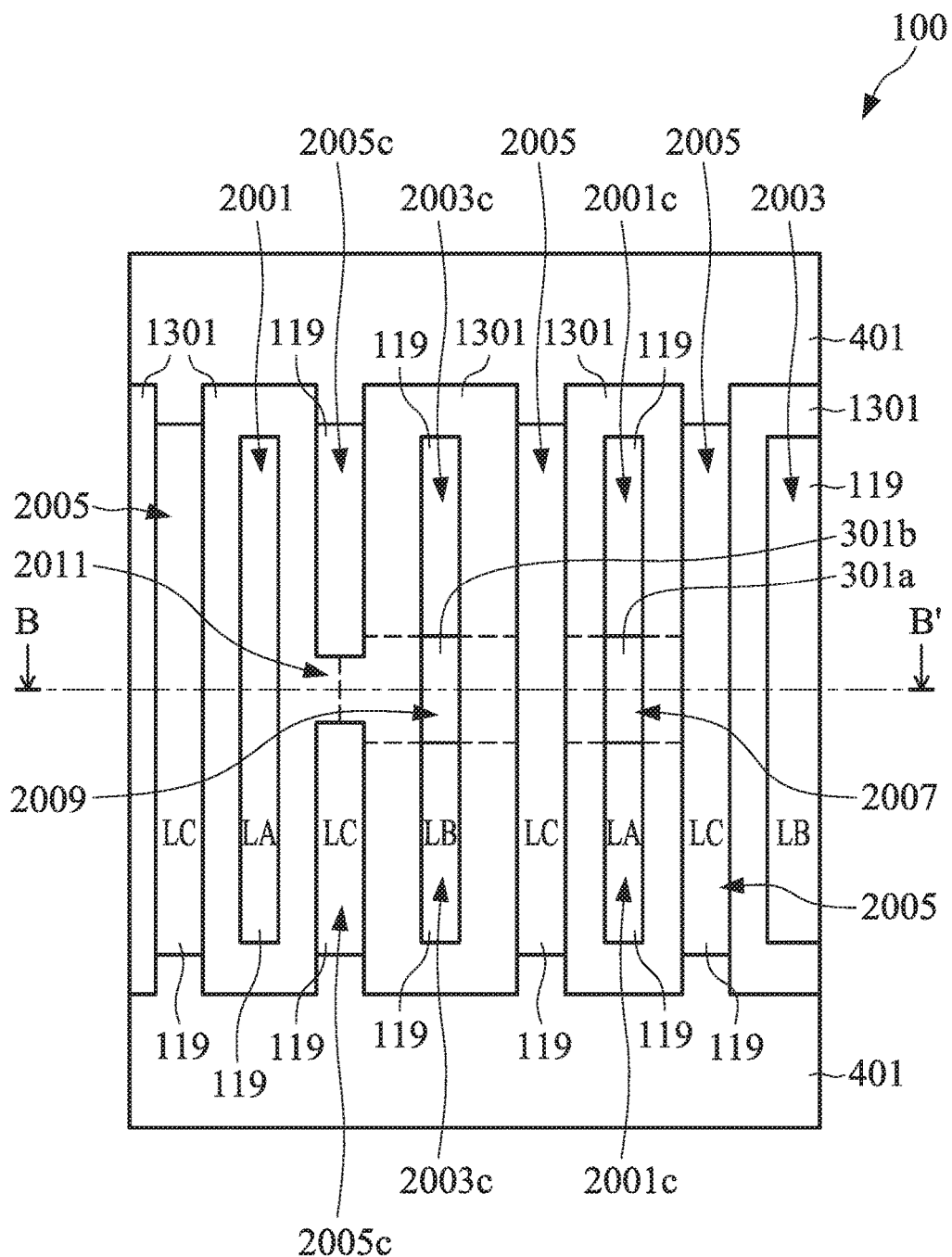
Figure 20B:
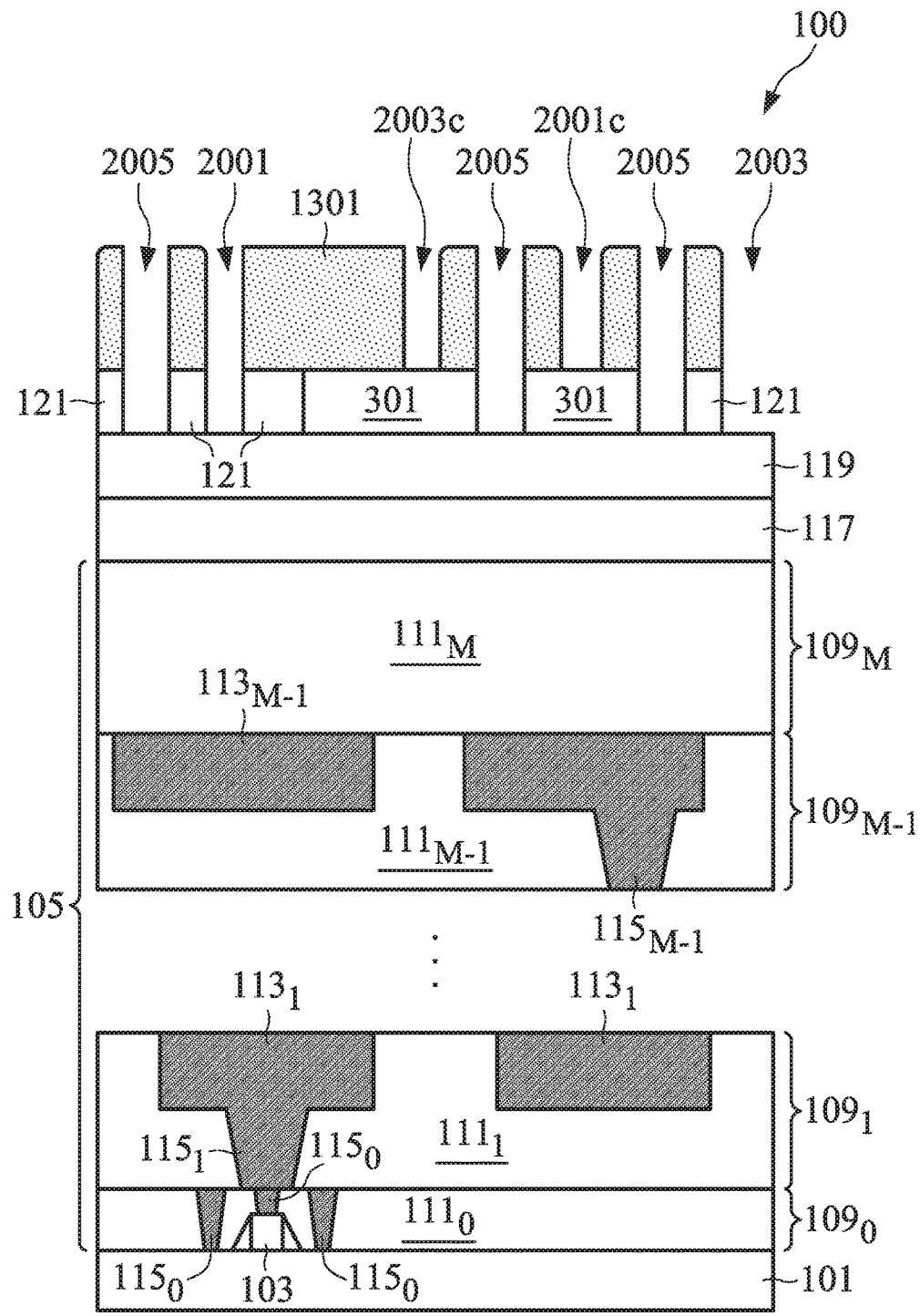

Referring to FIGS. 20A and 20B, a patterning process is performed on the second mask layer 121 to selectively remove portions of the second mask layer 121 that are not protected by the first mandrel layer 401 and the second spacers 1301. In some embodiments, the patterning process comprises one or more etch processes, where the first mandrel layer 401 and the second spacers 1301 are used as a combined etch mask. In some embodiments, the portions of the second mask layer 121 are removed using, for example, a dry etch processes with etch process gases including $O_2$, $CO_2$, $C_xH_yF_z$, Ar, $N_2$, $H_2$, HBr, $Cl_2$, He, the like, or a combination thereof, or any other suitable etchant that can remove the portions of the second mask layer 121 without damaging the second spacers 1301 and the merge cut feature 301.

Referring further to FIGS. 20A and 20B, after patterning the second mask layer 121 and the merge cut feature 301, openings 2001, 2001c, 2003, 2003c, 2005 and 2005c are formed in a combined layer comprising the second mask layer 121 and the merge cut feature 301. Each of the openings 2001 correspond to a respective opening 501 (see FIGS. 5A and 5B) and has the LA pattern. The openings 2001c correspond to a same respective opening 501, a pattern of which was cut by not removing a portion 301a of the merge cut feature 301. The openings 2001c have the LA pattern with a cut. Accordingly, a width of a gap 2007 separating adjacent openings 2001c approximately equals to the width $W_1$ of the merge cut feature 301. Furthermore, a width of the openings 2001 and 2001c approximately equals to $W_2-2T_1-2T_2$, where $W_2$ is the width of the openings 501 or openings 409, $T_1$ is the thickness of the first spacer layer 503 (see FIGS. 5A and 5B), and $T_2$ is the thickness of the second spacer layer 1201 (see FIGS. 12A and 12B). Each of the openings 2003 correspond to a respective opening 801 (see FIGS. 8A and 8B) and has the LB pattern. The openings 2003c correspond to a same respective opening 801, a pattern of which has been cut by not removing a portion 301b of the merge cut feature 301. The openings 2003c have LB pattern with a cut. Accordingly, a width of a gap 2009 separating adjacent openings 2003c approximately equals to the width $W_1$ of the merge cut feature 301. Furthermore, a width of the openings 2003 and 2003c approximately equals to $D_1-2T_1-2T_2$, where $D_1$ is the distance between adjacent openings 501, $T_1$ is the thickness of the first spacer layer 503 (see FIGS. 5A and 5B), and $T_2$ is the thickness of the second spacer layer 1201 (see FIGS. 12A and 12B). Each of the openings 2005 correspond to a respective opening 1701 (see FIGS. 17A and 17B) and has the LC pattern. Each of the openings 2005c corresponds to a respective opening 1701c. Accordingly, the openings 2005c have the LC pattern with a cut. A width of a gap 2011 separating adjacent openings 2005c approximately equals to the width $W_5$ of the gap 1001 (see FIGS. 10A and 10B). Furthermore, a width of the openings 2005 and 2005c approximately equals to the thickness $T_1$ of the first spacer layer 503 (see FIGS. 5A and 5B), and a distance between adjacent ones of the openings 2001, 2001c, 2003, 2003c, 2005 and 2005c is equal to the thickness $T_2$ of the second spacer layer 1201.

In some embodiments, the width $W_2$ of the openings 501, the distance $D_1$ between the adjacent openings 501, the thickness $T_1$ of the first spacer layer 503, and the thickness $T_2$ of the second spacer layer 1201 may be chosen such that the openings 2001, 2001c, 2003, 2003c, 2005 and 2005c are formed to have desired widths and pitch. For example, in some embodiments where each of the openings 2001, 2001c, 2003, 2003c, 2005 and 2005c has a width X and the openings 2001, 2001c, 2003, 2003c, 2005 and 2005c have a uniform pitch 2X, the width $W_2$ is chosen to be about 5X, the distance $D_1$ is chosen to be about 3X, and the thicknesses $T_1$ and $T_2$ are chosen to be about X. In some embodiments, X may be between about 100 Å and about 200 Å.

Figure 21A:
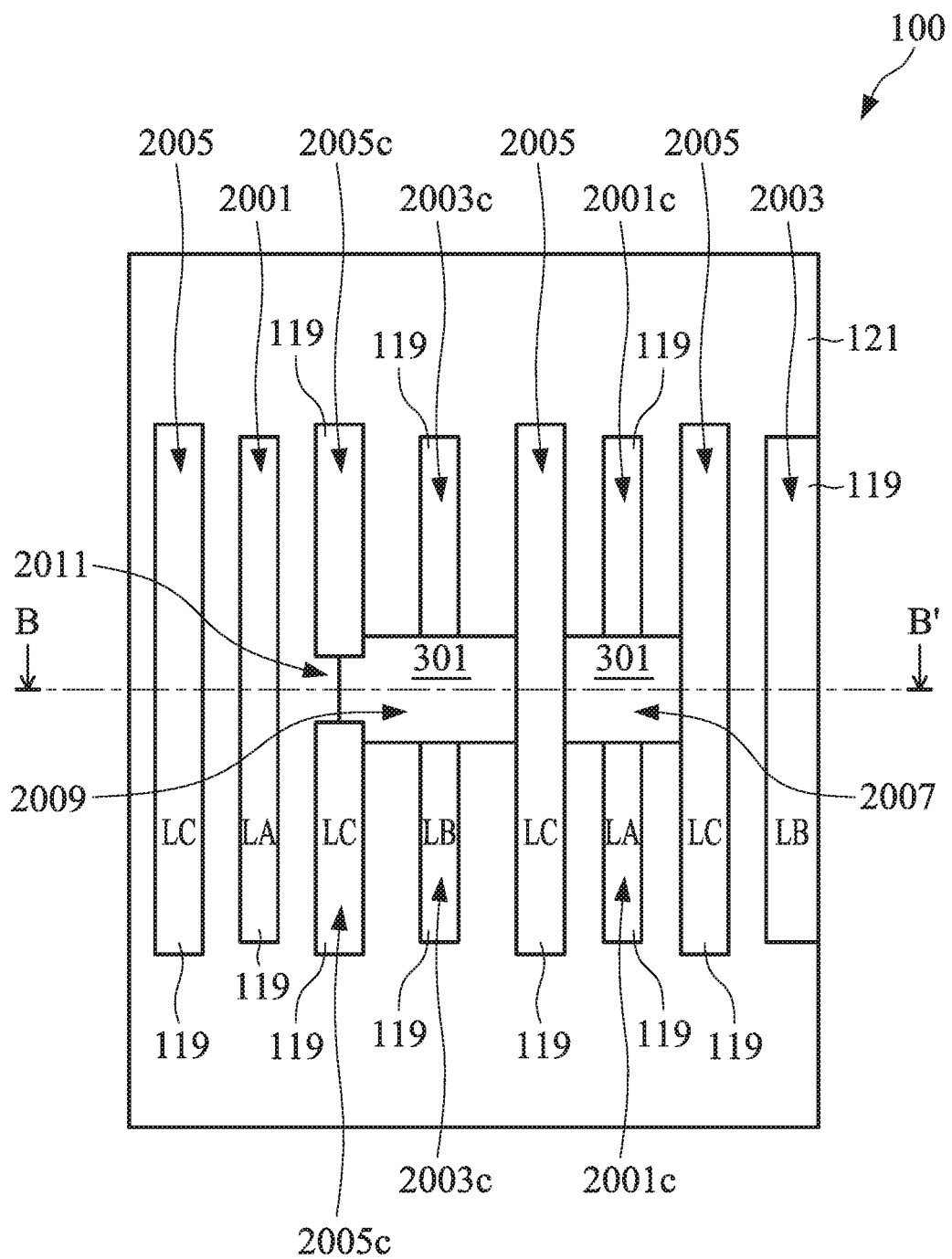
Figure 21B:
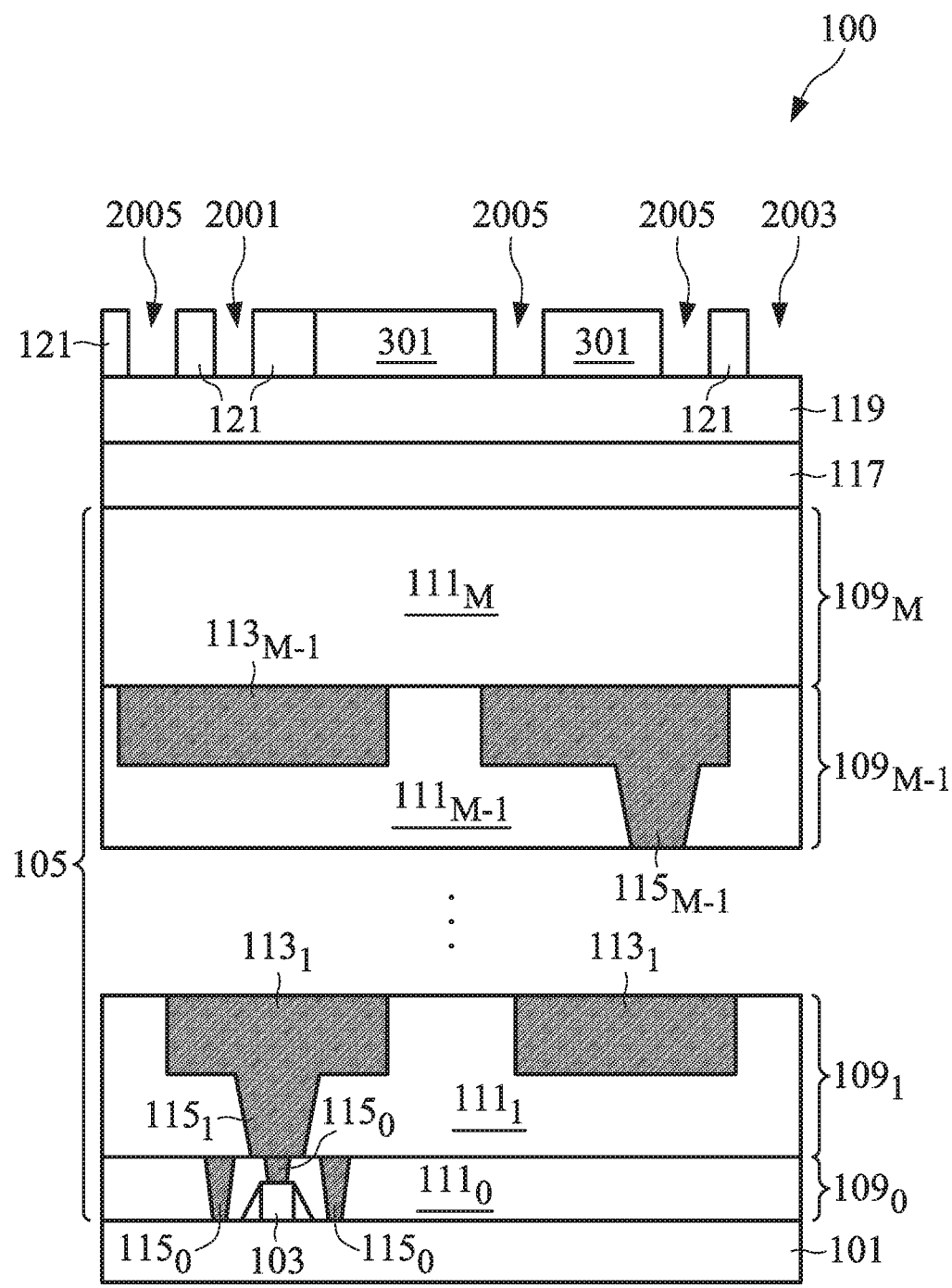

Referring to FIGS. 21A and 21B, the first mandrel layer 401 and the second spacers 1301 are removed over the second mask layer 121 and the merge cut feature 301. The first mandrel layer 401 and the second spacers 1301 may be selectively removed using, for example, one or more suitable etch processes. In some embodiments, the first mandrel layer 401 may be removed using, for example, a dry etch processes with etch process gases including $O_2$, $CO_2$, $C_xH_yF_z$, Ar, $N_2$, $H_2$, the like, or a combination thereof. The second spacers 1301 may be removed using, for example, a dry etch processes with etch process gases including $Cl_2$, $O_2$, $C_xH_yF_z$, $N_2$, $H_2$, the like, or a combination thereof.

Figure 22A:
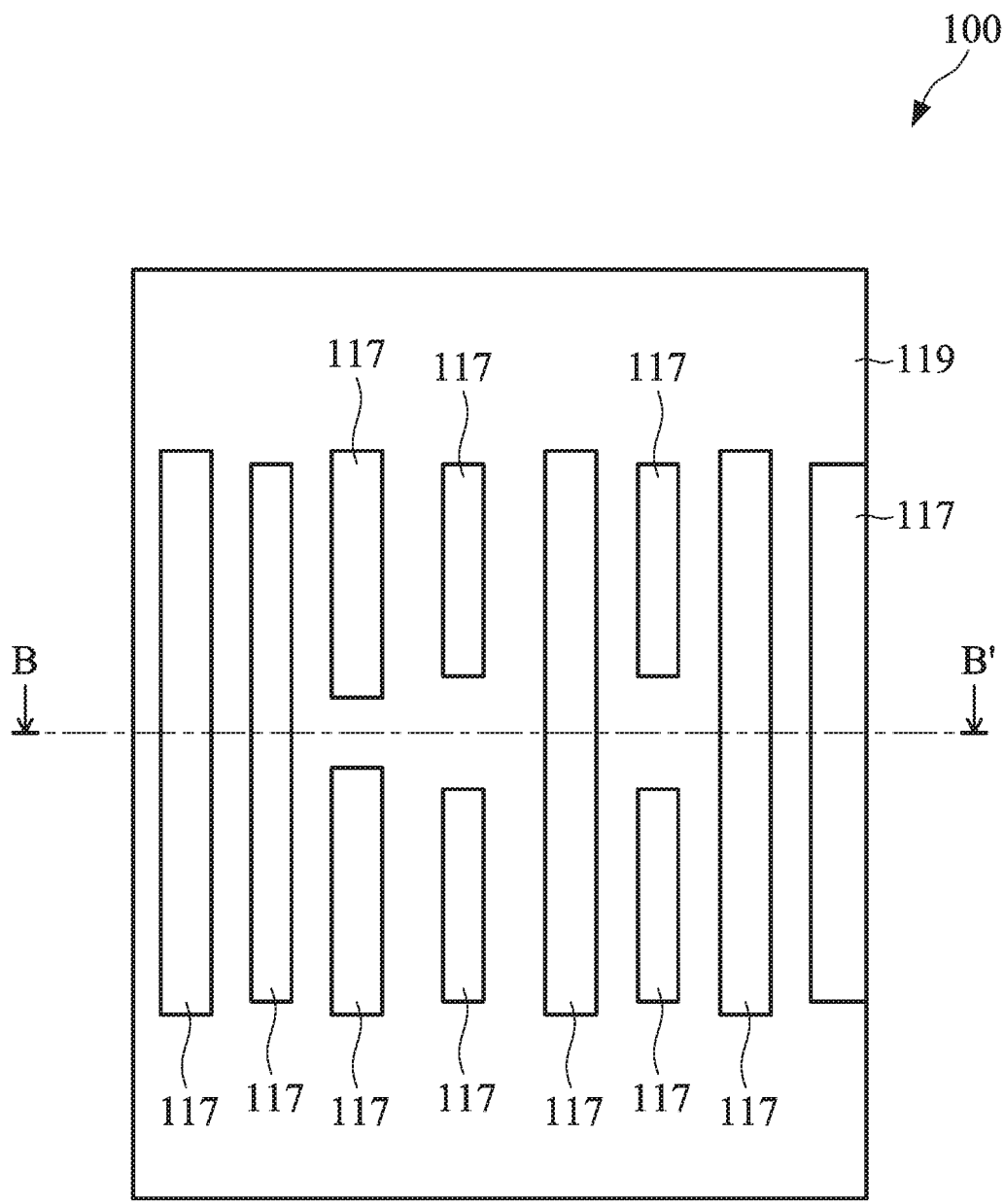
Figure 22B:
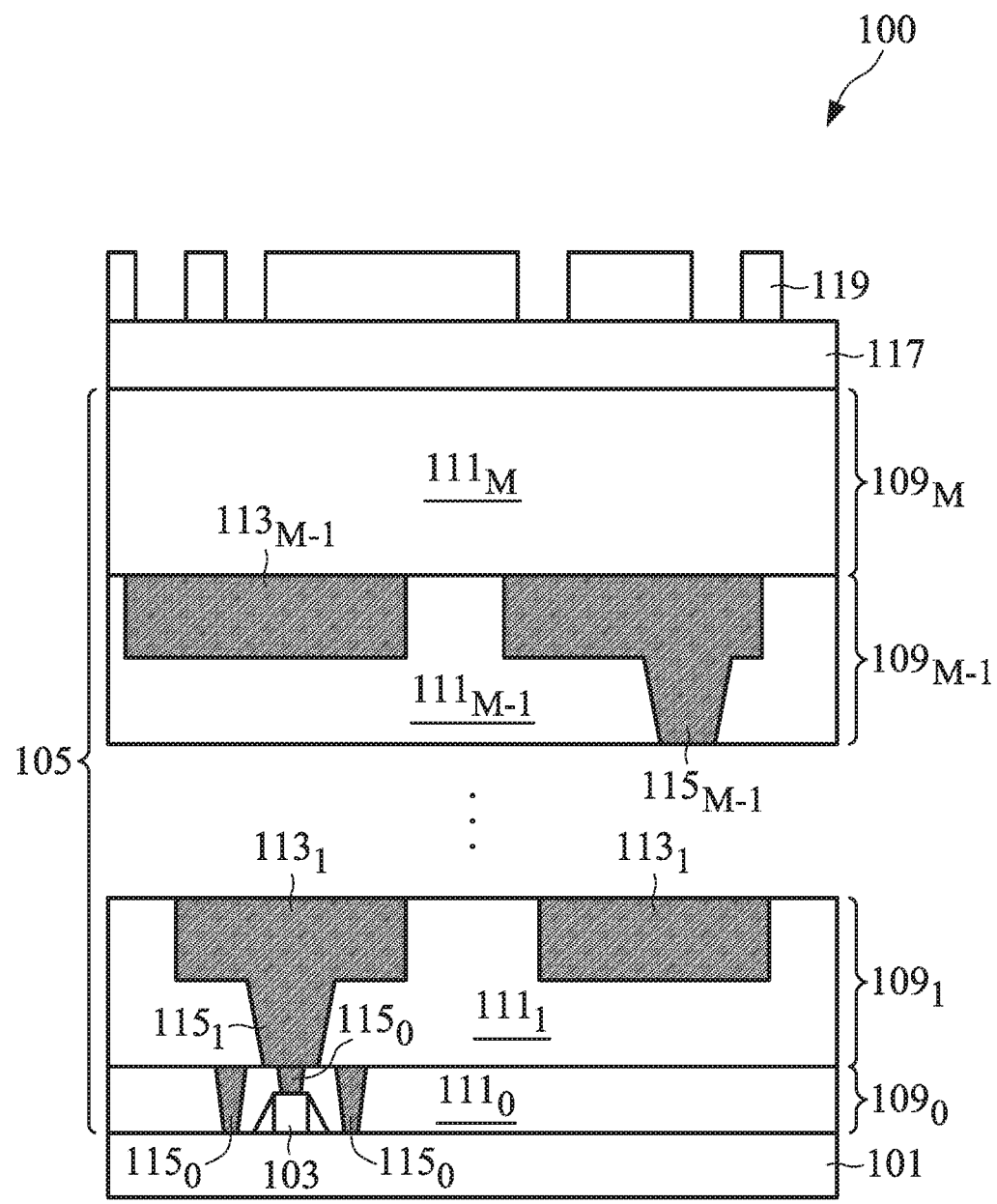

Referring to FIGS. 22A and 22B, a patterning process is performed on the first mask layer 119 to transfer the openings 2001, 2001c, 2003, 2003c, 2005 and 2005c (see FIGS. 21A and 21B) to the first mask layer 119. The patterning process forms openings in the first mask layer 119 that correspond to respective openings 2001, 2001c, 2003, 2003c, 2005 and 2005c. The openings in the first mask layer 119 expose the ARC 117. In some embodiments, the patterning process comprises a suitable etch process, where the second mask layer 121 and the merge cut feature 301 are used as a combined etch mask. A suitable etch processes may include an anisotropic wet etching process, an anisotropic dry etching process, or combinations thereof. In some embodiment, the first mask layer 119 is patterned using, for example, a dry etch processes with etch process gases including $Cl_2$, $O_2$, $C_xH_yF_z$, $N_2$, $H_2$, the like, or a combination thereof. Subsequently, the second mask layer 121 and the merge cut feature 301 are removed using, for example, a suitable etch process. In some embodiments, the second mask layer 121 and the merge cut feature 301 are removed using, for example, a dry etch processes with etch process gases including $O_2$, $CO_2$, $C_xH_yF_z$, Ar, $N_2$, $H_2$, the like, or a combination thereof.

Figure 23A:
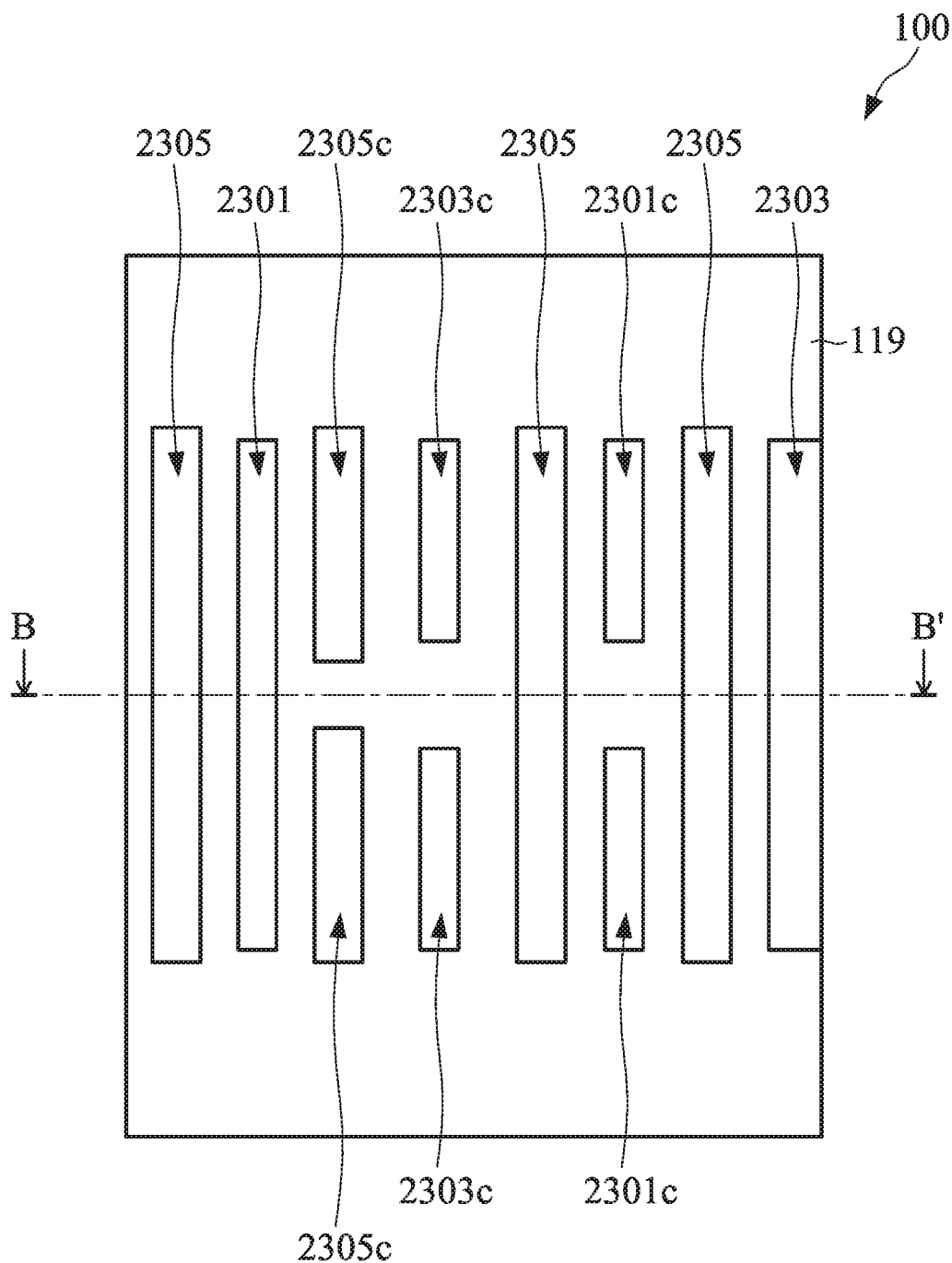
Figure 23B:
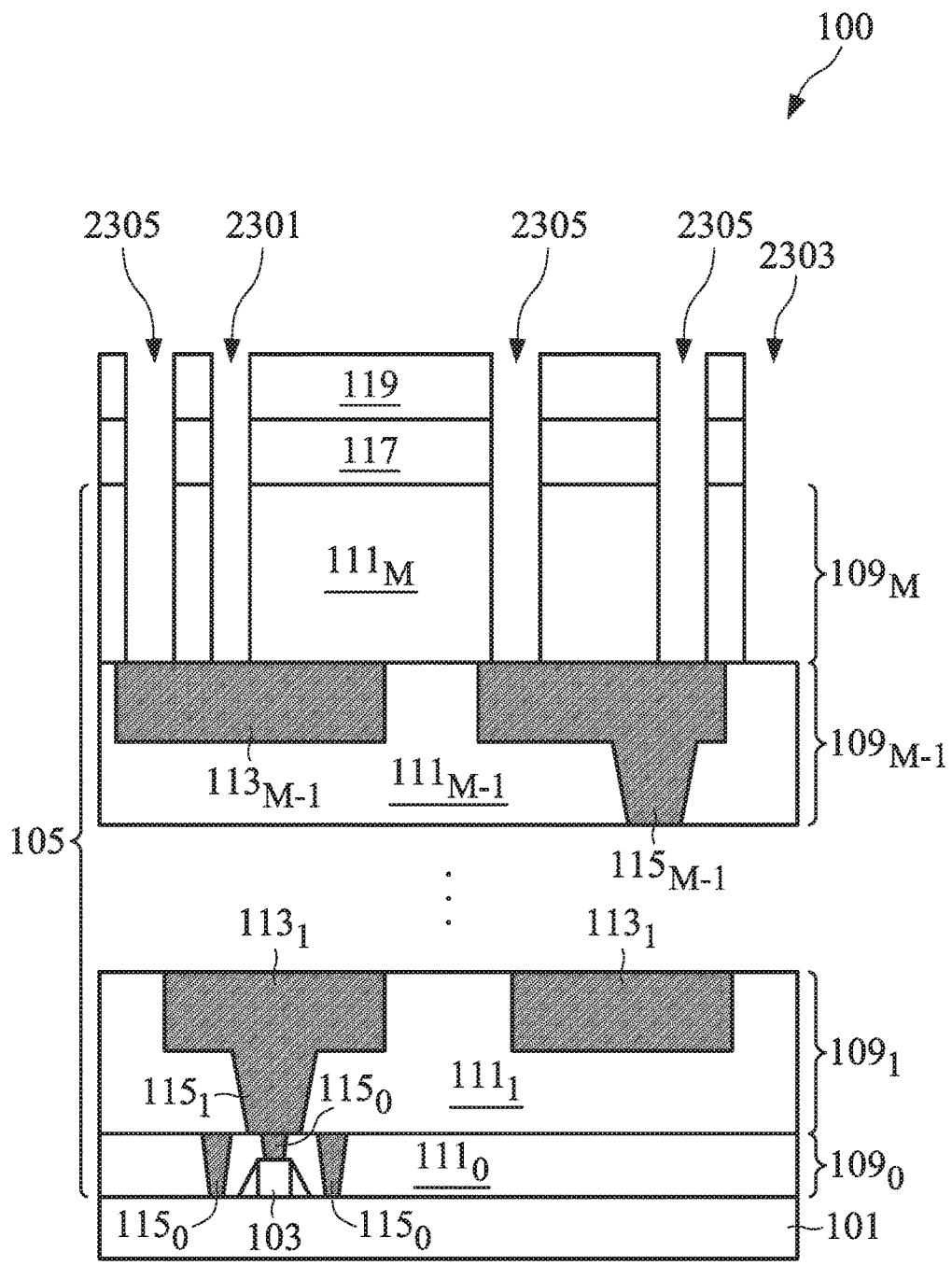

Referring to FIGS. 23A and 23B, a patterning process is performed on the ARC 117 and the dielectric layer $111_M$ to transfer the pattern of the first mask layer 119 to the ARC 117 and the dielectric layer $111_M$. The patterning process forms openings 2301, 2301c, 2303, 2303c, 2305 and 2305c in the ARC 117 and the dielectric layer $111_M$. The openings 2301, 2301c, 2303, 2303c, 2305 and 2305c correspond to the openings 2001, 2001c, 2003, 2003c, 2005 and 2005c, respectively (see FIGS. 21A and 21B). The openings 2301, 2301c, 2303, 2303c, 2305 and 2305c expose portions of the conductive lines $113_{M-1}$. In some embodiments, the patterning process comprises one or more suitable etch processes, where the first mask layer 119 is used as an etch mask. The one or more suitable etch processes may include anisotropic wet etching processes, anisotropic dry etching processes, or combinations thereof. The ARC 117 may be patterned by an etch process including etchants such as $C_4F_8$, $N_2$, $O_2$, Ar, the like, or a combination thereof.

The materials for the various layers described above may be selected to ensure sufficient etch selectivity between the layers. In an exemplary embodiment, the first mask layer 119 comprises titanium nitride, the second mask layer 121 comprises TEOS, the first mandrel layer 401 and the second mandrel layer 405 comprise amorphous silicon, the mandrel cap layer 403 comprises TEOS, and the first spacers 601 and the second spacers 1301 comprise titanium oxide, the merge cut feature 301 comprises $Si_xN_y$, and the plugs 1501 comprise $SiO_xC_yH_z$. In another exemplary embodiment, the first mask layer 119 comprises titanium oxide, the second mask layer 121 comprises $SiO_xC_y$, the first mandrel layer 401 and the second mandrel layer 405 comprise $AlO_xN_y$, the mandrel cap layer 403 comprises $SiO_xC_y$, and the first spacers 601 and the second spacers 1301 comprise titanium nitride, the merge cut feature 301 comprises a glass, and the plugs 1501 comprise $SiO_xC_yH_z$. These embodiments are only examples of possible combinations of the materials that may be used and the present disclosure is not intended to be limited to these particular embodiments.

Figure 24A:
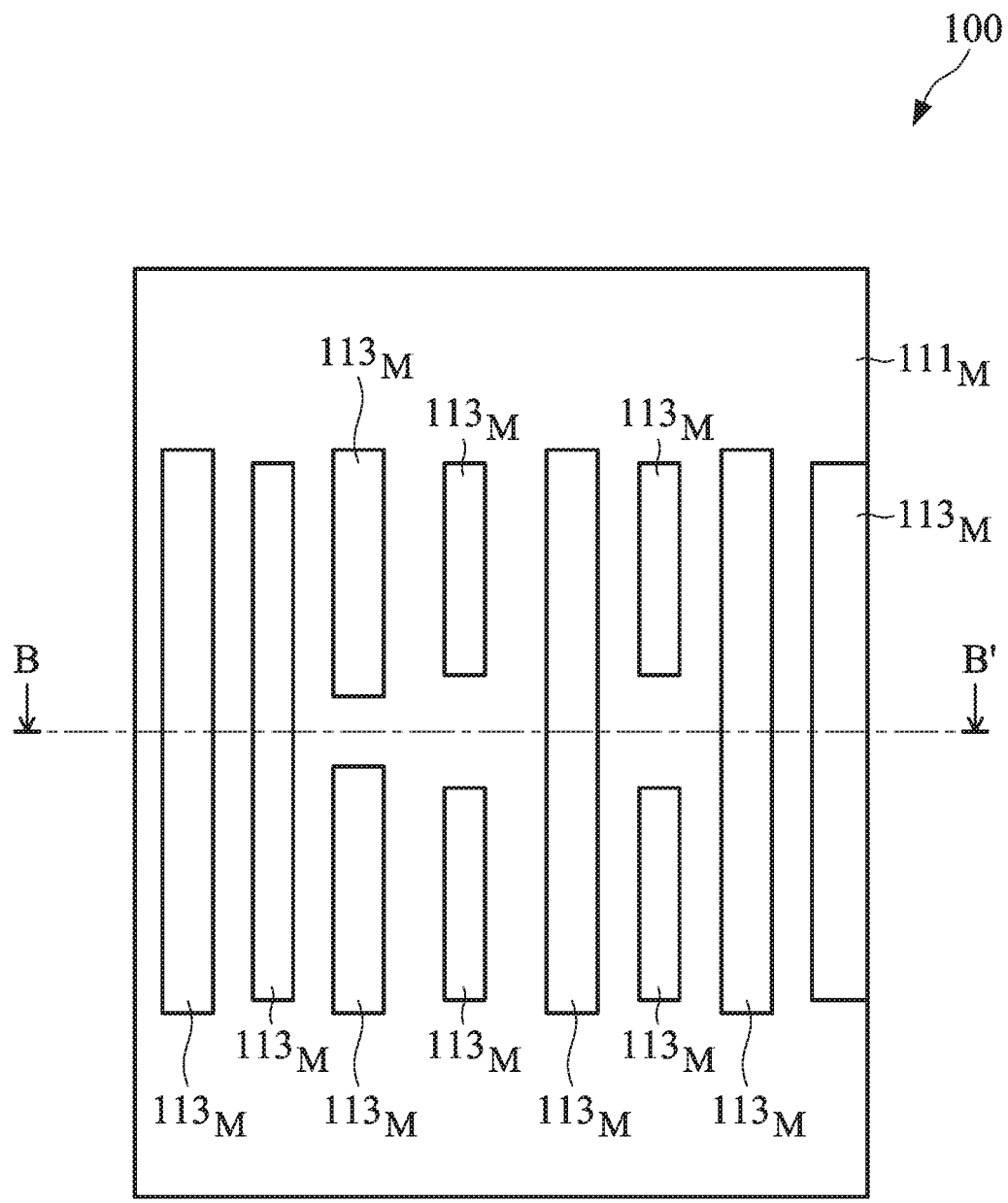
Figure 24B:
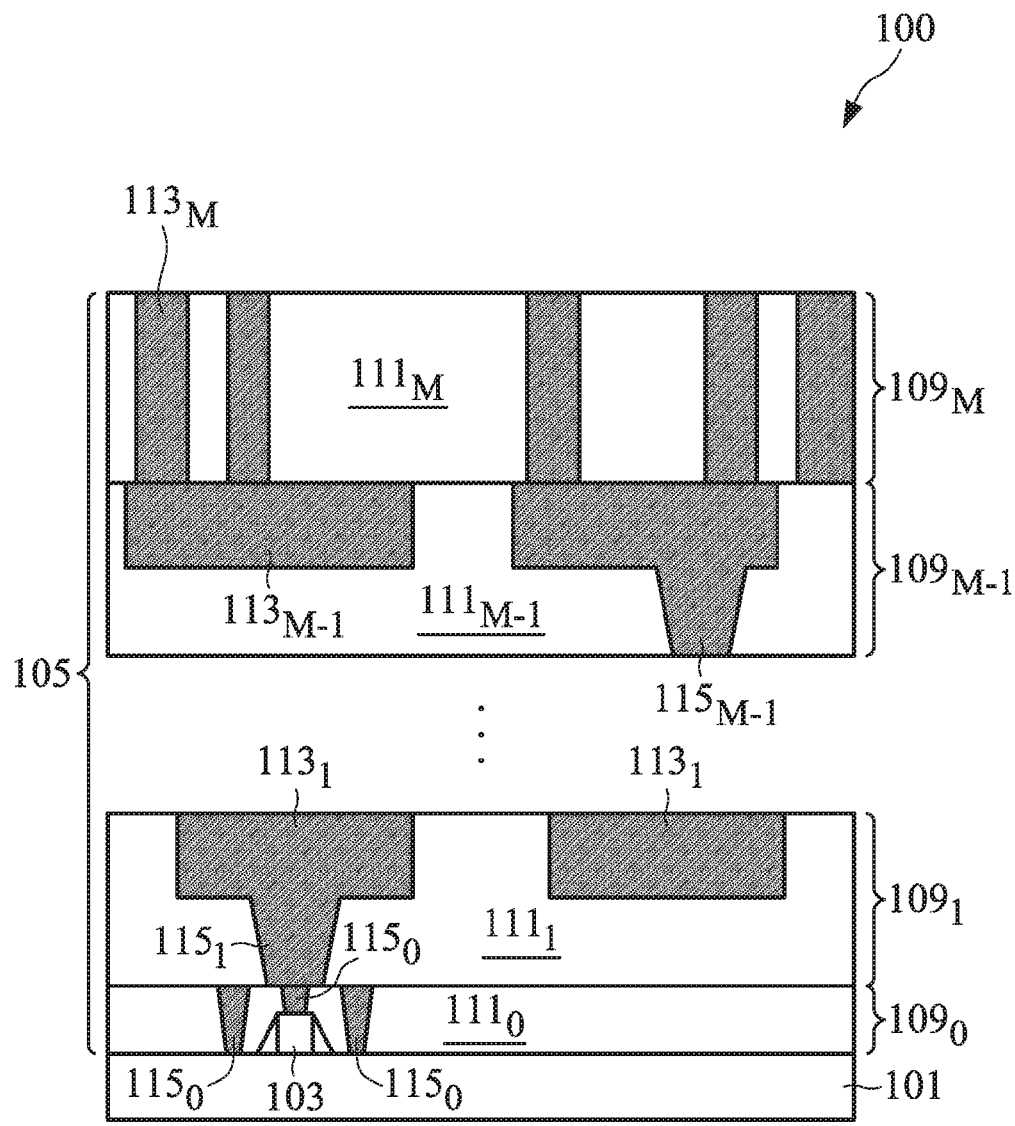

Referring to FIGS. 24A and 24B, the openings 2301, 2301c, 2303, 2303c, 2305 and 2305c (see FIGS. 23A and 23B) are filled with suitable conductive materials to form the conductive lines $113_M$. The suitable conductive materials may include copper, aluminum, tungsten, combinations thereof, alloys thereof, or the like. The conductive lines $113_M$ may further comprise one or more barrier/adhesion layers (not shown) to protect the dielectric layer $111_M$ from diffusion and metallic poisoning. The one or more barrier/adhesion layers may comprise titanium, titanium nitride, tantalum, tantalum nitride, or the like, and may be formed using PVD, CVD, ALD, or the like. In some embodiments, the steps for forming the conductive lines $113_M$ may include depositing one or more barrier/adhesion layers on sidewalls and bottoms of the openings 2301, 2301c, 2303, 2303c, 2305 and 2305c, depositing a seed layer of a suitable conductive material over the one or more barrier/adhesion layers, and filling the openings 2301, 2301c, 2303, 2303c, 2305 and 2305c with a suitable conductive material, for example, by plating, or other suitable methods. Subsequently, excess conductive materials overfilling the openings 2301, 2301c, 2303, 2303c, 2305 and 2305c are removed to expose a top surface of the dielectric layer $111_M$. In some embodiments, the excess conductive materials may be removed using a CMP process, a grinding process, an etching process, the like, or a combination thereof. In some embodiments, the first mask layer 119 and the ARC 117 are removed before forming the conductive lines $113_M$. In alternative embodiments, the first mask layer 119 and the ARC 117 are removed together with removing the excess conductive materials.

In some embodiments, the metallization layer $109_M$ may be the last metallization layer of the interconnect structure 105 and formation of the metallization layer $109_M$ completes formation of the interconnect structure 105. In other embodiments, the metallization layer $109_M$ may be an intermediate metallization layer of the interconnect structure 105. In such embodiments, additional metallization layers are formed over the metallization layer $109_M$ until the formation of the interconnect structure 105 is completed. In some embodiments, further processing steps may be performed on the semiconductor structure 100 after the formation of the interconnect structure 105 is completed. The further processing steps may include formation of contact pads and one or more passivation layers over the interconnect structure 105, formation of under-bump metallizations (UBMs) over the contact pads, and formation of connectors over the UBMs. Subsequently, the semiconductor structure 100 may be singulated into separate dies, which may further undergo various packaging processes.

Figure 25:
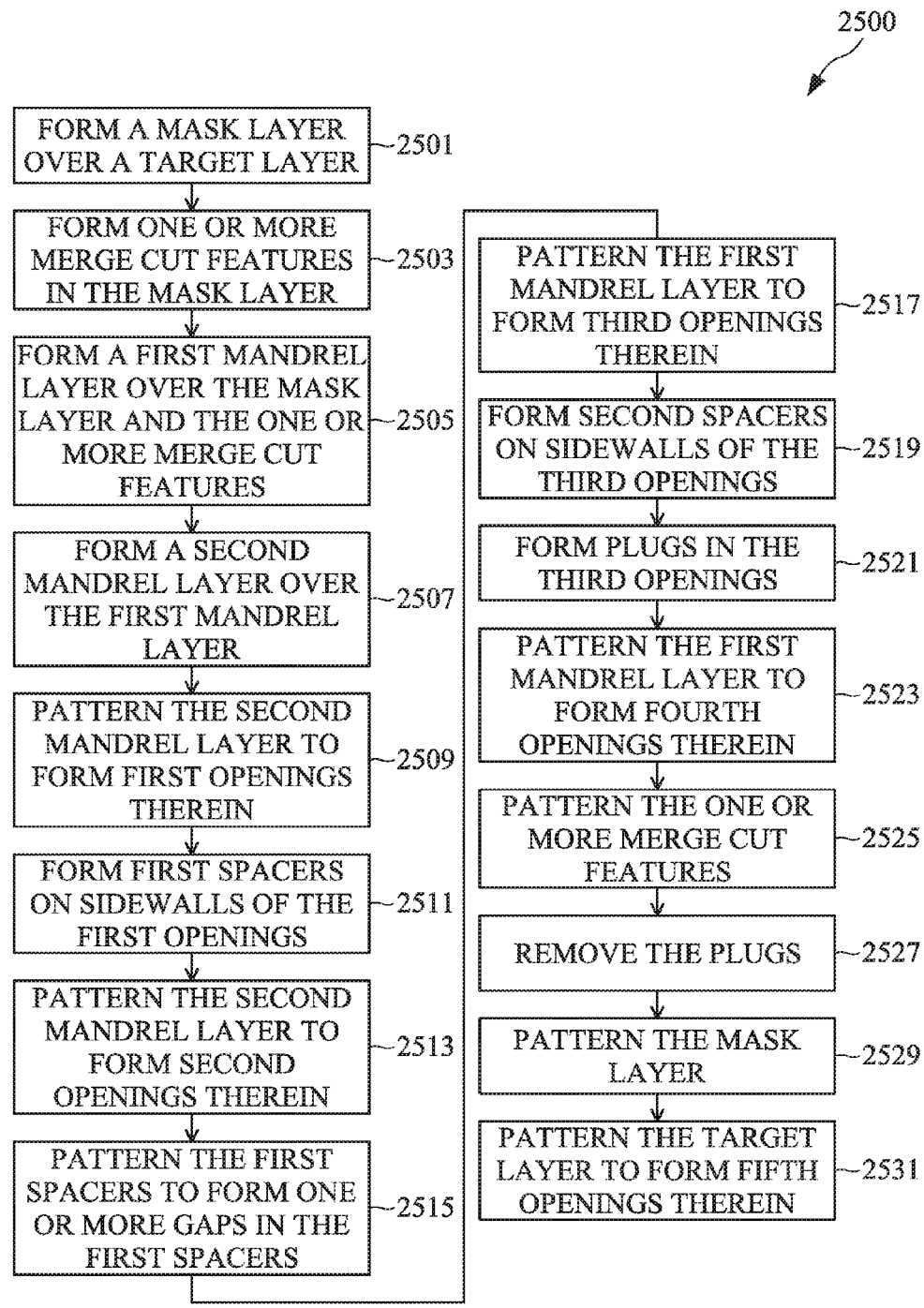
FIG. 25 is a flow diagram illustrating a method of forming a semiconductor structure in accordance with some embodiment.

FIG. 25 is a flow diagram illustrating a method 2500 of forming a semiconductor structure in accordance with some embodiment. The method 2500 starts with step 2501, where a mask layer (such as the second mask layer 121 illustrated in FIGS. 1A and 1B) is formed over a target layer (such as the dielectric layer $111_M$ illustrated in FIGS. 1A and 1B) as described above with references to FIGS. 1A and 1B. In step 2503, one or more merge cut features (such the merge cut feature 301 illustrated in FIGS. 3A and 3B) are formed in the mask layer as described above with references to FIGS. 2A-3B. In step 2505, a first mandrel layer (such as the first mandrel layer 401 illustrated in FIGS. 4A and 4B) is formed over the mask layer and the one or more merge cut features as described above with references to FIGS. 4A and 4B. In step 2507, a second mandrel layer (such as the second mandrel layer 405 illustrated in FIGS. 4A and 4B) is formed over the first mandrel layer as described above with references to FIGS. 4A and 4B. In step 2509, the second mandrel layer is patterned to form first openings (such as the openings 501 illustrated in FIGS. 5A and 5B) therein as described above with references to FIGS. 4A-5B. In step 2511, first spacers (such as the first spacers 601 illustrated in FIGS. 6A and 6B) are formed on sidewalls of the first openings as described above with references to FIGS. 5A-6B. In step 2513, the second mandrel layer is patterned to form second openings (such as the openings 801 illustrated in FIGS. 8A and 8B) therein as described above with references to FIGS. 7A-8B. In step 2515, the first spacers are patterned to form one or more gaps (such as the gap 1001 illustrated in FIGS. 10A and 10B) therein as described above with references to FIGS. 9A-10B. In step 2517, the first mandrel layer is patterned to form third openings (such as the openings 1101 and 1103 illustrated in FIGS. 11A and 11B) therein as described above with references to FIGS. 11A and 11B. In step 2519, second spacers (such as the second spacers 1301 illustrated in FIGS. 13A and 13B) are formed on sidewalls of the third openings as described above with references to FIGS. 12A-13B. In step 2521, plugs (such as the plugs 1501 illustrated in FIGS. 15A and 15B) are formed in the third openings as described above with references to FIGS. 14A-15B. In step 2523, the first mandrel layer is patterned to form fourth openings (such as the openings 1701 and 1701c illustrated in FIGS. 17A and 17B) therein as described above with references to FIGS. 16A-17B. In step 2525, the merge cut feature is patterned using the second spacers and the plugs as a combined mask as described above with references to FIGS. 18A and 18B. In step 2527, the plugs are removed as described above with references to FIGS. 19A and 19B. In step 2529, the mask layer is patterned using the second spacers a mask as described above with references to FIGS. 20A and 20B. In step 2531, the target layer is patterned using the mask layer and the one or more merge cut features as a combined mask to form fifth openings (such as the openings 2301, 2301c, 2303, 2303c, 2305, and 2305c illustrated in FIGS. 23A and 23B) as described above with references to FIGS. 21A-23B. In some embodiments where the target layer is a dielectric layer, the fifth openings are filled with a conductive material as described above with reference to FIGS. 24A and 24B.

Various embodiments discussed herein allow for patterning a target layer of a semiconductor structure to form features having a reduced size and pitch. In some embodiments where the target layer is a dielectric layer, embodiments discussed herein allow for forming interconnects in the dielectric layer. Various embodiments further allow for improving a mask patterning process window by overcoming film deposition topography issues due to dense/iso line-pattern environment.

According to an embodiment, a method includes forming a mask layer over a target layer. A merge cut feature is formed in the mask layer. A first mandrel layer is formed over the mask layer and the merge cut feature. The first mandrel layer is patterned to form first openings therein, at least one of the first openings comprising a first portion, a second portion, and a third portion connecting the first portion to the second portion, a long axis of the first portion being parallel to a long axis of the second portion. First spacers are formed on sidewalls of the first openings. The first openings are filled with a dielectric material to form plugs. The first mandrel layer is patterned to remove portions of the first mandrel layer interposed between adjacent first spacers. The merge cut feature is patterned using the first spacers and the plugs as a combined mask. The plugs are removed. The mask layer is patterned using the first spacers as a mask. The target layer is patterned, using the mask layer and the merge cut feature as a combined mask, to form second openings therein.

According to another embodiment, a method includes forming a mask layer over a target layer, the mask layer comprising a first material. One or more merge cut features are formed in the mask layer, the one or more merge cut features comprising a second material different from the first material. A first mandrel layer is deposited over the mask layer and the one or more merge cut features. A second mandrel layer is deposited over the first mandrel layer. The second mandrel layer is etched to form a plurality of second mandrel portions. First spacers are formed on sidewalls of the plurality of second mandrel portions. The second mandrel layer is etched to remove the plurality of second mandrel portions. The first spacers are etched to form one or more gaps in the first spacers. The first mandrel layer is etched, using the first spacers as a mask, to form a plurality of first mandrel portions. Second spacers are formed on sidewalls of the plurality of first mandrel portions. Gaps between adjacent second spacers are filled with a dielectric material to form plugs. The plurality of first mandrel portions are selectively etched to expose first portions of the mask layer and first portions of the one or more merge cut features. The first portions of the one or more merge cut features are selectively etched. The plugs are selectively etched to expose second portions of the mask layer and second portions of the one or more merge cut features. The first portions and the second portions of the mask layer are selectively etched. The target layer is etched, using the mask layer and the merge cut feature as a combined mask, to form first openings therein.

According to yet another embodiment, a method includes depositing a dielectric layer over a substrate. A mask stack is deposited over the dielectric layer. One or more merge cut features are formed in a top mask layer of the mask stack. A mandrel stack is deposited over the mask stack. A top mandrel layer of the mandrel stack is etched to form first openings in the top mandrel layer. First spacers are formed on sidewalls of the first openings. The top mandrel layer is etched to remove portions of the top mandrel layer interposed between adjacent first spacers. The first spacers are etched to form one or more gaps in the first spacers. A bottom mandrel layer of the mandrel stack is etched, using the first spacers and the top mandrel layer as a combined mask, to form second openings in the bottom mandrel layer. Second spacers are formed on sidewalls of the second openings. Plugs are formed in the second openings. The bottom mandrel layer is etched to remove portions of the bottom mandrel layer interposed between adjacent second spacers. The one or more merge cut features are selectively etched using the second spacers and the plugs as a combined mask. The top mask layer is selectively etched using the second spacers as a mask. Unpatterned mask layers of the mask stack are etched using the top mask layer as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 forming a mask layer having a merge cut feature therein over a target layer;
 forming a first mandrel layer over the mask layer and the merge cut feature;
 patterning the first mandrel layer to form first openings therein, at least one of the first openings comprising a first portion, a second portion, and a third portion connecting the first portion to the second portion, a long axis of the first portion being parallel to a long axis of the second portion;
 forming first spacers on sidewalls of the first openings;
 filling the first openings with a dielectric material to form plugs;
 patterning the first mandrel layer to remove portions of the first mandrel layer interposed between adjacent first spacers;
 patterning the merge cut feature using the first spacers and the plugs as a combined mask;
 removing the plugs;
 patterning the mask layer using the first spacers as a mask; and
 patterning the target layer, using the mask layer and the merge cut feature as a combined mask, to form second openings therein.

2. The method of claim 1, forming the first spacers comprises:
 conformally depositing a first spacer layer on the sidewalls and bottoms of the first openings; and
 removing portions of the first spacer layer from the bottoms of the first openings.

3. The method of claim 1, wherein forming the mask layer having the merge cut feature therein over the target layer comprises:
 forming a third opening in the mask layer; and
 filling the third opening with an insulating material.

4. The method of claim 1, wherein patterning the first mandrel layer to form the first openings therein comprises:
 forming a second mandrel layer over the first mandrel layer;
 patterning the second mandrel layer to form third openings therein;
 forming second spacers on sidewalls of the third openings;
 patterning the second mandrel layer to form fourth openings therein, the fourth openings being different from the third openings;
 removing portions of the second spacers to form one or more gaps in the second spacers; and
 patterning the first mandrel layer using the second spacers and the second mandrel layer as a combined mask.

5. The method of claim 4, wherein patterning the second mandrel layer to form the fourth openings therein comprises using the second spacers as a mask.

6. The method of claim 1, wherein the target layer is a dielectric layer.

7. The method of claim 6, further comprising filling the second openings with a conductive material.

8. A method comprising:
forming a mask layer having one or more first openings therein over a target layer, the mask layer comprising a first material;
forming one or more merge cut features in the one or more first openings, the one or more merge cut features comprising a second material different from the first material;
depositing a first mandrel layer over the mask layer and the one or more merge cut features;
depositing a second mandrel layer over the first mandrel layer;
etching the second mandrel layer to form a plurality of second mandrel portions;
forming first spacers on sidewalls of the plurality of second mandrel portions;
etching the second mandrel layer to remove the plurality of second mandrel portions;
etching the first spacers to form one or more gaps in the first spacers;
etching the first mandrel layer, using the first spacers as a mask, to form a plurality of first mandrel portions;
forming second spacers on sidewalls of the plurality of first mandrel portions;
filling gaps between adjacent second spacers with a dielectric material to form plugs;
selectively etching the plurality of first mandrel portions to expose first portions of the mask layer and first portions of the one or more merge cut features;
selectively etching the first portions of the one or more merge cut features;
selectively etching the plugs to expose second portions of the mask layer and second portions of the one or more merge cut features;
selectively etching the first portions and the second portions of the mask layer; and
etching the target layer, using the mask layer and the merge cut feature as a combined mask, to form second openings therein.

9. The method of claim 8, wherein the first mandrel layer and the second mandrel layer comprises a same material.

10. The method of claim 8, wherein forming the first spacers comprises:
conformally depositing a first spacer layer on the sidewalls and top surfaces of the plurality of second mandrel portions; and
removing portions of the first spacer layer from the top surfaces of the plurality of second mandrel portions.

11. The method of claim 8, wherein the first spacers and the second spacers have a same width.

12. The method of claim 8, wherein forming the one or more merge cut features in the one or more first openings further comprises:
planarizing the second material to expose a top surface of the mask layer.

13. The method of claim 8, wherein the target layer is a dielectric layer of an interconnect structure.

14. The method of claim 13, further comprising filling the second openings with a conductive material to form conductive interconnects in the dielectric layer.

15. A method comprising:
depositing a dielectric layer over a substrate;
depositing a mask stack over the dielectric layer, a top mask layer of the mask stack having one or more first openings;
forming one or more merge cut features in the one or more first openings;
depositing a mandrel stack over the mask stack;
etching a top mandrel layer of the mandrel stack to form second openings in the top mandrel layer;
forming first spacers on sidewalls of the second openings;
etching the top mandrel layer to remove portions of the top mandrel layer interposed between adjacent first spacers;
etching the first spacers to form one or more gaps in the first spacers;
etching a bottom mandrel layer of the mandrel stack, using the first spacers and the top mandrel layer as a combined mask, to form third openings in the bottom mandrel layer;
forming second spacers on sidewalls of the third openings;
forming plugs in the third openings;
etching the bottom mandrel layer to remove portions of the bottom mandrel layer interposed between adjacent second spacers;
selectively etching the one or more merge cut features using the second spacers and the plugs as a combined mask;
selectively etching the top mask layer using the second spacers as a mask; and
etching unpatterned mask layers of the mask stack using the top mask layer as a mask.

16. The method of claim 15, further comprising:
transferring a pattern of the mask stack to the dielectric layer thereby forming fourth openings in the dielectric layer; and
filling the fourth openings with a conductive material.

17. The method of claim 15, further comprising, before selectively etching the top mask layer, selectively removing the plugs.

18. The method of claim 15, further comprising, before forming the second spacers on the sidewalls of the second openings, removing the first spacers.

19. The method of claim 15, wherein forming the one or more merge cut features in the one or more first openings comprises:
depositing an insulating material over the top mask layer and in the one or more first openings; and
etching the insulating material to expose a top surface of the top mask layer.

20. The method of claim 15, wherein a width of the first spacers is different from a width of the second spacers.

* * * * *